(12) United States Patent
Geerpuram et al.

(10) Patent No.: US 9,202,721 B2
(45) Date of Patent: *Dec. 1, 2015

(54) METHOD AND APPARATUS FOR PLASMA DICING A SEMI-CONDUCTOR WAFER

(71) Applicant: Plasma-Therm LLC, St. Petersburg, FL (US)

(72) Inventors: Dwarakanath Geerpuram, St. Petersburg, FL (US); David Pays-Volard, St. Petersburg, FL (US); Linnell Martinez, Lakeland, FL (US); Chris Johnson, St. Petersburg, FL (US); David Johnson, Cleveland, GA (US); Russell Westerman, Land O' Lakes, FL (US)

(73) Assignee: Plasma-Therm LLC, St. Petersburg, FL (US)

( * ) Notice: Subject to any disclaimer, the term of this patent is extended or adjusted under 35 U.S.C. 154(b) by 122 days.

This patent is subject to a terminal disclaimer.

(21) Appl. No.: 14/176,747

(22) Filed: Feb. 10, 2014

(65) Prior Publication Data

US 2014/0154869 A1    Jun. 5, 2014

Related U.S. Application Data

(60) Division of application No. 13/829,324, filed on Mar. 14, 2013, now Pat. No. 8,691,702, which is a continuation-in-part of application No. 13/412,119, filed on Mar. 5, 2012, now Pat. No. 8,802,545.

(51) Int. Cl.
*H01L 21/302* (2006.01)
*H01L 21/461* (2006.01)
(Continued)

(52) U.S. Cl.
CPC ..... *H01L 21/67011* (2013.01); *H01J 37/32155* (2013.01); *H01J 37/32623* (2013.01); *H01J 37/32651* (2013.01); *H01L 21/3065* (2013.01); *H01L 21/30655* (2013.01); *H01L 21/67069* (2013.01); *H01L 21/6831* (2013.01); *H01L 21/68735* (2013.01); *H01L 21/68742* (2013.01); *H01L 21/78* (2013.01); *H01L 21/782* (2013.01); *H01J 37/321* (2013.01); *H01J 37/32422* (2013.01); *H01J 37/32642* (2013.01); *H01L 21/31116* (2013.01); *H01L 21/67739* (2013.01);
(Continued)

(58) Field of Classification Search
CPC ............... H01J 37/32642; H01J 37/32623; H01J 37/32651; H01J 37/32633; H01L 21/78
USPC ................ 438/731; 216/67; 156/345.3
See application file for complete search history.

(56) References Cited

U.S. PATENT DOCUMENTS

2003/0077878 A1\*  4/2003  Kumar et al. ........... 438/460
2008/0099431 A1\*  5/2008  Kumar et al. ........... 216/44
(Continued)

*Primary Examiner* — Mary Wilczewski
*Assistant Examiner* — Erik T Peterson
(74) *Attorney, Agent, or Firm* — Burr & Forman LLP; Harvey S. Kauget

(57) ABSTRACT

The present invention provides a method for plasma processing a substrate. The method comprising providing a process chamber having a wall; providing a plasma source adjacent to the wall of the process chamber; providing a work piece support within the process chamber; loading a work piece onto the work piece support, the work piece having a support film, a frame and the substrate; providing a cover ring above the work piece, the cover ring having at least one perforated region, and at least one non-perforated region; generating a plasma using the plasma source; and processing the work piece using the generated plasma.

7 Claims, 41 Drawing Sheets

(51) Int. Cl.
  *H01L 21/00*    (2006.01)
  *H01L 21/67*    (2006.01)
  *H01L 21/3065*  (2006.01)
  *H01L 21/683*   (2006.01)
  *H01L 21/687*   (2006.01)
  *H01L 21/78*    (2006.01)
  *H01L 21/782*   (2006.01)
  *H01J 37/32*    (2006.01)
  *H01L 21/311*   (2006.01)
  *H01L 21/677*   (2006.01)

(52) U.S. Cl.
  CPC .... *H01L 2221/68327* (2013.01); *Y10S 414/139* (2013.01)

(56) References Cited

U.S. PATENT DOCUMENTS

| | | | |
|---|---|---|---|
| 2010/0048001 A1* | 2/2010 | Harikai et al. | 438/464 |
| 2010/0120230 A1* | 5/2010 | Grivna et al. | 438/464 |
| 2010/0216313 A1* | 8/2010 | Iwai | 438/729 |
| 2012/0305184 A1* | 12/2012 | Singh et al. | 156/345.3 |
| 2012/0322239 A1* | 12/2012 | Singh et al. | 438/462 |
| 2014/0332497 A1* | 11/2014 | Nishizaki et al. | 216/67 |
| 2015/0059980 A1* | 3/2015 | Okita et al. | 156/345.51 |
| 2015/0122776 A1* | 5/2015 | Okita | 216/67 |
| 2015/0126038 A1* | 5/2015 | Okita | 438/715 |
| 2015/0170884 A1* | 6/2015 | Ouye | 216/67 |
| 2015/0170955 A1* | 6/2015 | Ouye et al. | 216/67 |

\* cited by examiner

METHOD AND APPARATUS FOR PLASMA DICING A SEMI-CONDUCTOR WAFER

CROSS REFERENCES TO RELATED APPLICATIONS

This utility patent application is a divisional of commonly owned U.S. Utility patent application Ser. No. 13/829,324 filed Mar. 14, 2013, entitled: Method and Apparatus for Plasma Dicing a Semi-conductor Wafer which is a continuation-in-part of co-pending patent application Ser. No. 13/412,119 filed on Mar. 5, 2012, entitled: Method and Apparatus for Plasma Dicing a Semi-conductor Wafer claims which claims priority from and is related to commonly owned U.S. Provisional Patent Application Ser. No. 61/452,450 filed Mar. 14, 2011, entitled: Apparatus for Plasma Dicing a Semi-conductor Wafer, the contents of these patent applications are incorporated by reference herein.

FIELD OF THE INVENTION

The invention relates to the use of an apparatus for the formation of individual device chips from a semi-conductor wafer, and in particular to an apparatus which uses plasma etching to separate the wafer into individual die.

BACKGROUND

Semiconductor devices are fabricated on substrates which are in the form of thin wafers. Silicon is commonly used as the substrate material, but other materials, such as III-V compounds (for example GaAs and InP) are also used. In some instances (for example, the manufacture of LED's) the substrate is a sapphire or silicon carbide wafer on which a thin layer of a semi-conducting material is deposited. The diameter of such substrates range from 2 inches and 3 inches up to 200 mm, 300 mm, and 450 mm and many standards exist (e.g., SEMI) to describe such substrate sizes.

Plasma etching equipment is used extensively in the processing of these substrates to produce semi-conductor devices. Such equipment typically includes a vacuum chamber fitted with a high density plasma source such as Inductively Coupled Plasma (ICP) which is used to ensure high etch rates, necessary for cost-effective manufacturing. In order to remove the heat generated during the processing, the substrate is typically clamped to a temperature controlled support. A pressurized fluid, typically a gas such as Helium is maintained between the substrate and the support to provide a thermal conductance path for heat transfer. A mechanical clamping mechanism, in which a downward force is applied to the top side of the substrate, may be used, though this may cause contamination due to the contact between the clamp and the substrate. Work piece bowing may also occur when using a mechanical clamp, since contact is typically made at the edge of the work piece and a pressurized fluid exerts a force on the back of the work piece. More frequently an electrostatic chuck (ESC) is used to provide the clamping force.

Numerous gas chemistries appropriate to the material to be etched have been developed. These frequently employ a halogen (Fluorine, Chlorine, Bromine, or Iodine) or halogen-containing gas together with additional gases added to improve the quality of the etch (for example, etch anisotropy, mask selectivity and etch uniformity). Fluorine containing gases, such as $SF_6$, $F_2$ or $NF_3$ are used to etch silicon at a high rate. In particular, a process (Bosch or TDM) which alternates a high rate silicon etch step with a passivation step to control the etch sidewall, is commonly used to etch deep features into silicon. Chlorine and Bromine containing gases are commonly used to etch III-V materials.

Plasma etching is not limited to semiconducting substrates and devices. The technique may be applied to any substrate type where a suitable gas chemistry to etch the substrate is available. Other substrate types may include carbon containing substrates (including polymeric substrates), ceramic substrates (e.g., AlTiC and sapphire), metal substrates, glass substrates, and die attach films To ensure consistent results, low breakage and ease of operation, robotic wafer handling is typically used in the manufacturing process. Handlers are designed to support the wafers with minimal contact, to minimize possible contamination and reduce the generation of particulates. Edge contact alone, or underside contact close to the wafer edge at only a few locations (typically within 3-6 mm of the wafer edge) is generally employed. Handling schemes, which include wafer cassettes, robotic arms and within process chamber fixtures including the wafer support and ESC, are designed to handle the standard wafer sizes as noted previously.

After fabrication on the substrate, the individual devices (die or chips) are separated from each other prior to packaging or being employed in other electronic circuitry. For many years, mechanical means have been used to separate the die from each other. Such mechanical means have included breaking the wafer along scribe lines aligned with the substrate crystal axis or by using a high speed diamond saw to saw into or through the substrate in a region (streets) between the die. More recently, lasers have been used to facilitate the scribing process.

Such mechanical wafer dicing techniques have limitations which affect the cost effectiveness of this approach. Chipping and breakage along the die edges can reduce the number of good die produced, and becomes more problematic as wafer thicknesses decrease. The area consumed by the saw bade (kerf) may be greater than 100 microns which is valuable area not useable for die production. For wafers containing small die (e.g., individual semiconductor devices with a die size of 500 microns×500 microns) this can represent a loss of greater than 20%. Further, for wafers with many small die and hence numerous streets, the dicing time is increased, and productivity decreased, since each street is cut individually. Mechanical means are also limited to separation along straight lines and the production of square or oblong shaped chips. This may not represent the underlying device topology (e.g., a high power diode is round) and so the rectilinear die format results in significant loss of useable substrate area. Laser dicing also has limitations by leaving residual material on the die surface or inducing stress into the die.

It is important to note that both sawing and laser dicing techniques are essentially serial operations. Consequently, as device sizes decrease, the time to dice the wafer increases in proportion to the total dicing street length on the wafer.

Recently plasma etching techniques have been proposed as a means of separating die and overcoming some of these limitations. After device fabrication, the substrate is masked with a suitable mask material, leaving open areas between the die. The masked substrate is then processed using a reactive-gas plasma which etches the substrate material exposed between the die. The plasma etching of the substrate may proceed partially or completely through the substrate. In the case of a partial plasma etch, the die are separated by a subsequent cleaving step, leaving the individual die separated. The technique offers a number of benefits over mechanical dicing:

1) Breakage and chipping is reduced;

2) The kerf dimensions can be reduced to well below 20 microns;

3) Processing time does not increase significantly as the number of die increases;

4) Processing time is reduced for thinner wafers; and

5) Die topology is not limited to a rectilinear format.

After device fabrication, but prior to die separation, the substrate may be thinned by mechanical grinding or similar process down to a thickness of a few hundred microns, or even less than a hundred microns.

Prior to the dicing process, the substrate is typically mounted on a dicing fixture. This fixture is typically comprised of a rigid frame that supports an adhesive membrane. The substrate to be diced is adhered to the membrane. This fixture holds the separated die for subsequent downstream operations. Most tools used for wafer dicing (saws or laser based tools) are designed to handle substrates in this configuration and a number of standard fixtures have been established; however, such fixtures are very different from the substrates which they support. Though such fixtures are optimized for use in current wafer dicing equipment, they cannot be processed in equipment which has been designed to process standard substrates. Thus, current automated plasma etching equipment is not suitable for processing substrates fixtured for dicing and it is difficult to realize the benefits that plasma etch techniques should have for die separation.

Some groups have contemplated using plasma to singulate die from wafer substrates. U.S. Pat. No. 6,642,127 describes a plasma dicing technique in which the substrate wafer is first attached to a carrier wafer via an adhesive material, before plasma processing in equipment designed for processing silicon wafers. This technique proposes adapting the form factor of the substrate to be diced to be compatible with standard wafer processing equipment. While this technique allows standard plasma equipment to dice the wafer, the proposed technique will not be compatible with standard equipment downstream of the dicing operation. Additional steps would be required to either adapt the downstream equipment or revert the substrate form factor for standard downstream equipment.

U.S. Patent Application 2010/0048001 contemplates the use of a wafer adhered to a thin membrane and supported within a frame. However, in the 2010/0048001 application, the masking process is achieved by adhering a mask material to the backside of the wafer and using a laser to define the etch streets prior to plasma processing. In contrast to standard dicing techniques which singulate the substrate from the front side, this technique introduces additional complex and expensive steps which may negate some of the advantages of plasma dicing. It also requires the additional demand of aligning the backside mask with the front side device pattern.

Therefore, what is needed is a plasma etching apparatus which can be used for dicing a semiconductor substrate into individual die and which is compatible with the established wafer dicing technique of handling a substrate mounted on tape and supported in a frame, and which is also compatible with standard front side masking techniques.

Nothing in the prior art provides the benefits attendant with the present invention.

Therefore, it is an object of the present invention to provide an improvement which overcomes the inadequacies of the prior art devices and which is a significant contribution to the advancement to the dicing of semiconductor substrates using a plasma etching apparatus.

Another object of the present invention is to provide a method for plasma processing a substrate, the method comprising: providing a process chamber having a wall; providing a plasma source adjacent to the wall of the process chamber; providing a work piece support within the process chamber; loading a work piece onto said work piece support, said work piece having a support film, a frame and the substrate; providing a cover ring above said work piece, said cover ring having at least one perforated region; generating a plasma using the plasma source; and processing said work piece using the generated plasma.

Yet another object of the present invention is to provide a method for plasma processing a substrate, the method comprising: providing a process chamber having a wall; providing a plasma source adjacent to the wall of the process chamber; providing a work piece support within the process chamber; loading a work piece onto said work piece support, said work piece having a support film, a frame and the substrate; providing a cover ring above said work piece, said cover ring having at least one perforated region, and at least one non-perforated region; generating a plasma using the plasma source; and processing said work piece using the generated plasma.

The foregoing has outlined some of the pertinent objects of the present invention. These objects should be construed to be merely illustrative of some of the more prominent features and applications of the intended invention. Many other beneficial results can be attained by applying the disclosed invention in a different manner or modifying the invention within the scope of the disclosure. Accordingly, other objects and a fuller understanding of the invention may be had by referring to the summary of the invention and the detailed description of the preferred embodiment in addition to the scope of the invention defined by the claims taken in conjunction with the accompanying drawings.

SUMMARY OF THE INVENTION

The present invention describes a plasma processing apparatus which allows for plasma dicing of a semiconductor substrate. After device fabrication and wafer thinning, the front side (circuit side) of the substrate is masked using conventional masking techniques which protects the circuit components and leaves unprotected areas between the die. The substrate is mounted on a thin tape which is supported within a rigid frame. The substrate/tape/frame assembly is transferred into a vacuum processing chamber and exposed to reactive gas plasma where the unprotected areas between the die are etched away. During this process, the frame and tape are protected from damage by the reactive gas plasma. The processing leaves the die completely separated. After etching, the substrate/tape/frame assembly is additionally exposed to plasma which removes potentially damaging residues from the substrate surface. After transfer of the substrate/tape/frame assembly out of the process chamber, the die are removed from the tape using well known techniques and are then further processed (e.g., packaged) as necessary.

Another feature of the present invention is to provide a method for plasma processing a substrate. The substrate can have a semiconducting layer such as Silicon and/or the substrate can have a III-V layer such as GaAs. The substrate can have a protective layer such as a photoresist layer that is patterned on a circuit side of the substrate. A process chamber having a wall with a plasma source adjacent to the wall of the process chamber is provided. The plasma source can be a high density plasma source. A vacuum pump in fluid communication with the process chamber and a gas inlet in fluid communication with the process chamber can be provided. A work piece support within the process chamber is provided. A work piece is formed by placing the substrate on a carrier support. The work piece can be formed by adhering the substrate to a support film and then mounting the substrate with the support film to a frame. The support film can have a polymer layer and/or a conductive layer. The support film can be standard dicing tape. The frame can have a conductive layer and/or a metal layer. The work piece is then loaded onto the work piece support for plasma processing. An RF power source can be coupled to the work piece support to create a plasma around the work piece. A thermal communication between the work piece and the work piece support can be provided by supplying a pressurized gas such as helium from the work piece support to the work piece. An electrostatic chuck can be incorporated into the work piece support whereby the electrostatic chuck can clamp the support film to the electrostatic chuck. A cover ring is disposed above the work piece. The cover ring has at least one perforated region. The cover ring can further comprise an opening that can be at least 0.1 mm greater in size than a diameter of the substrate or the opening can be at least 1 mm greater in size than a diameter of the substrate. The cover ring may not overlap the substrate. The perforated region of the cover ring can allow plasma to contact the work piece outside a perimeter of the substrate. The perforated region of the cover ring may not overlap the substrate. The perforated region of the cover ring can overlap the film. The perforated region of the cover ring can overlap the frame. The electrostatic chuck within the work piece support can have at least one clamping electrode that overlaps the perforated region of the cover ring. The clamping electrode of the electrostatic chuck can completely overlap the perforated region of the cover ring. The perforated region of the cover ring can overlap a portion of the work piece where the work piece is in thermal contact with the work piece support. The perforated region of the cover ring can overlap the work piece except in an area of the work piece overlapped by the substrate. The perforated region of the cover ring may not overlap an unclamped portion of the work piece. The perforated region of the cover ring may not overlap an outer portion of the work piece where the outer portion of the work piece can be outside of an outer most seal band of the electrostatic chuck. The pressure within the process chamber can be reduced through the vacuum pump and a process gas can be introduced into the process chamber through the gas inlet. A plasma is generated through the plasma source whereby the work piece is processed by the generated plasma. A vacuum compatible transfer module can be provided that communicates with the process chamber. The work piece can be loaded onto a transfer arm in the vacuum compatible transfer module whereby the process chamber is maintained under vacuum during a transfer of the work piece from the vacuum compatible transfer module to the process chamber.

Yet another feature of the present invention is to provide a method for plasma processing a substrate. The substrate can have a semiconducting layer such as Silicon and/or the substrate can have a III-V layer such as GaAs. The substrate can have a protective layer such as a photoresist layer that is patterned on a circuit side of the substrate. A process chamber having a wall with a plasma source adjacent to the wall of the process chamber is provided. The plasma source can be a high density plasma source. A vacuum pump in fluid communication with the process chamber and a gas inlet in fluid communication with the process chamber can be provided. A work piece support within the process chamber is provided. A work piece is formed by placing the substrate on a carrier support. The work piece can be formed by adhering the substrate to a support film and then mounting the substrate with the support film to a frame. The support film can have a polymer layer and/or a conductive layer. The support film can be standard dicing tape. The frame can have a conductive layer and/or a metal layer. The work piece is then loaded onto the work piece support for plasma processing. An RF power source can be coupled to the work piece support to create a plasma around the work piece. A thermal communication between the work piece and the work piece support can be provided by supplying a pressurized gas such as helium from the work piece support to the work piece. An electrostatic chuck can be incorporated into the work piece support whereby the electrostatic chuck can clamp the support film to the electrostatic chuck. A cover ring is disposed above the work piece. The cover ring has at least one perforated region and at least one non-perforated region. The cover ring can further comprise an opening that can be at least 0.1 mm greater in size than a diameter of the substrate or the opening can be at least 1 mm greater in size than a diameter of the substrate. The cover ring may not overlap the substrate. The perforated region of the cover ring can allow plasma to contact the work piece outside a perimeter of the substrate. The perforated region of the cover ring may not overlap the substrate. The perforated region of the cover ring can overlap the film. The perforated region of the cover ring can overlap the frame. The electrostatic chuck within the work piece support can have at least one clamping electrode that overlaps the perforated region of the cover ring. The clamping electrode of the electrostatic chuck can completely overlap the perforated region of the cover ring. The perforated region of the cover ring can overlap a portion of the work piece where the work piece is in thermal contact with the work piece support. The perforated region of the cover ring may not overlap the work piece where the work piece is not in thermal contact with the work piece support. The perforated region of the cover ring may not overlap an unclamped portion of the work piece. The perforated region of the cover ring may not overlap an outer portion of the work piece where the outer portion of the work piece can be outside of an outer most seal band of the electrostatic chuck. The non-perforated region of the cover ring can prevent plasma from contacting the work piece that is overlapped by the non-perforated region of the cover ring. A portion of the non-perforated region of the cover ring can be positioned non-coplanar to the perforated region of the cover ring. The perforated region of the cover ring can be positioned at a first distance from the work piece; the non-perforated region of the cover ring can be positioned at a second distance from the work piece; wherein the first distance can be greater than the second distance. A first ion density can be under the cover ring; a second ion density can be at the substrate; wherein the first ion density can be less than the second ion density. A first ion density can be under the perforated region of the cover ring; a second ion density can be at the substrate; wherein the first ion density can be less than the second ion density. The perforated region of the cover ring can attenuate an ion flux by at least ten percent. The perforated region of the cover ring can attenuate an ion flux by at least thirty percent. A first plasma density can be under the non-perforated region of the cover ring; a second plasma density can be at the substrate; wherein the first plasma density can be less than the second plasma density. A first plasma density can be at the work piece under the non-perforated region of the cover ring; a second plasma density can be under the perforated region of the cover ring; a third plasma density can be at the substrate; wherein the first plasma density can be less than the second plasma density; and wherein the second plasma density can be less than the third plasma density. The pressure within the process chamber can be reduced through the vacuum pump and a process gas can be introduced into the process chamber through the gas inlet. A plasma is generated through the plasma source whereby the work piece is processed by the generated plasma. A vacuum compatible transfer module can be provided that communicates with the process chamber. The work piece can be loaded onto a transfer arm in the vacuum compatible transfer module whereby the process chamber is maintained under vacuum during a transfer of the work piece from the vacuum compatible transfer module to the process chamber.

The foregoing has outlined rather broadly the more pertinent and important features of the present invention in order that the detailed description of the invention that follows may be better understood so that the present contribution to the art can be more fully appreciated. Additional features of the invention will be described hereinafter which form the subject of the claims of the invention. It should be appreciated by those skilled in the art that the conception and the specific embodiment disclosed may be readily utilized as a basis for modifying or designing other structures for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

Similar reference characters refer to similar parts throughout the several views of the drawings.

DETAILED DESCRIPTION OF THE INVENTION

Figure 1:
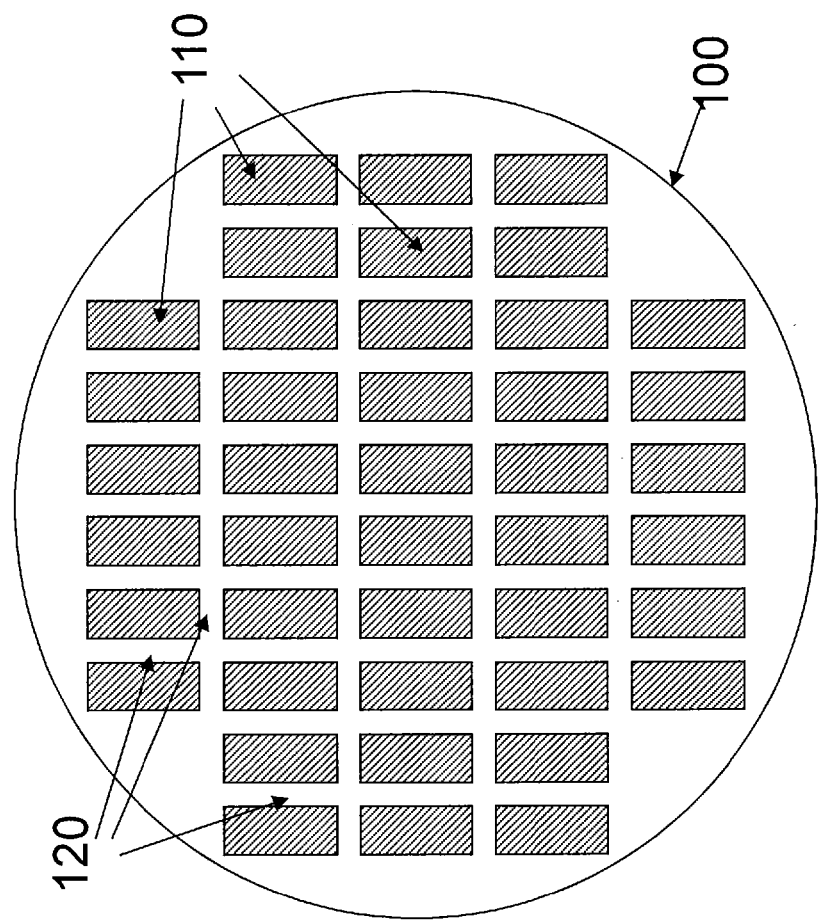
FIG. 1 is a top down view of a semiconductor substrate illustrating individual devices separated by streets.

A typical semiconductor substrate after device fabrication is illustrated in FIG. 1. The substrate (100) has on its surface a number of areas containing device structures (110) separated by street areas (120) which allows for separation of the device structures into individual die. Although silicon is commonly used as a substrate material, other materials chosen for their particular characteristics are frequently employed. Such substrate materials include Gallium Arsenide and other III-V materials or non-semi-conductor substrates on which a semi-conducting layer has been deposited. Further substrate types may also include Silicon-On-Insulator (SOI) wafers and semiconductor wafers mounted on carriers. While the example above describes die separated by streets, aspects of the invention may be beneficially applied to other pattern configurations on a substrate.

Figure 2:
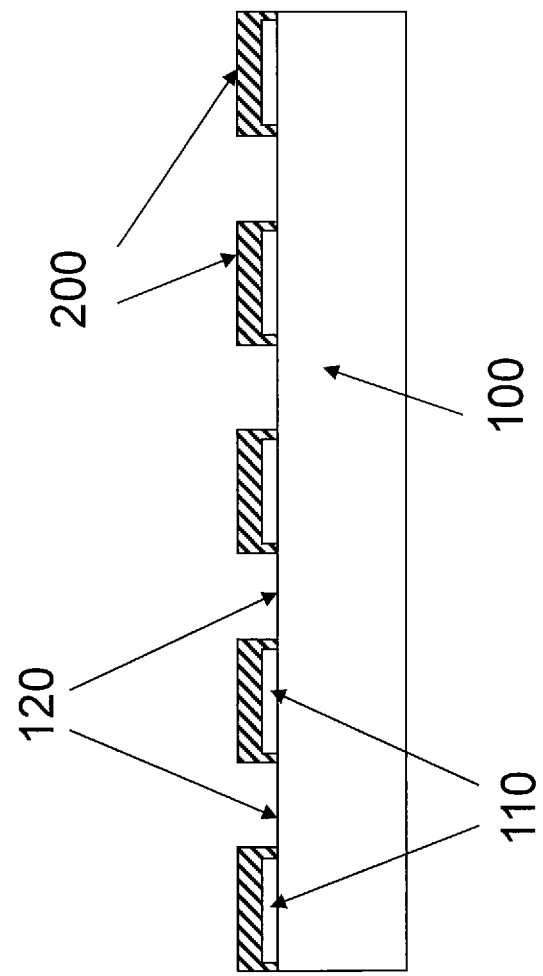
FIG. 2 is a cross-sectional view of a semiconductor substrate illustrating individual devices separated by streets.

In the present invention, as is shown in a cross sectional view in FIG. 2, the device structures (110) are then covered with a protective material (200) while the street areas (120) remain unprotected. This protective material (200) can be a photoresist, applied and patterned by well-known techniques. Some devices, as a final process step are coated with a protective dielectric layer such as silicon dioxide or PSG which is applied across the whole substrate. This can be selectively removed from the street areas (120) by patterning with photoresist and etching the dielectric material, as is well known in the industry. This leaves the device structures (110) protected by the dielectric material and the substrate (100) substantially unprotected in the street areas (120). Note that in some cases test features to check the wafer quality may be located in the street areas (120). Depending on the specific wafer fabrication process flow, these test features may or may not be protected during the wafer dicing process. Although the device pattern illustrated shows oblong die, this is not necessary, and the individual device structures (110) may be any other shape, such as hexagons, as best suits the optimum utilization of the substrate (100). It is important to note that while the previous example considers dielectric materials as the protective film, that the invention may be practiced with a wide range of protective films including semi-conductive and conductive protective films. Furthermore, the protective layer can consist of multiple materials. It is also important to note that some portion of the protective film may be an integral part of the final device structure. (e.g., a passivation dielectric, metal bonding pad, etc.). Furthermore, the present invention can also be beneficially used with bulk wafers without the necessity of having devices or device structures. One such example may be a semiconductor substrate (Silicon, III-V compounds, etc.), mounted on a carrier or not mounted, covered by a masking material defining the structures to be etched. The substrate may also contain at least one additional layer with different material properties, such as for example an insulating layer.

Figure 3:
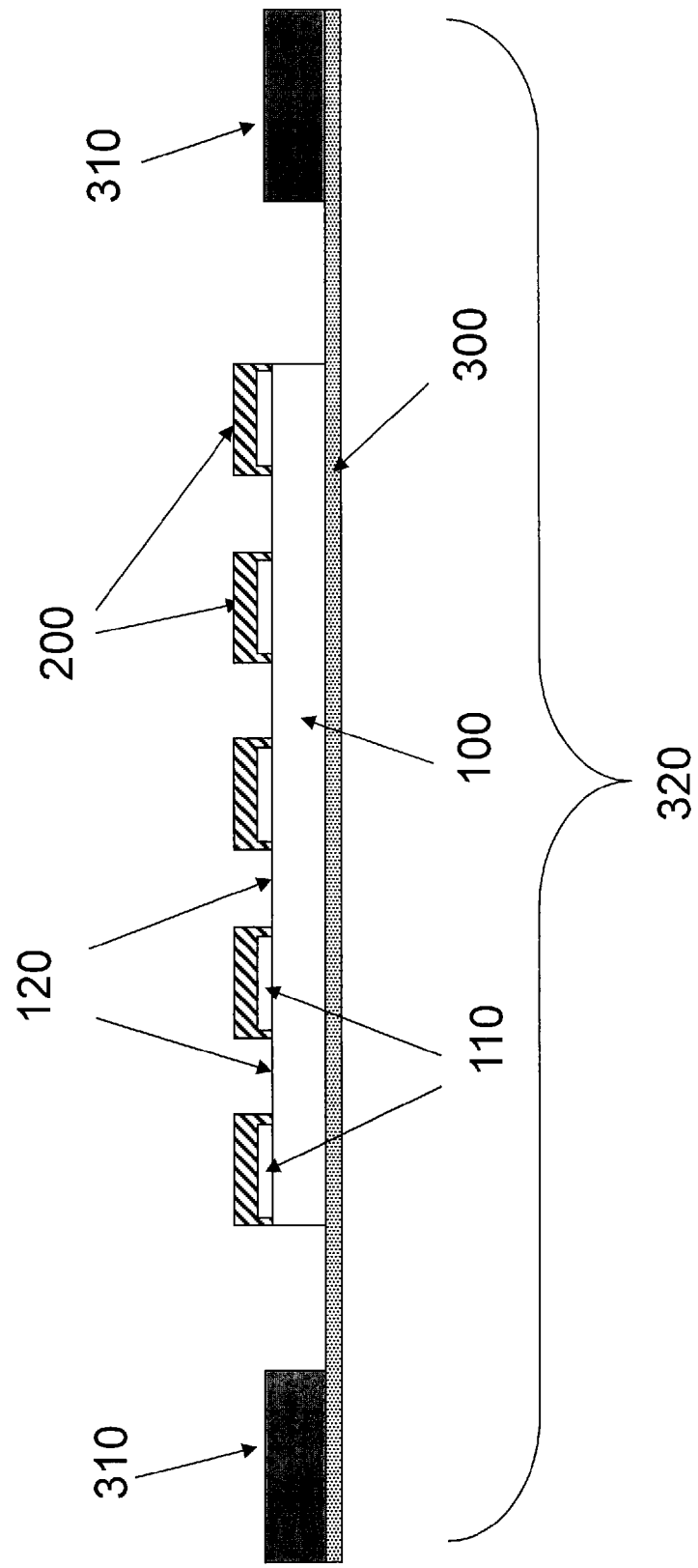
FIG. 3 is a cross-sectional view of a semiconductor substrate mounted to tape and a frame.

The substrate (100) may be thinned, typically by a grinding process, which reduces the substrate thickness to a few hundred microns to as thin as approximately 30 microns or less. As is shown in FIG. 3, the thinned substrate (100) is then adhered to a tape (300) which in turn is mounted in a rigid frame (310) to form a work piece (320). The frame is typically metal or plastic, though other frame materials are possible. The tape (300) is typically made from a carbon-containing polymer material, and may additionally have a thin conductive layer applied to its surface. The tape (300) provides support for the thinned substrate (100) which is otherwise too fragile to handle without breakage. It should be noted that the sequence of patterning, thinning and then mounting is not critical and the steps may be adjusted to best fit the particular devices and substrate and the processing equipment used. It is important to note that while the previous example considers a work piece (320) that is comprised of mounting a substrate (100) on an adhesive tape (300) which in turn is attached to a frame (310), that the invention is not limited by the configuration of the wafer and carrier. The wafer carrier can be comprised a variety of materials. The carrier supports the substrate during the plasma dicing process. Furthermore, the wafer need not be attached to the carrier using an adhesive—any method that holds the wafer to the carrier and allows a means thermal communication of the substrate to the cathode is sufficient (e.g., an electrostatically clamped carrier, a carrier with a mechanical clamping mechanism, etc.).

Figure 4:
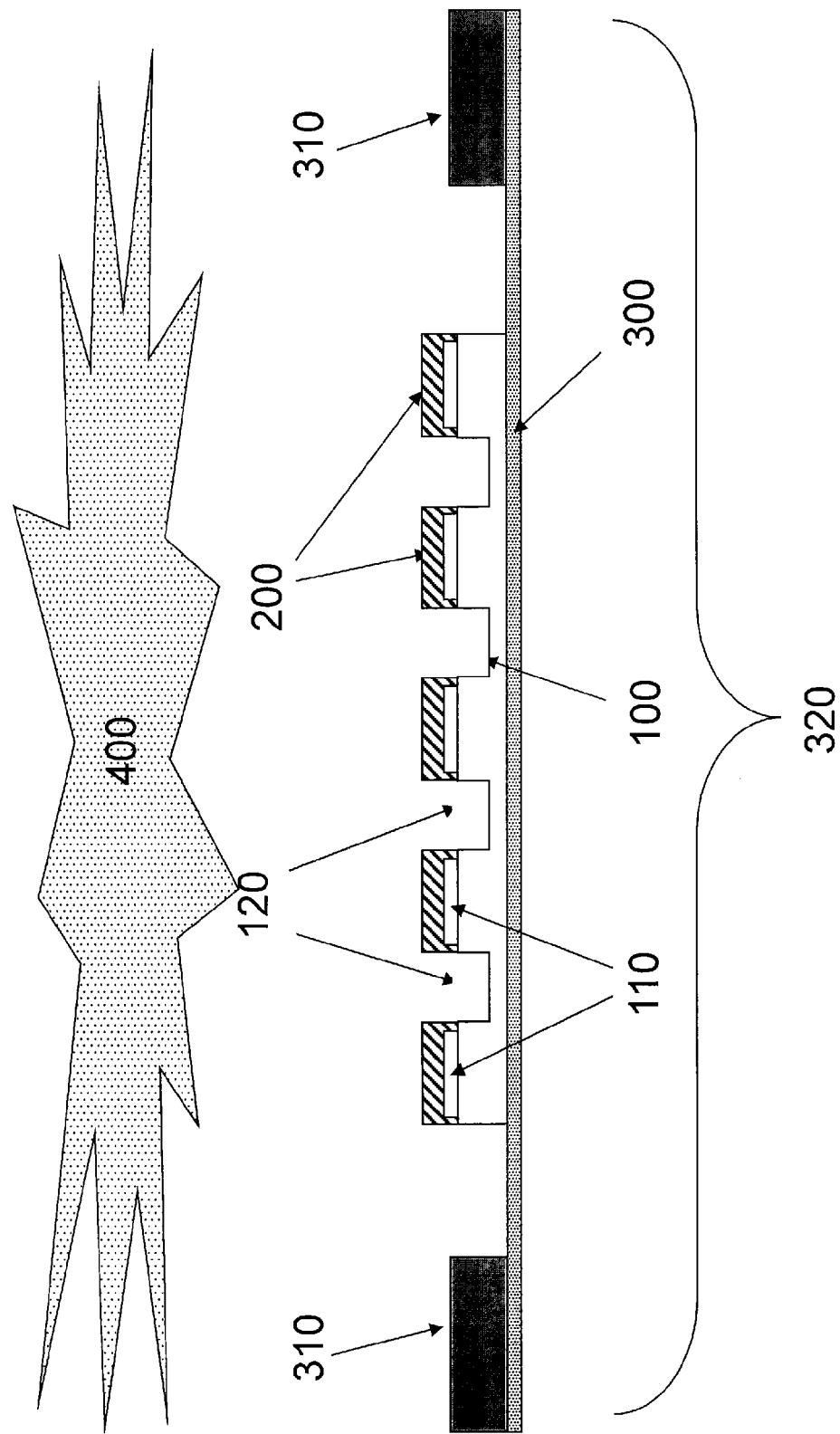
FIG. 4 is a cross-sectional view of a semiconductor substrate mounted to tape and a frame being etched by a plasma process.
Figure 5:
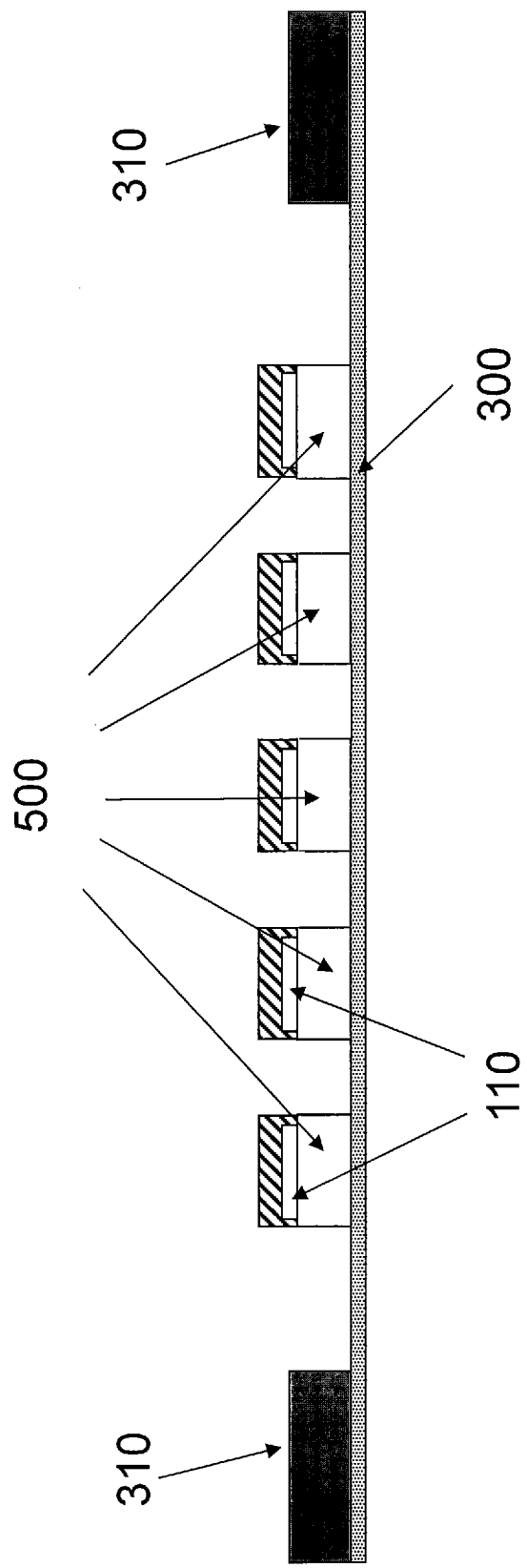
FIG. 5 is a cross-sectional view of separated semiconductor devices mounted to tape and a frame.
Figure 6:
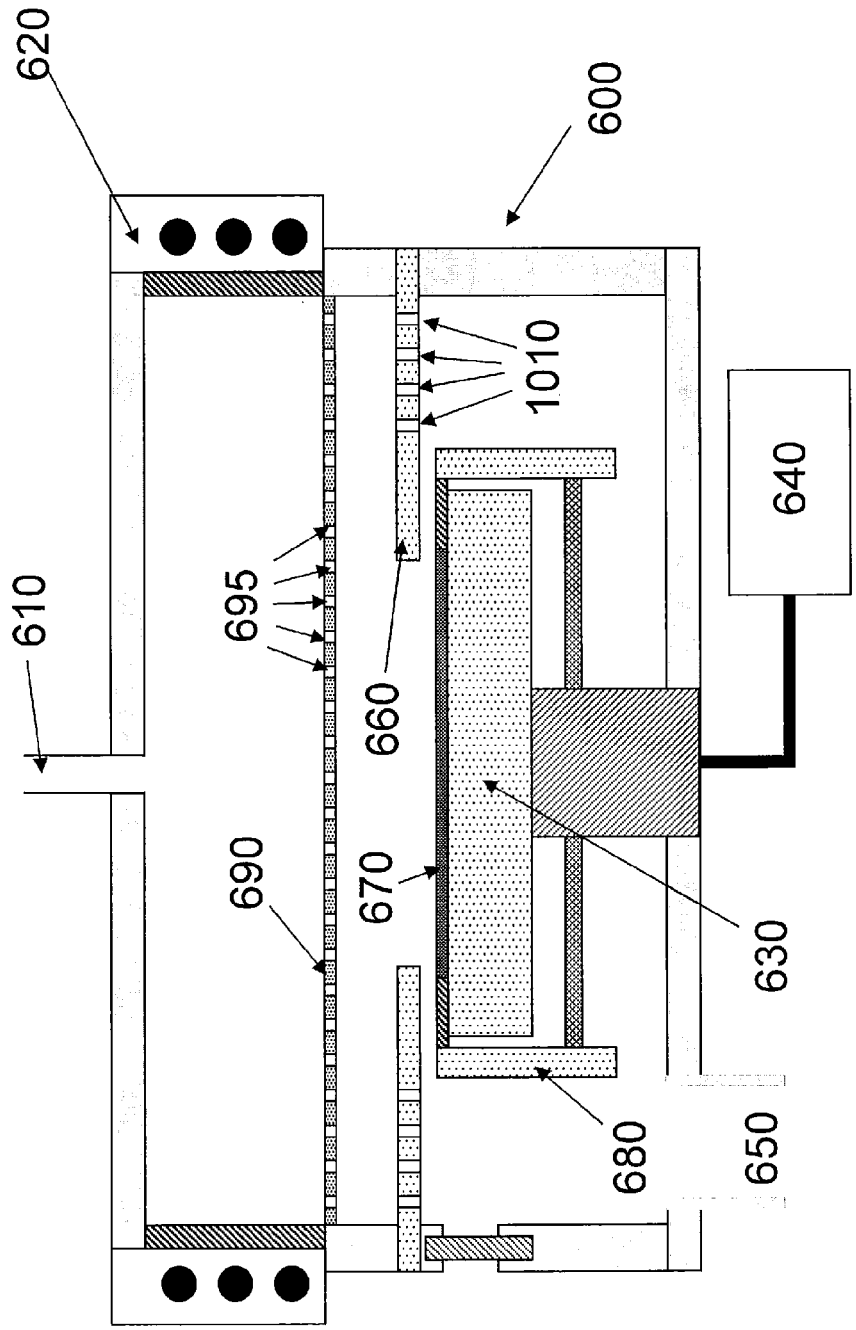
FIG. 6 is a cross-sectional view of a vacuum processing chamber.

After mounting the substrate (100) with the tape (300) in the dicing frame (310), the work piece (320) is transferred into a vacuum processing chamber. Ideally, the transfer module is also under vacuum which allows the process chamber to remain at vacuum during transfer, reducing processing time and preventing exposure of the process chamber to atmosphere and possible contamination. As shown in FIG. 6, the vacuum processing chamber (600) is equipped with a gas inlet (610), a high density plasma source (620) to generate a high density plasma, such as an Inductively Coupled Plasma (ICP), a work piece support (630) to support the work piece (320), an RF power source (640) to couple RF power to the work piece (320) through the work piece support (630) and a vacuum pump (650) for pumping gas from the processing chamber (600). During processing, the unprotected areas (120) of substrate (100) are etched away using a reactive plasma etch process (400) as shown in FIG. 4. This leaves the devices (110) separated into individual die (500) as shown in FIG. 5. In another embodiment of the invention, the unprotected areas (120) of the substrate (100) are partially etched away using a reactive plasma etch process (400). In this case, a downstream operation, such as a mechanical breaking operation, can be used to complete the die separation. These downstream methods are well known in the art.

While the previous example describes the invention using a vacuum chamber in conjunction with a high density plasma (e.g., ECRs, ICP, helicon, and magnetically enhanced plasma sources), it is also possible to etch the unprotected areas of the substrate using a wide range of plasma processes. For example, one skilled in the art can imagine variations of the invention using a low density plasma source in a vacuum chamber or even the use of plasmas at or near atmospheric pressures.

Figure 7:
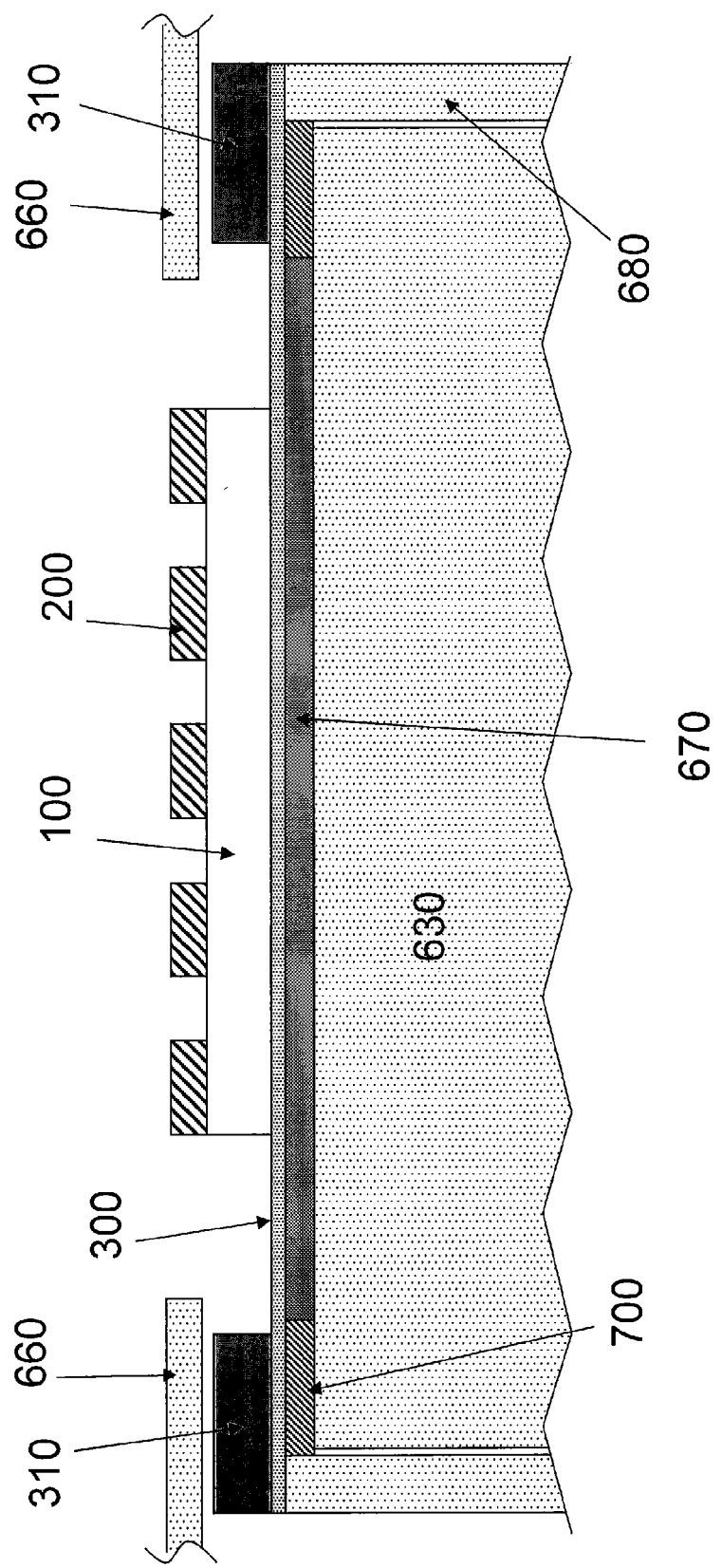
FIG. 7 is a cross-sectional of a wafer/frame in process position.
Figure 8:
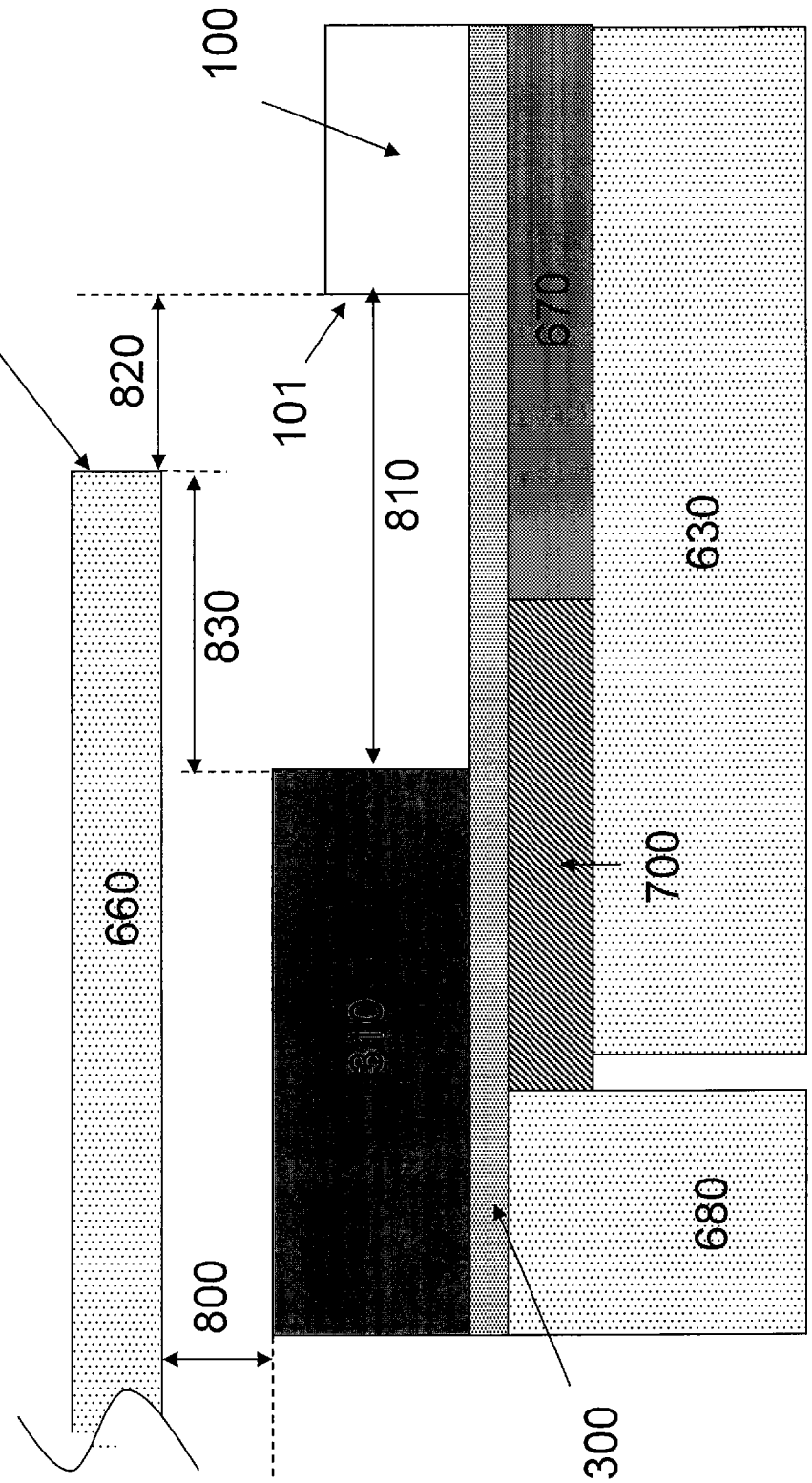
FIG. 8 is an enlarged cross-sectional view of a frame and a cover ring in a vacuum processing chamber.

When the work piece (substrate/tape/frame assembly) (320) is in the position for plasma processing, the frame (310) can be protected from exposure to the plasma (400). Exposure to the plasma (400) may cause heating of the frame (310) which in turn may cause local heating of the mounting tape (300). At temperatures above approximately 100° C., the physical properties of the tape (300) and its adhesive capability may deteriorate and it will no longer adhere to the frame (310). Additionally, exposure of the frame (310) to the reactive plasma gas may cause degradation of the frame (310). Since the frame (310) is typically re-used after wafer dicing, this may limit the useful lifetime of a frame (310). Exposure of the frame (310) to the plasma (400) may also adversely affect the etch process: for example the frame material may react with the process gas, effectively reducing its concentration in the plasma which may reduce the etch rate of the substrate material, thus increasing process time. To protect the frame (310), a protective cover ring (660), as shown in FIGS. 6, 7 and 8, is positioned above the frame (310). In one embodiment, the cover ring (660) does not touch the frame (310) since contact with the frame (310) (which would occur during transfer into the process chamber (600)) may generate undesirable particles.

In FIG. 8, dimension (800) represents the distance between the cover ring (660) and the frame (310). This dimension can range from greater than approximately 0.1 mm to less than approximately 20 mm with an optimal value of 4 mm. If the distance (800) is too large, plasma will contact the frame (310) and the benefits of the cover ring (660) may be lost.

In one embodiment the cover ring (660) is temperature controlled. Without cooling, the cover ring (660) temperature may increase due to exposure to the plasma and in turn heat the tape (300) and the frame (310) via thermal radiation, causing degradation as noted above. For the case where the cover ring (660) is cooled, cooling of the cover ring (660) is accomplished by having it in direct contact with a cooled body, such as the wall of the process chamber (600) shown in FIG. 9 or a heat sink (1000) located within the process chamber (600) shown in FIG. 10. To ensure that heat is adequately removed from the cover ring (660) to the heat sink (1000), the cover ring (660) should be made of a material that has good thermal conductivity. Such materials include many metals, for example Aluminum, but other thermally conductive materials, such as Aluminum Nitride and other ceramics can be used. The choice of the cover ring material is chosen to be compatible with the plasma process gases used. While Aluminum is satisfactory for Fluorine based processes, an alternate material, such as Aluminum Nitride, or the addition of a protective coating, such as Aluminum Oxide may be necessary when Chlorine based processes are used. Operation temperature of the cover ring (660) during plasma processing ranges from about 25° C. to about 350° C. Preferably the temperature of the cover ring (660) is held in the range of 50° C. to 90° C. which minimizes thermal radiation to the tape (300) and, the frame (310) and ensures that the tape (300) maintains its mechanical integrity. Alternatively, the cover ring (660) may be temperature controlled by bringing the cover ring (660) into contact with a temperature controlled fluid. This fluid can be a liquid or gas. In the case where the cover ring (660) temperature is controlled by a fluid, the cover ring (660) may contain a number of fluid channels to facilitate heat transfer. These fluid channels can be internal to the cover ring (660), externally attached, or some combination of the two.

Figure 9:
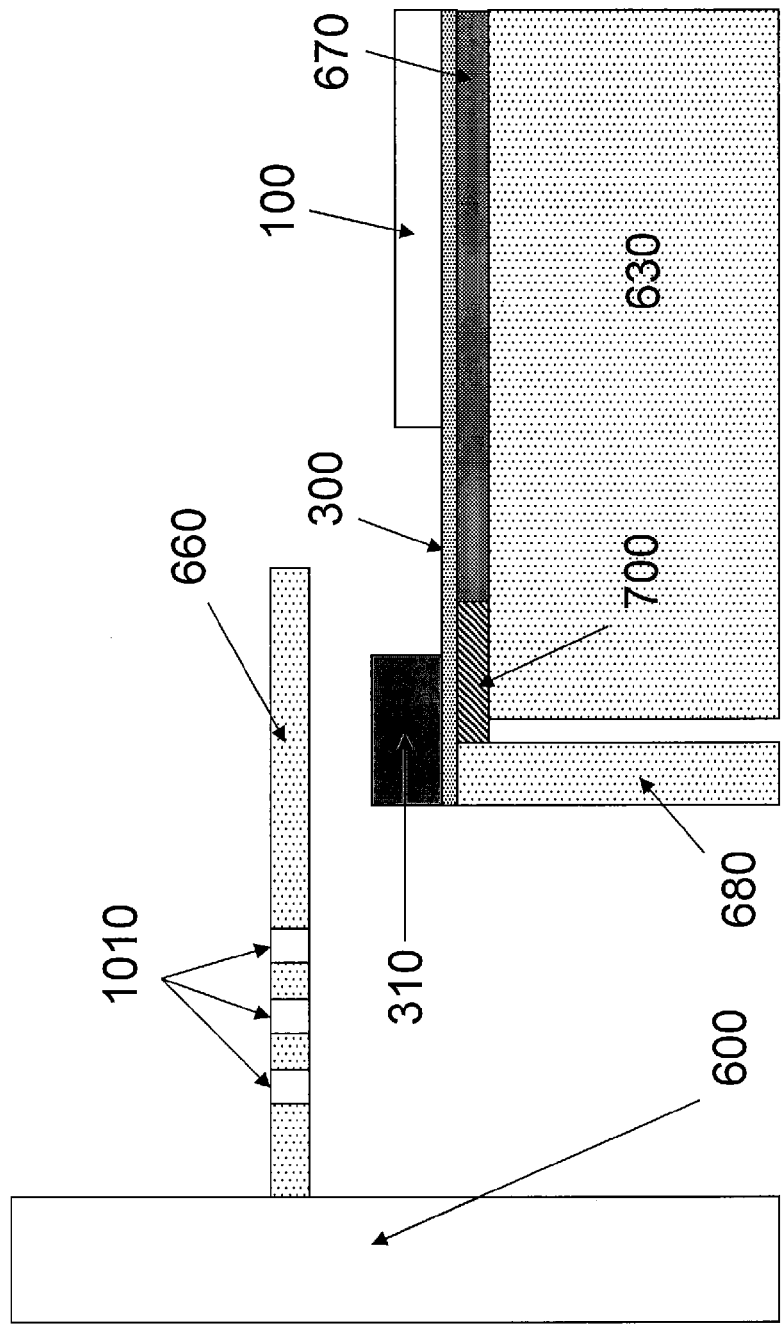
FIG. 9 is a cross-sectional view of a section of the inside the chamber with the cover ring mounted to a chamber wall.
Figure 10:
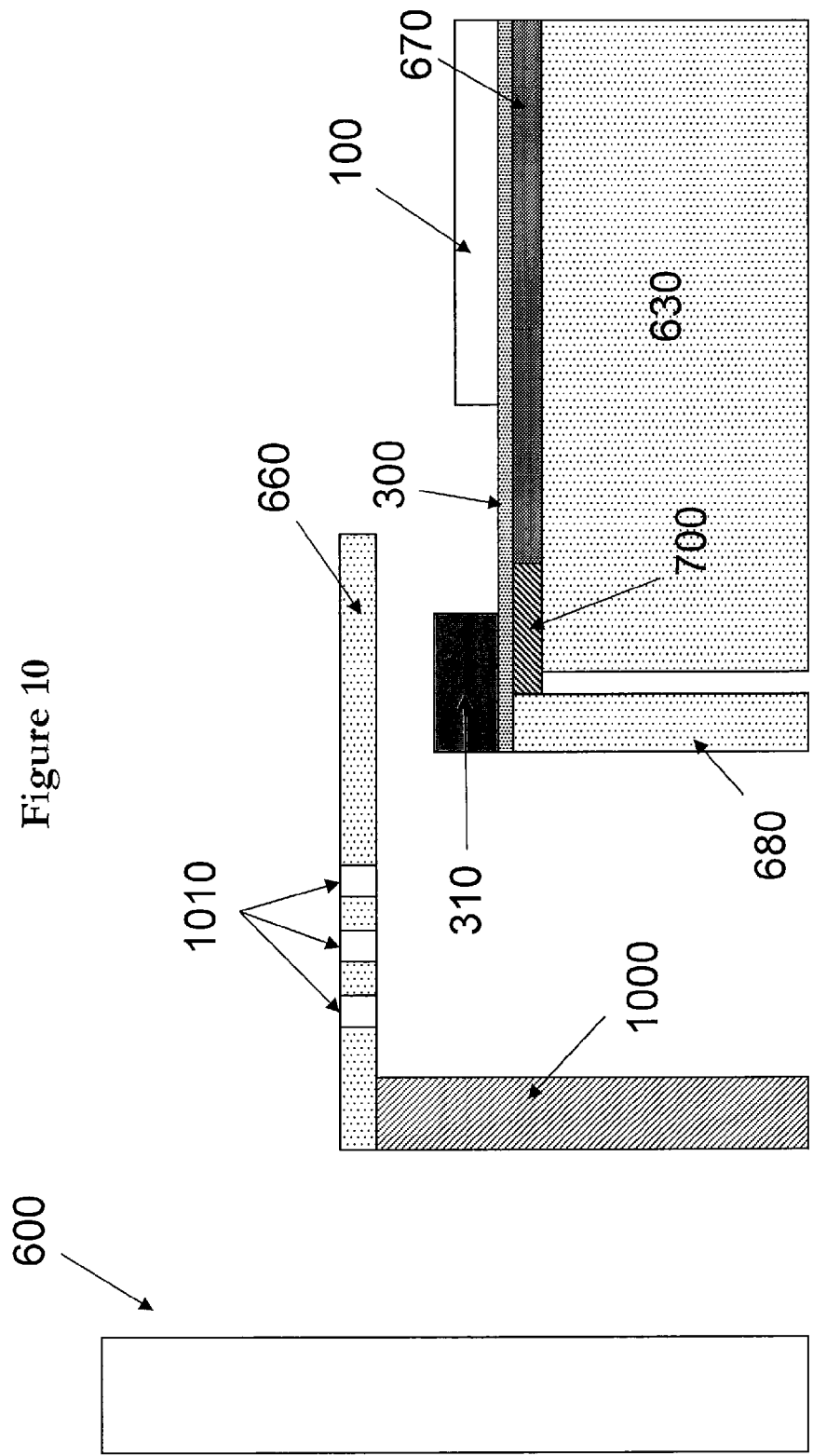
FIG. 10 is a cross-sectional view of a section of the inside the chamber with the cover ring mounted to an internal heat sink.

In one embodiment, the cover ring (660) can extend from the substrate diameter to the inner chamber diameter continuously. To avoid a loss in pumping conductance, which can adversely affect pressure control within the process chamber (600), a plurality of pumping holes (1010) can be added to the cover ring (660) which allows sufficient conductance of the process gas while still providing a path for heat removal from the cover ring (660). In FIGS. 9 and 10, a plurality of holes (1010) arranged in a specific geometry is shown, but the shape, density, size, pattern and symmetry of the holes (1010) can vary depending on the process chamber (600) dimensions and the pumping conductance required. It is preferred that the holes (1010) do not overlap the tape (300). In another embodiment, the holes (1010) do not overlap the work piece (320).

Figure 11:
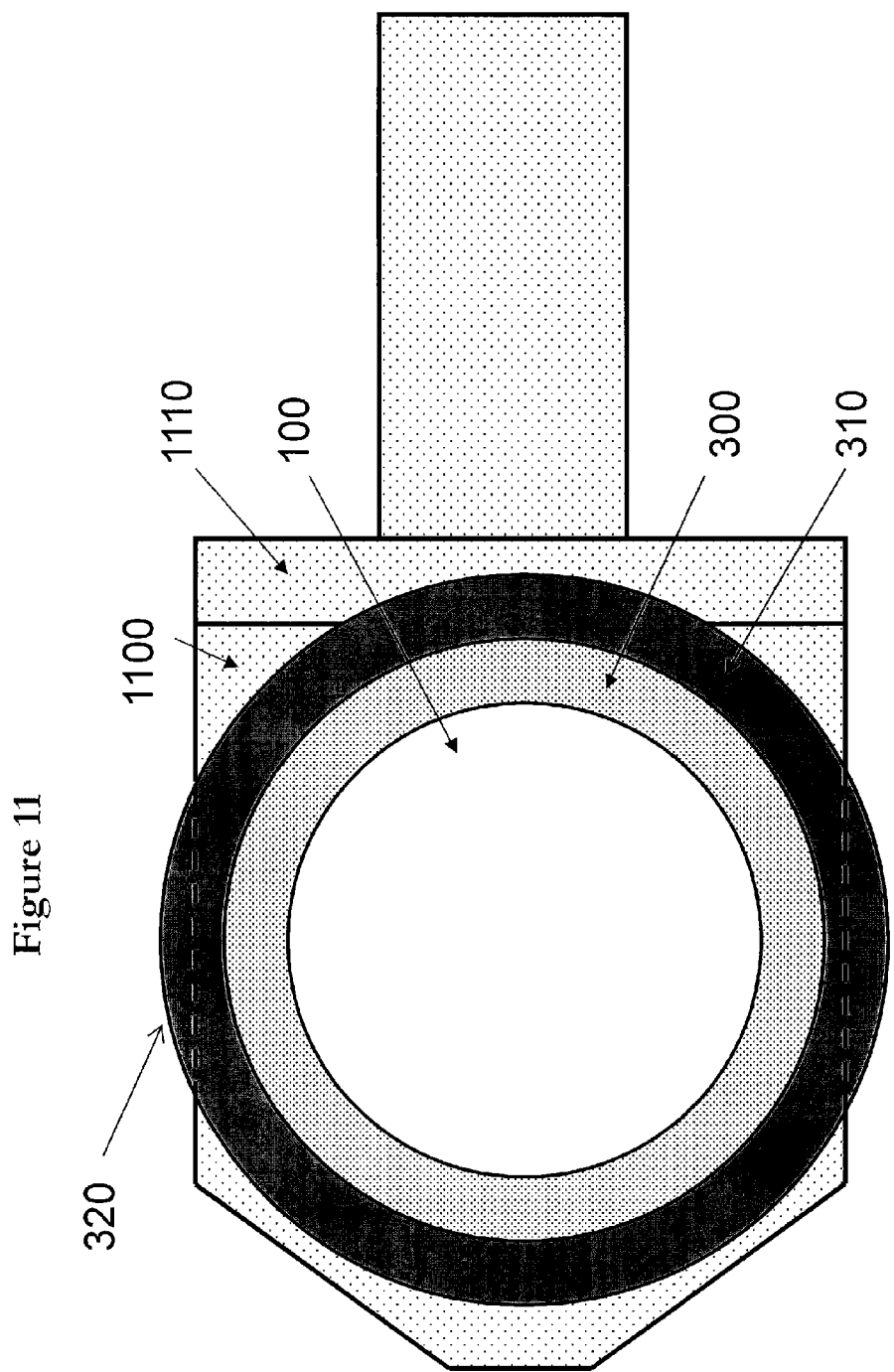
FIG. 11 is a top down view of a semiconductor substrate mounted to tape and a frame supported by a transfer arm.
Figure 12:
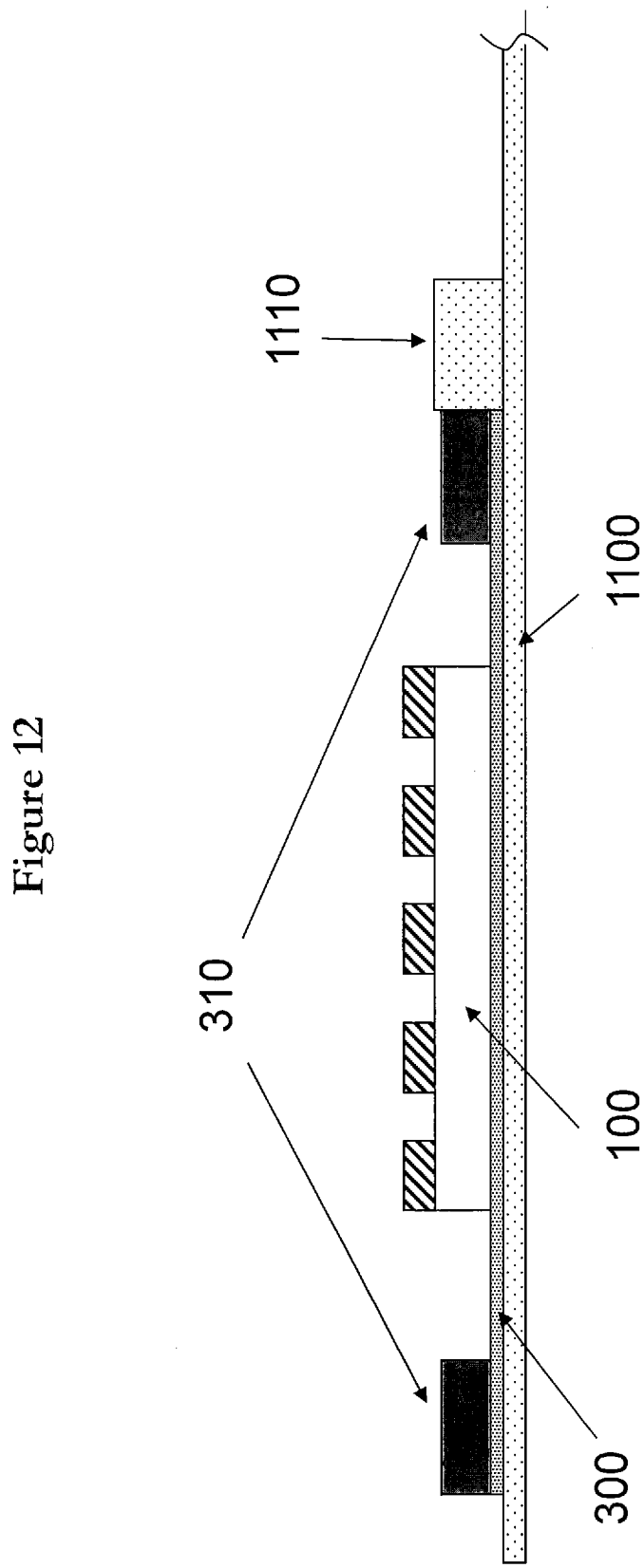
FIG. 12 is a cross-sectional view of a semiconductor substrate mounted to tape and a frame supported by a transfer arm.

The work piece (substrate/tape/frame assembly) (320) is transferred both into and out of the process chamber (600) by a transfer arm (1100) that supports the frame (310) and substrate (100) so that they are maintained nearly coplanar as shown in FIGS. 11 and 12. The transfer arm (1100) may support both the tape (300) and the frame (310) or the frame (310) alone, but it is important that the assembly (320) not be supported beneath the substrate (100) area alone because of the fragile nature of thinned substrates (100). The transfer arm (1100) has an alignment fixture (1110) attached to it that aligns the frame (310) in a repeatable position before being transferred into the process chamber (600). The frame (310) can also be aligned by other techniques well-known in semiconductor processing (e.g., optical alignment). The alignment can also be performed on the substrate (100) by such well-known techniques. It is important that the work piece (substrate/tape/frame assembly) (320) be aligned before placement within the process chamber (600) to avoid miss-processing as explained below.

In FIG. 8, the substrate-to-frame dimension (810) represents the distance between the outer diameter of the substrate (100) and the inner diameter of the frame (310). This may be 20 mm to 30 mm (e.g., Disco Corporation dicing frame has an inner diameter of about 250 mm for 200 mm substrates, so that the substrate-to-frame dimension (810) is nominally 25 mm). During mounting of the wafer (100) on the tape (300) within the frame (310), the deviation of wafer (100) placement may be as much as 2 mm so that the cover ring to substrate distance (820), which is the distance between the substrate (100) outer diameter and the inner diameter of the cover ring (660) can also vary from assembly to assembly by up to 2 mm. If at some point the cover ring to substrate distance (820) is less than zero, the cover ring (660) will overlay the edge of the substrate (100). This area of the substrate will be shadowed and prevented from etching, which can prevent die separation and cause problems in subsequent processing steps. It is preferred that the cover ring (660) does not overlap the substrate (100). Alignment of the substrate/tape/frame assembly (320) prior to transfer is required to prevent such problems. Further, to additionally ensure that cover ring to substrate distance (820) is not less than zero, the cover ring inner diameter should be greater than the diameter of the substrate (100). It is preferred that the cover ring inner diameter be 5 mm greater than the substrate diameter (e.g., 205 mm cover ring inner diameter for 200 mm substrate). The cover ring overhang dimension (830) in FIG. 8 represents the distance from the inner diameter of the cover ring (660) to the inner diameter of the frame (310). Alignment of the frame (310) prior to transfer into the process chamber (600) ensures that the cover ring overhang dimension (830) remains essentially constant for the entire circumference around the substrate (100) and that any portion of tape (300) that is not contacted by the Electrostatic chuck (ESC) (670) is substantially shadowed from the plasma. In a preferred embodiment any tape (300) that is not in thermal contact with the ESC (670) is overlapped by the cover ring (660). In one embodiment, the cover ring (660) and substrate (100) are located in different planes. Therefore the inner periphery of the cover ring (661) is not adjacent to the outer periphery (101) of the substrate.

Figure 13:
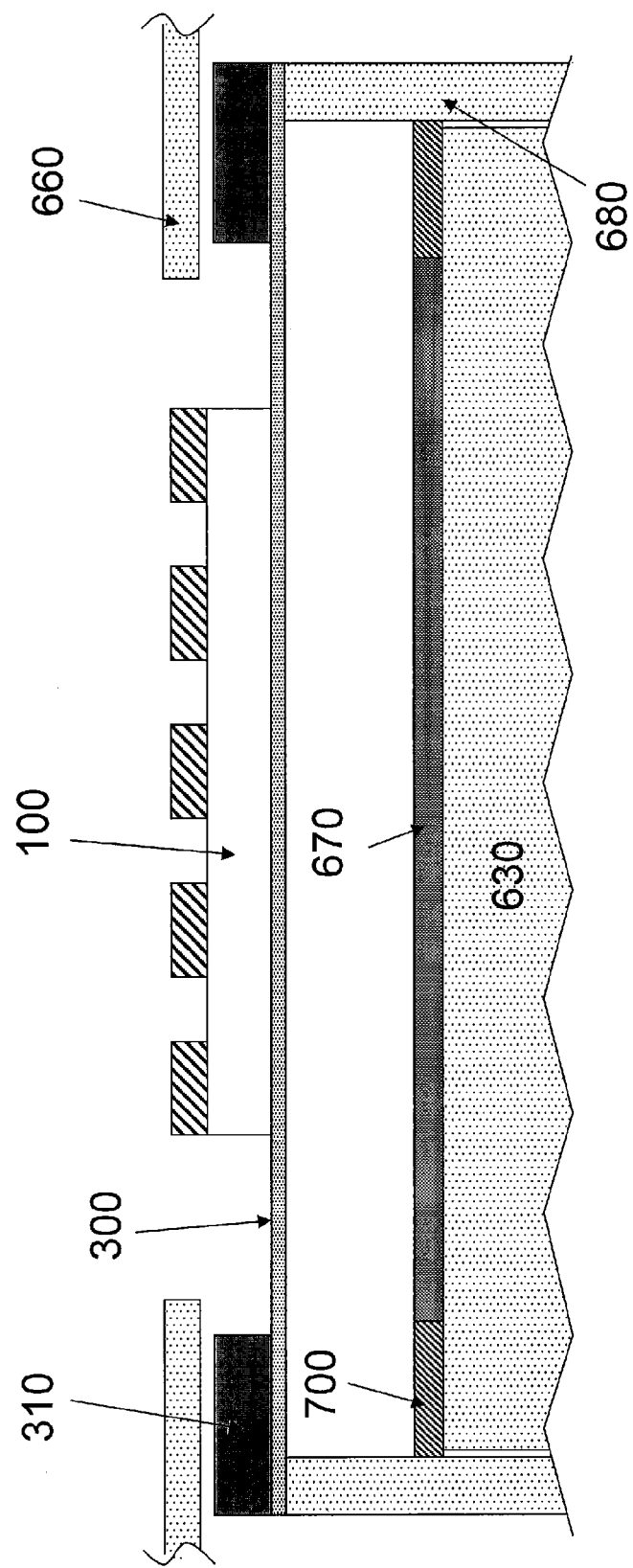
FIG. 13 is a cross-sectional view of a wafer/frame in a transfer position.

When the work piece (e.g., substrate/tape/frame assembly) (320) is transferred into the process chamber (600), it is placed onto the lifting mechanism (680) and removed from the transfer arm (1100). The reverse process occurs during transfer of the work piece (e.g., substrate/tape/frame assembly) (320) out of the process chamber (600). The lifting mechanism (680) touches the frame (310) area and provides no point contact to the substrate (100). Point contact to the substrate (100) can cause damage to the substrate (100), particularly after die separation and unloading of the work piece (320), since the flexibility of the tape (300) may cause the die to contact each other and damage to occur. FIG. 13 shows the lifting mechanism (680) lifting the frame (310) from the underside; however, the frame (310) can also be removed from the transfer arm (1100) by contact with the top surface, bottom surface, outer diameter of the frame (310) or any combination of these using a clamping device. In order to have enough clearance to place the work piece (320) on the work piece support (630) to process the substrate (100), the frame (310), the work piece support (630), and the cover ring (660) can move relative to each other. This can be accomplished by moving the cover ring (660), the work piece support (630), or the lifting mechanism (680) or any combination of the three.

During plasma processing, heat is transferred to all of the surfaces the plasma touches including the substrate (100), tape (300), and frame (310). The cover ring (660) will minimize the heat transfer to areas of the tape (300) and the frame (310), but the substrate (100) must be exposed to the plasma (400) for processing.

As shown in FIG. 6, a perforated mechanical partition (690) may be interposed between the plasma source (620) and the work piece support (630). The mechanical partition (690) can be electrically conductive (e.g., made from metal or metal coated). The mechanical partition (690) is preferably made of Aluminum. The mechanical partition (690) can help reduce the ion density as well as the plasma emission intensity reaching the work piece, while allowing a high level of neutral species to reach the work piece. The present invention offers control over the ion density and plasma emission intensity reaching the work piece. It is preferred for applications relevant to this invention, that the ion density and plasma emission intensity from the plasma source (620) reaching the work piece be attenuated in the range of 10% to 50% by the mechanical partition. In one preferred embodiment, the attenuation by the mechanical partition can be 10%. In one preferred embodiment, the attenuation by the mechanical partition can be 30%. In yet another preferred embodiment, the attenuation by the mechanical partition can be 50%.

In one embodiment, the plasma below the mechanical partition (690) is sustained by the application of RF bias power (640) through the work piece support (630) and/or ESC (670). In this case, the plasma that acts upon the substrate (100) is sustained by the RF bias power through the work piece support (630) and/or ESC (670).

In the present invention, the temperature of the mechanical partition (690) can range between 0° C. and 350° C. It is preferable to maintain the mechanical partition (690) at a temperature greater than 60° C. The mechanical partition can fully or partially separate the work piece from the plasma source. It is preferable that the partition overlaps the substrate to be etched. In a preferred embodiment, the substrate (100) is completely overlapped by the mechanical partition (690). In yet another embodiment, the diameter of the mechanical partition (690) is at least 10% larger than the diameter of the substrate (100).

The mechanical partition (690) should be positioned between the substrate (100) and the plasma source (620). The mechanical partition (690) can completely segregate the area in the plasma source (620) from the rest of the chamber (600). In order to prevent the pattern of perforations in the mechanical partition (690) from printing on the substrate (100) it is preferred that the distance from the top of the substrate to the bottom surface of overlapping mechanical partition (690) be at least as large as the plasma sheath at the substrate (100) top surface. The thickness of the plasma sheath is a function of pressure, gas composition and plasma density among other parameters. Typically, plasma sheath thicknesses range from approximately 100 microns to approximately 2 centimeters. In one embodiment, the mechanical partition (690) is at least 0.1 mm from the top surface of the substrate (100). Preferably the mechanical partition (690) is at least 1 cm from the top surface of the substrate (100).

The perforations (695) in the mechanical partition (690) allow the plasma to diffuse through and act upon the substrate. The perforations (695) may be of any shape and dimensions (e.g., circular, hexagonal, ovals, any polygonal shapes, etc.). The mechanical partition thickness (2620) can be designed to affect the plasma species composition that acts upon the surface of the substrate. As shown in FIG. 23c, the thickness (2620) of the mechanical partition (690) can vary across the partition. The thickness variation can be continuous, discrete, or a combination of both. Preferably, the mechanical partition thickness (2620) is less than approximately 2.5 cm. The perforation hole diameters (2600) can range from approximately 0.1 mm up to approximately 1 cm. Typical aspect ratios of the perforations (695) can be between 0.5:1 up to 100:1, but preferably between 0.5:1 to 10:1. In one embodiment, the mechanical partition (690) reduces the plasma ion density from greater than approximately $10^{11}$ $cm^{-3}$ within the plasma source to less than approximately $10^{10}$ $cm^{-3}$ near the substrate surface.

Figure 14:
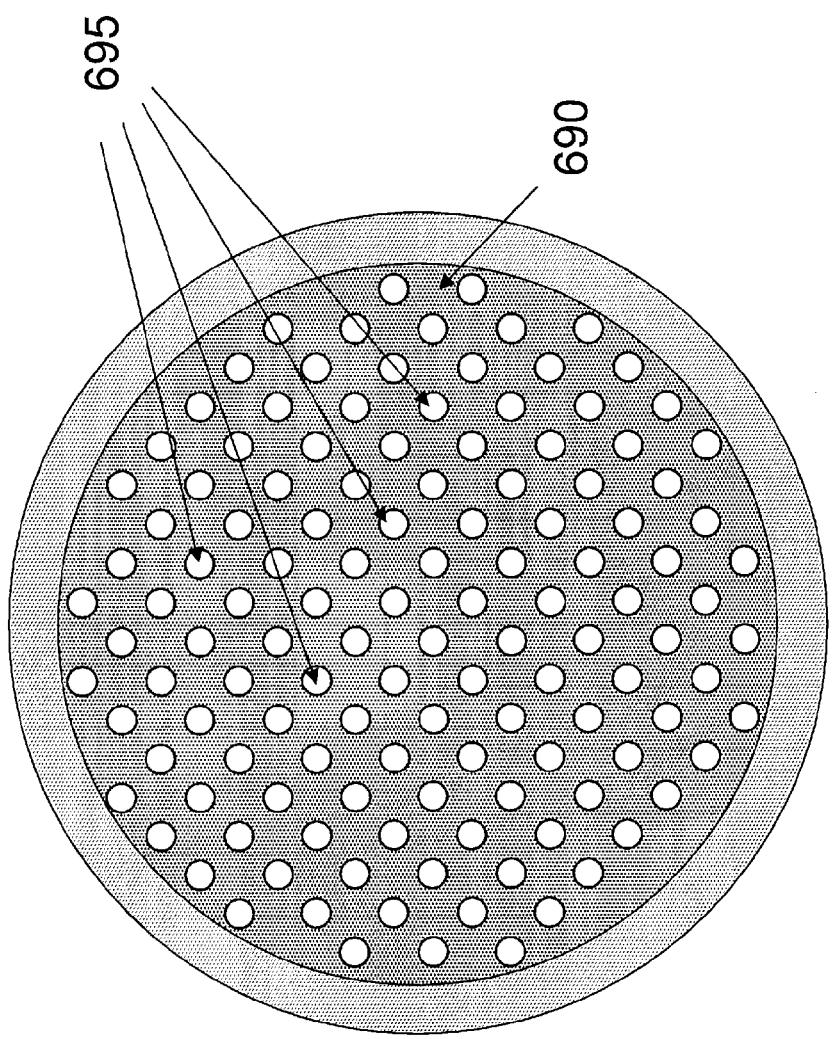
FIG. 14 is a top view of a screen.

The perforations (695) in the mechanical partition (690) can be arranged in a number of ways. FIG. 14 shows a top view of a mechanical partition (690) with a pattern of perforations (695) that are uniformly distributed in a rectilinear pattern. While FIG. 14 shows a rectilinear pattern of perforations (695), alternate configurations including hexagonal, honeycomb or circular perforation patterns may be used. The dimensions of the perforations (2600) may vary across the mechanical partition (690) (e.g., FIGS. 23b and 23c).

In an alternate embodiment, the perforation pattern in the mechanical partition (690) may designed such that the spacing between perforations (2610) is variable (e.g., FIGS. 23b and 23c). In yet another embodiment, the size and/or shape of the perforations may vary across the mechanical partition (690). The mechanical partition (690) can have a perforation pattern such that both the perforation size (2600) and spacing (2610) vary across the partition.

While the schematic in FIG. 6 shows a process chamber (600) with one mechanical partition (690), it may be beneficial to have more than one mechanical partition (690) disposed between the plasma source (620) and the substrate (100). The mechanical partitions (690) can be the same size and shape, or can be different sizes and/or shapes. The multiple mechanical partitions (690) may be configured in the same plane or different planes (e.g., overlapped or stacked partitions). The multiple mechanical partitions (690) may have perforation shapes, sizes and patterns that are identical or different from one another.

High density plasma sources (620) can generate high levels of UV radiation. This UV radiation may cause undesirable side reactions or damage the substrate (100). In some applications it is desirable to shield the substrate from UV emissions from the plasma source (620). One way to reduce this emission is to limit the direct path of UV emission from the plasma source to the substrate (e.g., limit the "line of sight" from the plasma source to the substrate). In the case of partitions that are in different planes and overlapped, it may be beneficial to ensure that the perforations (695) in the overlapped region of the partitions do not coincide (e.g., the partitions have some region of overlap, where the perforations of the partitions do not overlap one another). In one embodiment of the overlapped partitions (695), at least one perforation (695) in an overlapped region of a partition does not overlap a perforation in another partition. In yet another embodiment of overlapped partitions, none of the perforations in the partitions (695) overlap one another. In this configuration there is no direct path for light emitted from the plasma source to reach the substrate through the overlapped region of the partitions.

The pattern of perforations (695) in the mechanical partition (690) may be used to adjust the etch uniformity on the substrate (100). This adjustment may be accomplished through varying the thickness of the partition (2620), the perforation size (2600), perforation shape, perforation spacing (2610) or any combination of these factors.

Figure 25:
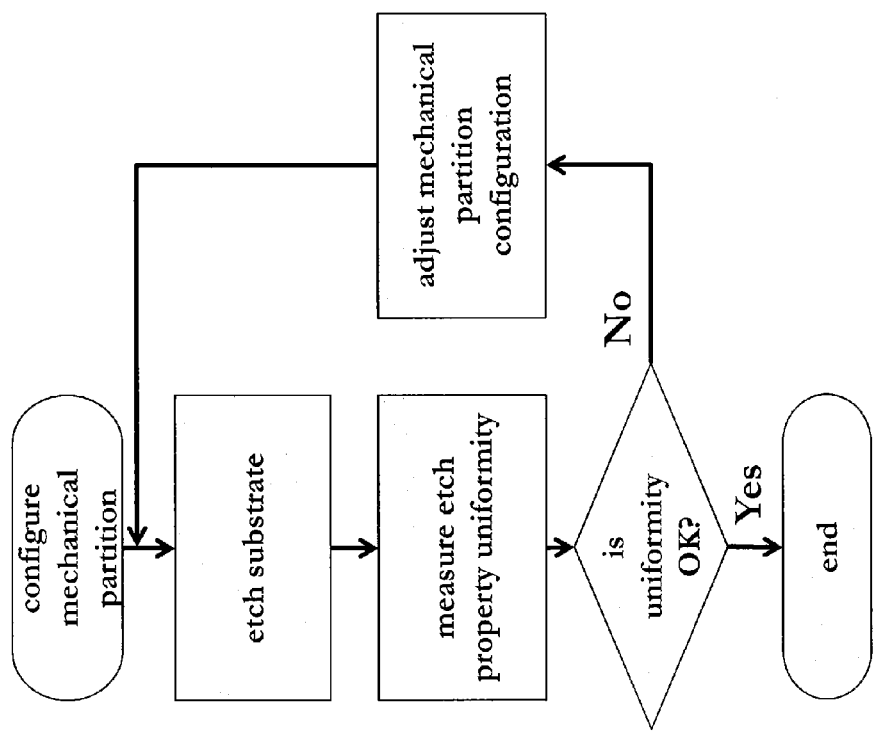
FIG. 25 is a flow chart of a method to adjust a mechanical partition according to the present invention.

In order to determine the correct perforation (695) configuration for a mechanical partition (690), the following steps may be followed for a given partition configuration (see FIG. 25): process a substrate, measure at least one wafer property (e.g., material etch rate, selectivity ratio, feature profile, etc.), adjust the mechanical partition (690) (e.g., partition spacing, distance from partition to substrate, partition thickness and/or perforation size, spacing, shape, and/or aspect ratio, etc.) based on at least one measured property. Another wafer is processed, and if necessary the mechanical partition (690) is iterated to achieve the desired wafer property or properties.

Typically, in a chemically driven plasma etch process, it is desirable to maximize the ratio of the substrate etch rate to the masking material etch rate (etch selectivity) while maintaining a desired feature profile. In the case of silicon etching using a time division multiplexed process (e.g., Bosch process or DRIE), this is accomplished by applying some minimum RF bias power to the substrate through the substrate support in order to maintain a desired feature profile. Typically, this RF bias power is less than approximately 50 W. At higher RF bias powers, the etch selectivity (material etch rate/mask etch rate) can be undesirably reduced. When a mechanical partition is placed between the high density plasma source and the substrate, the density of ions available to etch the substrate is significantly reduced. This allows higher RF bias powers to be beneficially applied to the substrate in comparison to the prior art. With the mechanical partition between the plasma source and the substrate, beneficial time division multiplexed (e.g., Bosch, DRIE) process results can be achieved at RF bias powers applied to the substrate in a range of 50 W to 150 W. In a preferred embodiment, the RF bias power applied to the substrate is greater than approximately 50 W. In another preferred embodiment, the RF bias power applied to the substrate is greater than approximately 100 W. In another preferred embodiment, the RF bias power applied to the substrate is greater than approximately 150 W.

Figure 15:
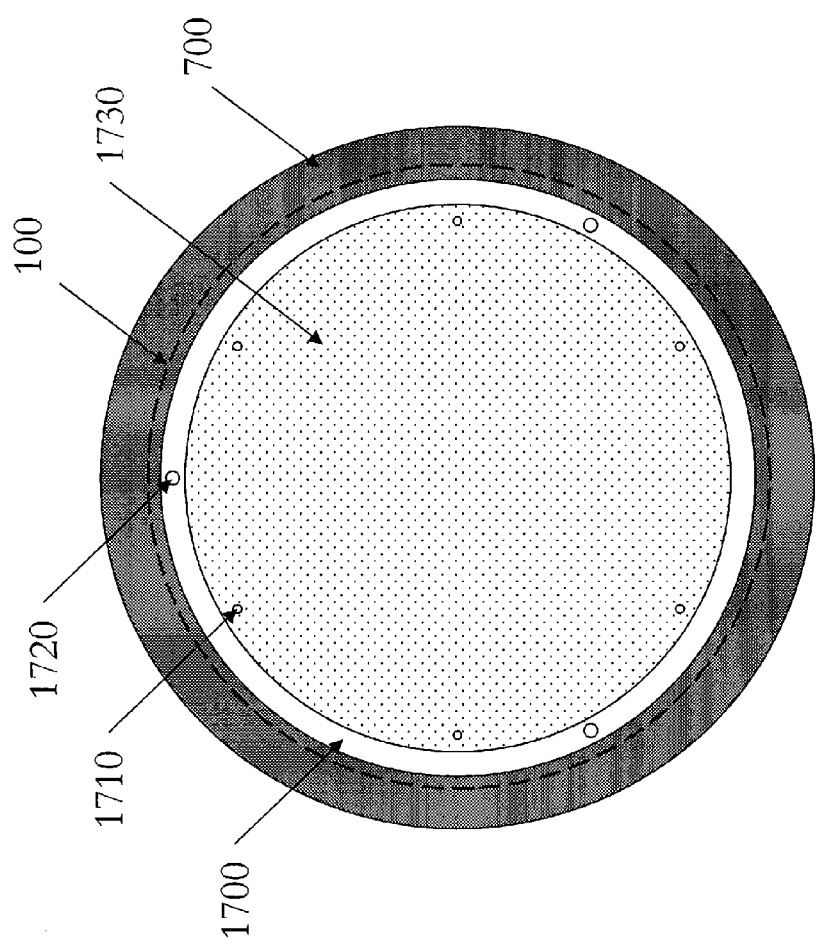
FIG. 15 is a top view of an electrostatic chuck according to the prior art.
Figure 16:
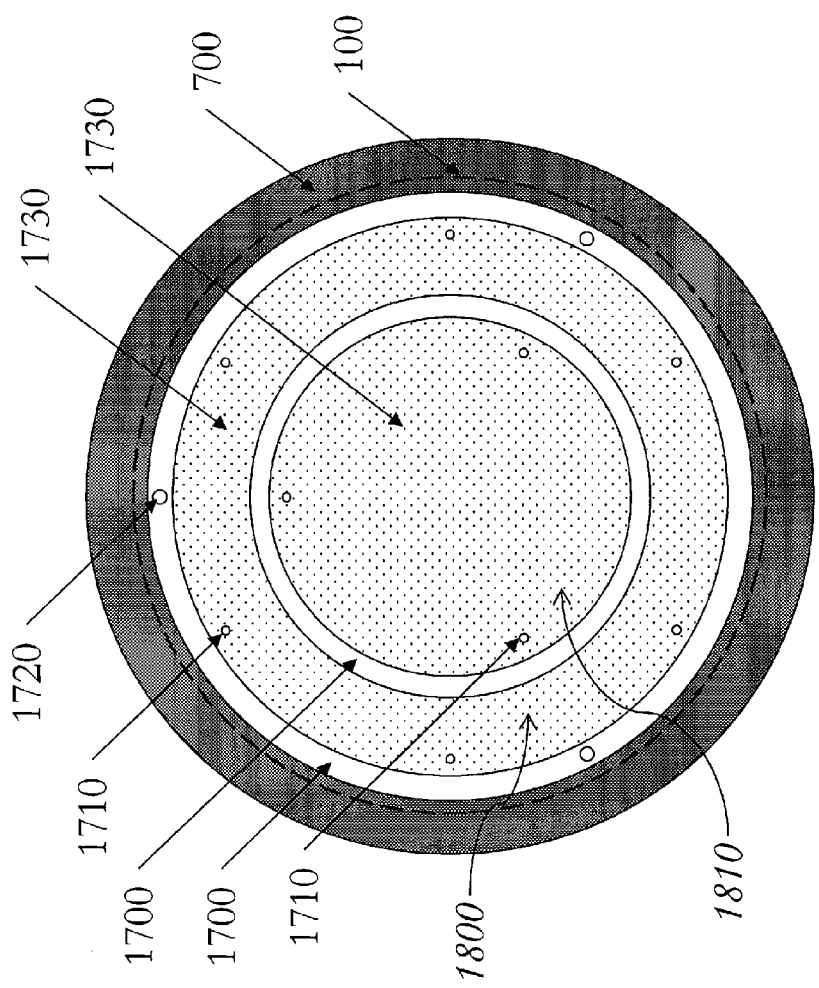
FIG. 16 is a top view of a multi-zone electrostatic chuck according to the prior art.
Figure 17:
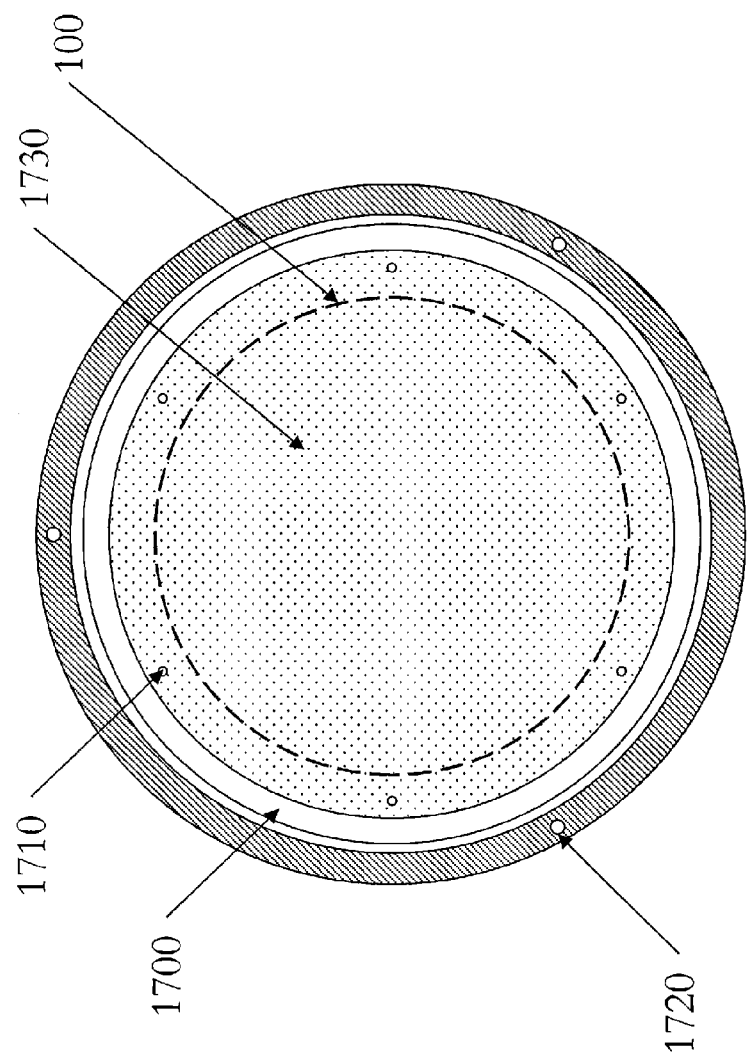
FIG. 17 is a top view of an electrostatic chuck according to one embodiment of the present invention.

During plasma processing, additional cooling of the substrate (100) is often provided through the use of an Electrostatic chuck (ESC) (670). FIGS. 15-17 show examples of ESCs (670) that are commonly used in semiconductor processing to apply an attractive force to a substrate (100) while a pressurized fluid; typically a gas, such as Helium is maintained in the gap (2000) between the substrate (100) and the ESC. This ensures that efficient heat transfer can occur between the substrate (100) and the work piece support (630), which can be temperature controlled. Note in FIGS. 15 and 16, for illustration purposes, that the dashed line represents the area of the ESC that the wafer (100) overlaps. During processing the wafer (100) sits on the top surface of the ESC (670).

Figure 18:
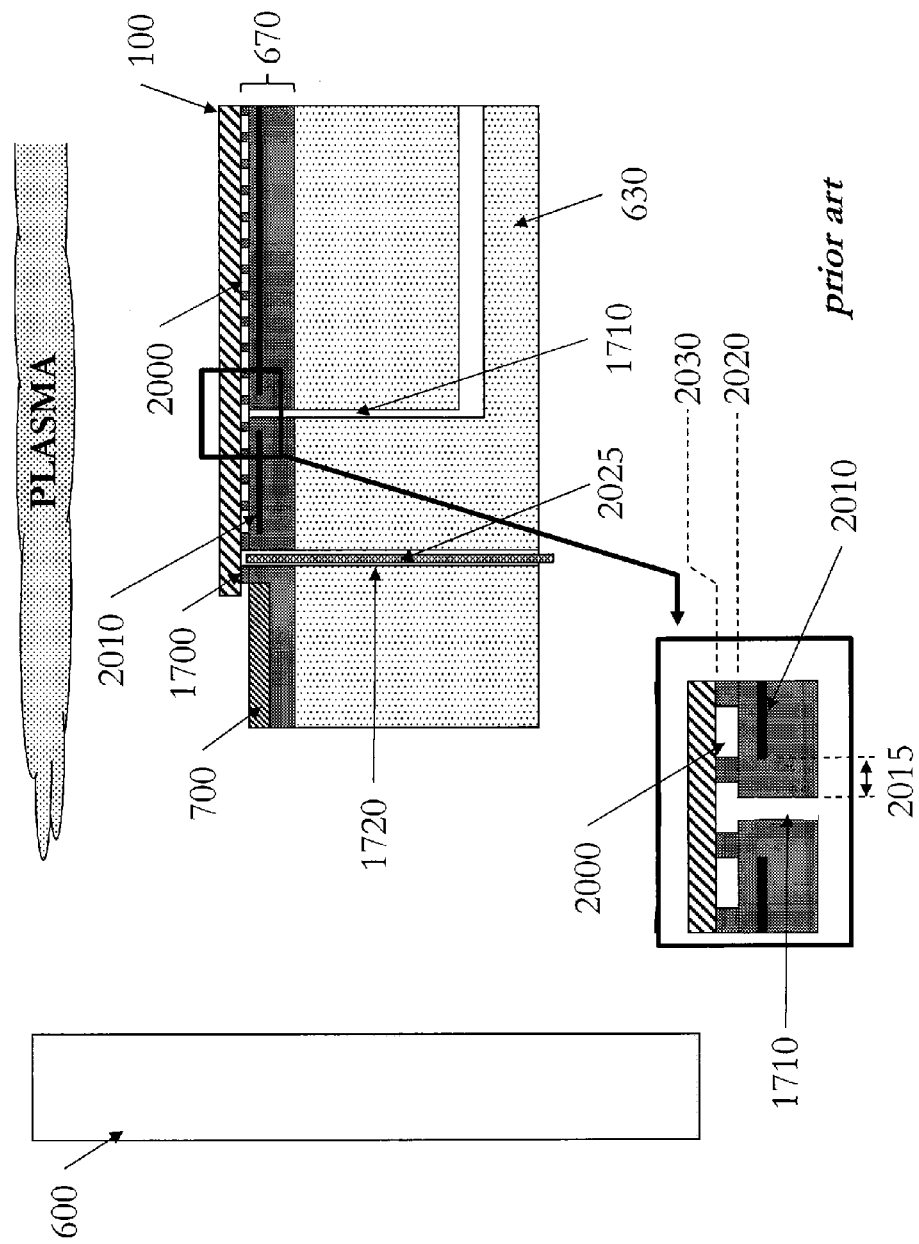
FIG. 18 is a cross-sectional view of a substrate on an electrostatic chuck according to the prior art.

FIG. 15 shows a top view of an electrostatic chuck as is known in the art. An ESC (670) will commonly have a sealing region or regions (1700) to confine the pressurized fluid between the ESC and the substrate (100) being clamped. The sealing regions (1700) are commonly employed near the perimeter of the ESC and around any features that would otherwise cause the pressurized fluid to leak and degrade the heat transfer. Some ESCs make use of multiple concentric seal bands (1700) as shown in FIG. 16 to generate discrete volumes or zones (1800, 1810) that allow independent control of the fluid pressure within the respective zone. These ESCs are commonly described as multi pressure zone ESCs. It is also possible that the pressure zones (1800, 1810) are not discrete and some of the pressurized fluid leaks between zones. Wide sealing regions (1700) are typically not preferred. Typically, the thermal gradients across the work piece area which overlaps said wide sealing region may negatively impact some characteristic of the etch. On the contrary, if a sealing region is not wide enough, the pressurized fluid may leak and heat transfer may degrade. As shown in FIG. 15, in the prior art the sealing regions or bands (1700) described above do not extend past the substrate (100) since doing so would expose the sealing surface of the seal band (1700) to potentially corrosive plasma gases that may decrease the lifetime of the ESC. FIG. 18 shows the cross sectional view of a rigid substrate (100) on an electrostatic chuck as is known in the art. Note that the seal band (1700) is overlapped by the substrate (100). Furthermore, it is typical in the art to have the substrate (100) extend beyond the edge of the sealing surface (1700) in order to accommodate for any placement error during placement of the wafer on the ESC (670). It is also important to note that in the prior art that the lift pin holes (1720) and lift pins (2025) used to lift the substrate off the ESC are also located under the substrate (100)—inside or within the outermost seal band (1700). Finally, ESCs known in the art have the clamping electrode(s) (2010) confined to the areas underneath the substrate (100). Therefore the clamping electrode (2010) is inside of the area defined by the outer seal band (1700)—both of which are inside the wafer perimeter.

Figure 19:
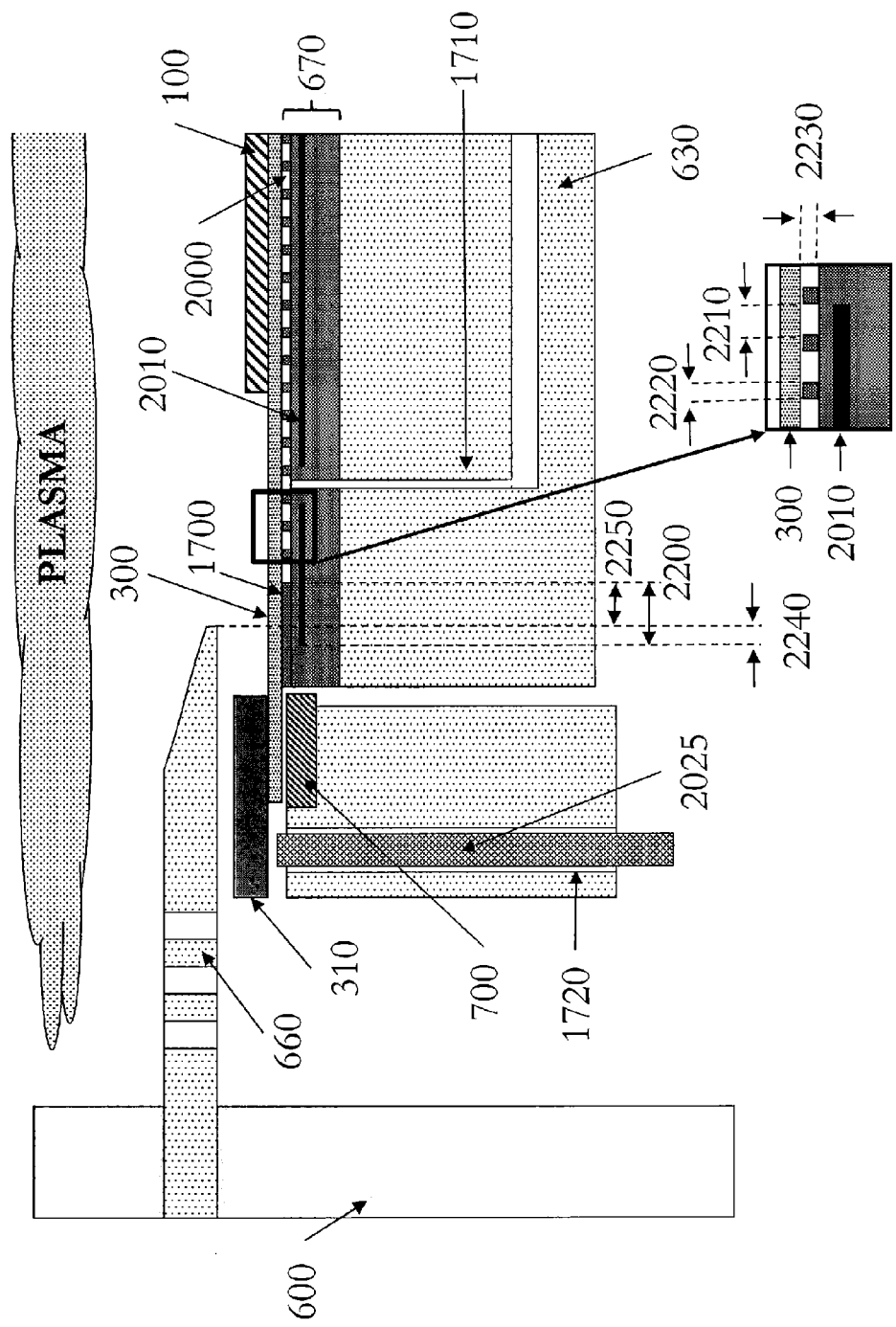
FIG. 19 is a cross-sectional view of a work piece on an electrostatic chuck according to one embodiment of the present invention.

FIG. 19 shows a cross sectional view for one embodiment of the current invention. When clamping a flexible work piece (e.g., a work piece (320) containing tape (300), etc.), it is preferable to have at least one clamping electrode (2010) overlap the sealing region (1700) as depicted in FIG. 19. This is particularly important when a flexible region of the work piece overlaps the sealing region (1700). Overlap of the clamping electrode (2010) with the flexible work piece (300) helps minimize Helium gas leakage. Preferably this overlap (2200) is greater than 1 mm wide. The overlap (2200) can be along inside seal band perimeter, outer seal band perimeter, within the seal band, or some combination of the three.

In one embodiment of the invention, the region defined by the overlap of the clamping electrode (2010) and the sealing band (1700) form a continuous boundary that circumscribes the substrate (100). In another embodiment of the invention, the seal band (1700) can be completely overlapped by the clamping electrode (2010).

In yet another embodiment of the invention, the clamping electrode (2010) may overlap the cover ring (660). The overlap (2240) is typically in the range of approximately 1 mm to less than approximately 10 mm. In one preferred embodiment, the overlap (2240) is less than approximately 1 mm. In another preferred embodiment, the overlap (2240) is less than approximately 10 mm. The overlap (2240) may be zero.

In another embodiment, some portion of the seal band (1700) is not overlapped by the cover ring (660)—this unshielded seal band region (2250) is shown in FIG. 19. In this configuration, it is preferred that the clamping electrode (2010) overlaps some portion of the unshielded seal band region (2250) (e.g., the seal band (1700) that is not covered by the cover ring (660)). It is preferred that the overlap of the clamping electrode (2010) and the unshielded seal band region (2250) be greater than approximately 1 mm wide. It is also preferred that the overlap of the clamping electrode (2010) and the unshielded seal band region (2250) circumscribe the substrate (100). In one embodiment, the clamping electrode (2010) overlaps the entire unshielded seal band region (2250) of the seal band (1700) that is not overlapped by the cover ring (660).

Said sealing region(s) (1700) are typically between 1 mm and 15 mm wide, but preferably less than 10 mm. With a work piece (substrate/tape/frame assembly) (320), the area outside the diameter of the substrate (100) and inside the inner diameter of the frame (310) is tape (300).

While the preceding examples are described for an ESC with a single zone ESC with one seal band, these embodiments can also be beneficially applied to electrostatic chucks with multiple pressure zones (and multiple seal bands).

Using a typical ESC, because the cover ring (660) is larger than the diameter of the substrate (100), there would be an area of tape (300) exposed to the plasma process that is not being clamped and temperature controlled by the ESC (670) or being shielded from the plasma (400) by the cover ring (660). Such an area of tape (300) would reach a high temperature and possibly fail. Thus, FIG. 8 shows the use of an ESC (670) that is made purposely larger than the substrate diameter so that any tape (300) which is exposed to the plasma in region (e.g., the area defined by the cover ring to substrate distance (820)) is also clamped and temperature controlled. The ESC diameter can be extended outwards to the outer perimeter of the frame (310), but the ESC diameter is preferred to be at least 0.2 mm less than the inner diameter of the frame (310). For other frame form factors, the ESC diameter is preferably smaller than the largest opening in the frame.

As shown in FIG. 15, typical ESCs as are known in the art and used in semiconductor processing have a pattern (1730) on their surface. The patterned surface (1730) is completely overlapped by the substrate (100) and is inside the seal band (1700). The helium inlet holes (1710) are in the patterned area (1730). The pattern is typically tailored to control certain ESC characteristics such as; but not limited to, heat transfer, temperature uniformity, Helium gas diffusion, and clamping force. The pattern can also be tailored to minimize particle generation. As shown in FIG. 18 the patterning generates at least one mostly planar surface (2020) that is below the substrate contact surface (2030) of the ESC thus forming at least one gap (2000) when a substrate is clamped. This gap (2000) is typically filled with a pressurized fluid such as Helium to facilitate heat transfer.

FIG. 19 shows another embodiment of the invention. For an application like plasma dicing, where the work piece contains a flexible membrane (300), it is preferable that the pattern spacing (2210) be chosen so as to minimize deformation of the membrane (300). For plasma dicing, this is particularly important after the die (110) have been separated (singulated) and are only substantially supported by the flexible tape (300). When the pattern spacing (2210) is larger than at least one dimension (length and/or width, but not thickness) of an individual die, it is possible that die could tilt after being separated and contact each other potentially causing damage to the die. In one embodiment, the pattern on the ESC surface has a pattern spacing (2210) less than the smallest die dimension (length and/or width). The pattern depth has a preferred range of less than approximately 50 µm to less than approximately 100 µm. In a preferred embodiment, it is preferred that the pattern depth (2230) be less than 100 µm. In another preferred embodiment, it is preferred that the pattern depth (2230) be less than 50 µm. The pattern depth (2230) may be less than 15 µm. Die sizes can range from approximately tens of microns up to centimeters.

In another embodiment, the pattern feature size (2220) in the plane parallel to the sealing surface can be between 0.1 mm and 30 mm, but preferably the pattern feature size (2220) is between 0.5 mm to 10 mm. The pattern spacing (2210) is typically at least the pattern feature size (2220) in the plane parallel to the sealing surface, but preferably at least 1.5 times said pattern feature size (2220). Although a size is used to describe the dimension of the pattern features, different shapes of similar dimensions can be used. The pattern features (2220) may vary in size and shape. Likewise, the pattern spacing (2210) between the pattern features (2220) may also vary in size, shape and depth.

In another embodiment, in order to prevent die from contacting one another once they are separated, the ESC region overlapping the substrate can be designed to have pattern features sizes (2220) and pattern feature spacings (2210) such that both the pattern feature size (2220) and pattern feature spacing (2210) are smaller than the die to be singulated. The substrate (100) can completely overlapped by the patterned region of the ESC. Die sizes can range from approximately tens of microns up to several centimeters. In one embodiment the surface of the ESC (670) overlapped by the substrate (100) is roughened. The roughening can be accomplished through physical (e.g., bead blasting, sand blasting, etc.) or chemical means or a combination of both. The roughened surface allows the backside cooling gas (e.g., helium) to fill voids between the ESC (670) and the work piece (320). It is preferred that the roughness of the ESC surface underlying the work piece (320) is greater than the roughness of the seal ring (1700). Seal ring areas typically have a surface roughness less than approximately 10 micro-inches ($R_a$). It is further preferred that the roughness of the ESC (670) surface that is overlapped by the substrate be greater than approximately 12 micro-inches ($R_a$). The roughness of the ESC (670) surface that is overlapped by the substrate can be greater than approximately 30 micro-inches ($R_a$). It is also preferred that the roughened ESC surface extends beyond the perimeter of the substrate (100) in a range of approximately 1 mm to approximately 10 mm. It is further preferred that the roughened surface extends at least approximately 1 mm beyond the perimeter of the substrate (100). In another preferred embodiment, the roughened surface of the ESC can extend more than approximately 10 mm from the perimeter of the substrate.

Figure 22:
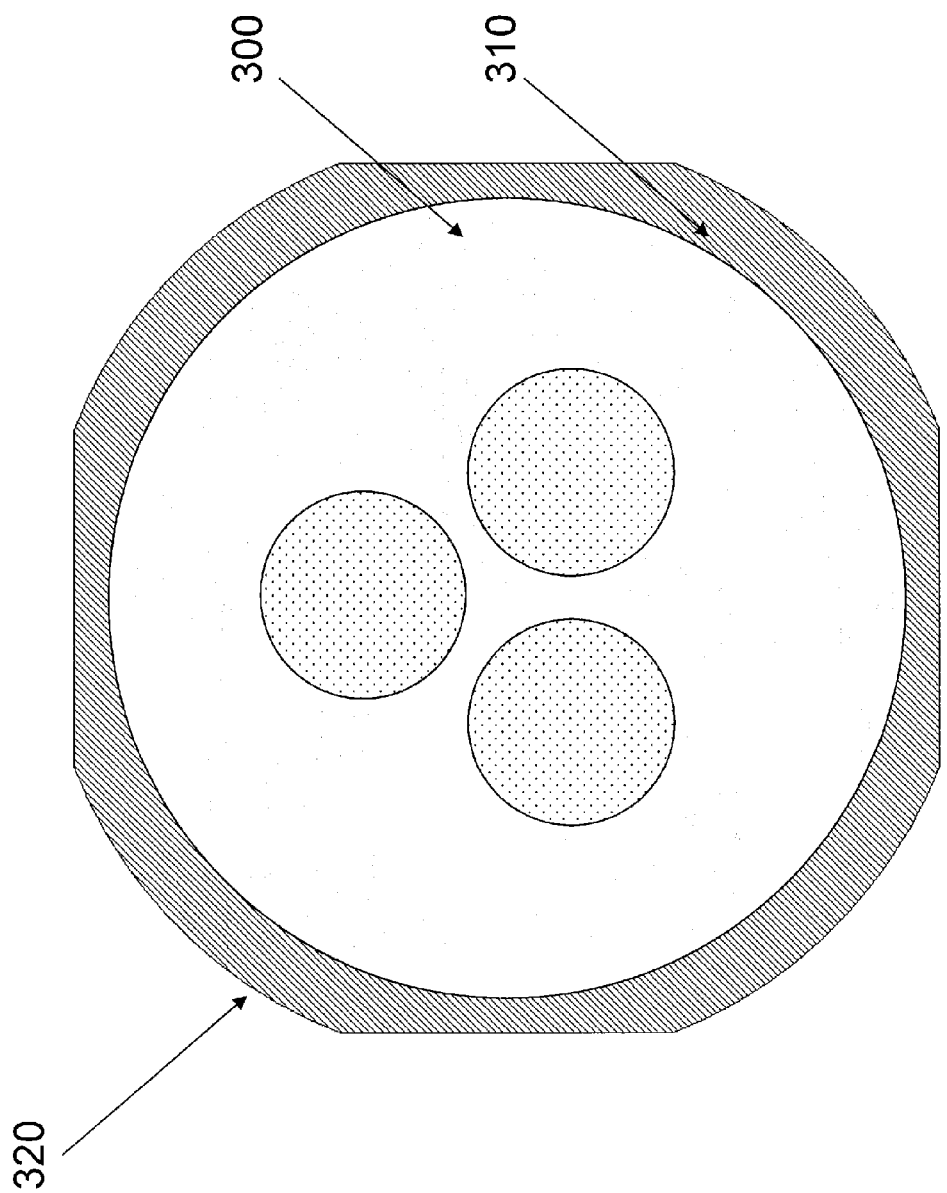
FIG. 22 is a top view of a work piece with multiple substrates according to one embodiment of the present invention.

In the case where the work piece (320) contains more than one substrate (100) as shown in FIG. 22, it is preferred that the ESC (670) extends beyond the edge of at least one substrate (100)—preferably extending beyond the edges of all substrates (100). In order to confine the cooling gas (typically helium) behind the substrates, the tape (300) must form a sealing surface between the electrostatic chuck (670) and the tape (300). This sealing surface is often called a seal band (1700). In one embodiment, the sealing surface (1700) is continuous and forms a region that circumscribes all the substrates (100). In another embodiment, the sealing band (1700) may be discontinuous and circumscribes at least one substrate. In yet another embodiment, each substrate (100) is circumscribed by an individual seal band (1700). In a further embodiment, the substrates (100) may overlay the sealing band(s) or alternatively, the sealing band(s) may lie outside the substrate(s) (100).

In the case where the work piece (320) contains multiple substrates, the ESC (670) can contain a single clamping electrode (2010) (e.g., monopolar) or multiple clamping electrodes (2010) (e.g., multipolar). When multiple substrates (100) are present on a work piece (320), it is preferred that a clamping electrode (2010) extends beyond the perimeter of at least one substrate (100) on the work piece (320). Preferably, a clamping electrode extends beyond the perimeter of all substrates (100) on the work piece (320) in a preferred range of approximately 1 mm to approximately 10 mm. It is preferred that a clamping electrode extends at least 1 mm beyond each substrate (100) perimeter. In another embodiment, a clamping electrode (2010) can extend at least 10 mm beyond each substrate (100) perimeter on the work piece (320). In another embodiment, a clamping electrode (2010) overlaps all of the substrates (100). In another embodiment, each substrate (100) is completely overlapped by a clamping electrode (2010). It is preferred that a clamping electrode (2010) is continuous (e.g., no cut-outs) where it overlaps a substrate (100). It is also preferred that Helium inlet holes (1710) are not overlapped by any substrate (100). The Helium inlet holes can be at least 1 mm from any substrate perimeter.

In the prior art as shown in FIGS. 15 and 17, the areas of the ESC (670) that are not covered by the wafer (100) are covered and protected from the plasma by a filler ring (700). This is in contrast to the current invention where the top surface of the ESC (670) is protected from plasma exposure by the tape (300). The filler ring (700) can be configured such that the filler ring (700) is not exposed to the plasma. In the case of multiple substrates (100) on a work piece (320), the top surface is protected by the presence of the flexible tape (300) in the work piece (320). This is in contrast to prior art configurations that provide a protective cover over the ESC to protect the surface of the ESC between the substrates from plasma exposure.

For all cases (single substrate or multiple substrates on a work piece (320)) where the ESC (670) contains more than one clamping electrode, it is preferred that the edge of any clamping electrode does not intersect a substrate (100). It is further preferred that the edge of a clamping electrode is at least 1 mm away from the perimeter of a substrate (100).

When clamping a work piece where the surface in contact with the ESC is an electrical insulator, it is preferable that the electrical insulator's relative static electric permittivity (commonly known as its relative dielectric constant) be greater than 2. It is also preferred that the electrically insulating layer covering the ESC's clamping electrode have a relative dielectric constant greater than 6, but can typically be greater than 2. The relative dielectric constant of the pressurized fluid which fills the gap (2000) is preferably less than the lowest relative dielectric constant of any bounding electrical insulators. The relative dielectric constant of the pressurized fluid is ideally less than 2. The strong electric field within the gap leads to a strong clamping force exerted on the bottom surface of the work piece. The pressure of the fluid in the gap (2000) is typically between 1 Torr and 100 Torr, but preferably between 1 Torr and 40 Torr.

As shown in FIG. 18, it is known in the art that the pressurized fluid may be introduced into the gap between the work piece and the ESC by holes (1710) or features that penetrate the ESC. It is known in the art that any portion of the clamping electrode (2010) in the vicinity of this holes or any other feature that penetrates said electrode be cut away. Typically, these holes (1710) or penetrating features are round in nature; therefore, the cut-out within the electrode is typically of a similar shape. A clearance (2015) between the hole (1710) or penetrating feature and the clamping electrode (2010) cut-out is typically employed to prevent arcing or ionization of the pressurized fluid during operation. FIG. 15 further shows that for ESCs known in the art that the gas introduction holes (1710) are typically overlapped by the substrate (100). Furthermore, as shown in FIG. 18 in a prior art ESC the clamping electrode (2010) has cut-outs some distance (2015) around the holes (1710) or penetrating features. Since the holes (1710) or penetrating features are overlapped by the substrate, the cut-outs in the clamping electrode are also overlapped by the substrate.

For etch processes that are ion driven (e.g., RF power is applied to the work piece support and/or ESC clamping electrode), the localized distortions in the electric field which arise from the discontinuities in a clamping electrode and/or work piece support can cause plasma sheath non-uniformities. The non-uniformities in the plasma sheath can cause ions to impinge on the wafer at various angles. The impinging ions will have an angular distribution that is affected by several parameters (e.g., the work piece support RF frequency) which will be discussed below. The sheath distortions due to the discontinuities discussed above, can skew, narrow or broaden the angular distribution. When etching features, these effects may translate to profiles which may be tilted, skewed, bowed, or have sidewall degradation.

FIG. 17 shows another embodiment of the invention. When using a work piece such as the one depicted in FIG. 3, or a substrate mounted to an oversized carrier in conjunction with an ESC (670) that extends past the substrate (100), it is preferred to place the holes (e.g., Helium gas inlet ports) (1710) outside the substrate (100) perimeter. Similarly, it is preferred that the lift pin holes (1720) are located outside the wafer (100) perimeter. In one embodiment (as shown in FIG. 9), the ESC contains no penetrations for the lift mechanism (680). The lift mechanism (680) can be external to the work piece support (630). Note in FIG. 17, for illustration purposes, that the dashed line represents the area of the ESC that the wafer (100) overlaps. During processing the work piece (320) (and consequently the substrate (100)) sits on the top surface of the ESC (670).

As shown in FIG. 19, placement of the holes (e.g., He gas inlet ports) (1710) and lift pin holes (1720) outside the wafer perimeter allows the clamping electrode (2010) that is overlapped by the substrate (100) to be continuous without cut outs (contrast to the prior art shown in FIG. 18). In a preferred embodiment, the clamping electrode (2010) completely overlaps the substrate. In yet another embodiment, the clamping electrode (2010) completely overlaps the substrate and overlaps a region that is greater than or equal to 1.02 times the substrate (100) diameter. In yet another embodiment, the clamping electrode (2010) overlaps the entire substrate (100) and extends at least 2 mm beyond the edge of the substrate (100). Preferably, the clamping electrode (2010) is at least approximately 40% larger than the substrate (100) diameter.

Although it is common to have holes (1710) and lift pin holes (1720) under the substrate for typical ESCs (see prior art FIGS. 15 and 16), it is preferable to not have them under the wafer when at least one clamping electrode (2010) and/or the work piece support (630) is RF powered. When using a work piece (320) and ESC such as the one depicted in FIG. 19, it is preferred that the diameter of the RF powered region (e.g., work piece support (630) or clamping electrodes (2010)) be larger than the substrate (100) being etched. Sheath non-uniformities which arise from the edge of the RF powered region can have detrimental effects on the etch profile as mentioned above, and thus it is preferred that said RF powered region or regions be at least 5% larger than the diameter of the substrate (100). Ideally, if the thickness and relative dielectric constant is kept mostly unchanged above the RF powered region or regions, the diameter of said RF powered regions should be about 40% larger than the substrate (100). The RF powered region can be greater than 10 mm beyond the perimeter of the substrate (100)

Figure 26:
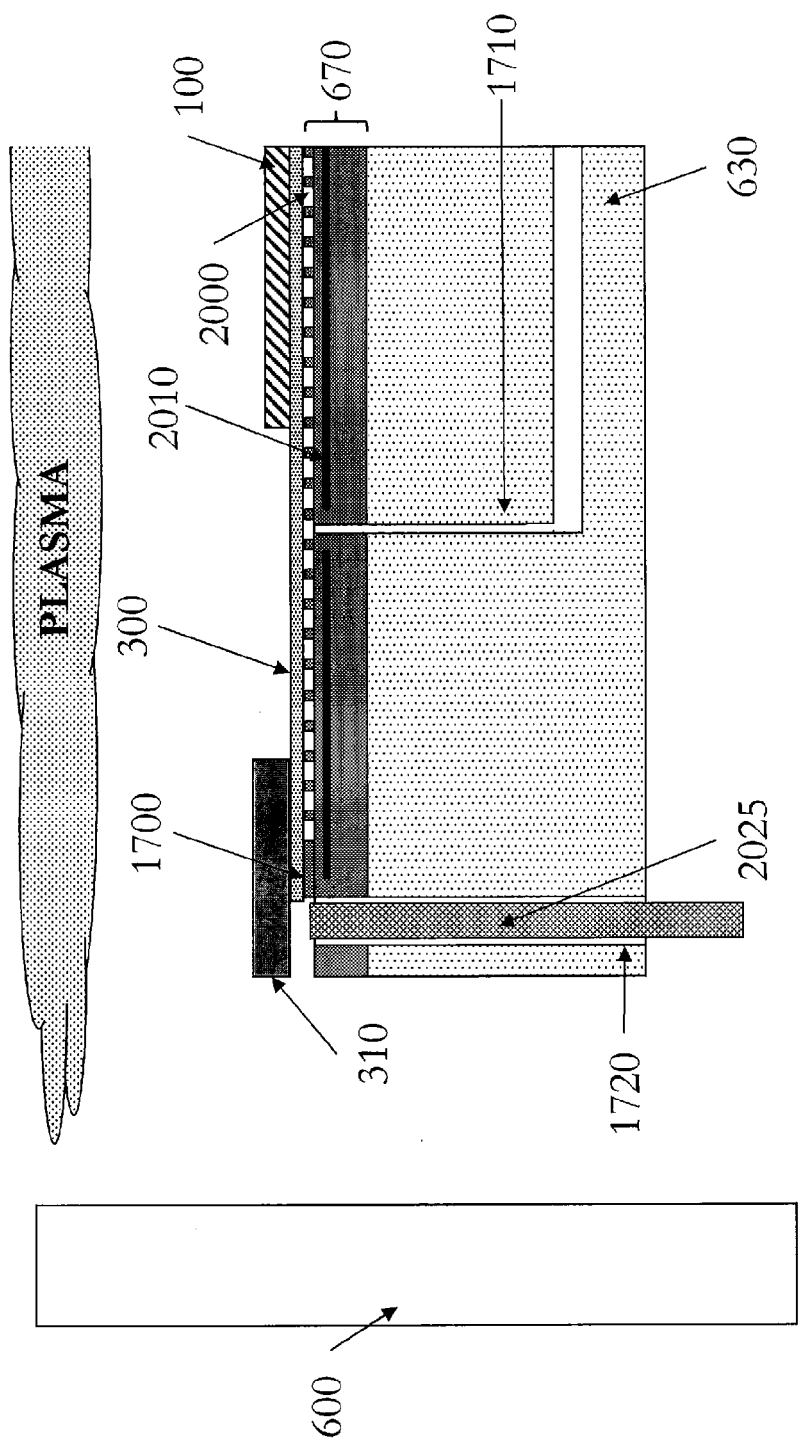
FIG. 26 is a cross section of an electrostatic chuck according to one embodiment of the present invention.

FIG. 26 shows another embodiment of the invention. In this embodiment the ESC (670) overlaps the frame (310). In this configuration, there is a region of overlap between a seal band (1700) and the frame (310). The frame (310) can completely overlap a seal band (1700).

FIG. 26 illustrates the case where the inner diameter of the frame (310) is smaller than the inner diameter of the outermost seal band (1700), it is important to note that the inner diameter of the outermost seal band (1700) can be smaller than or equal to the inner diameter of the frame (310). Furthermore, FIG. 26 shows an ESC configured for a single Helium backside cooling zone with a single seal band (1700), the invention can also be beneficially applied to ESCs with multiple Helium cooling zones and/or seal bands.

FIG. 26 also shows a work piece configuration where the flexible tape (300) (e.g., dicing tape) does not completely overlap the frame (310). In order to protect the seal band surface from degradation from reactants or byproducts, it is preferred that a seal band (1700) does not extend past the perimeter of the flexible tape (300). In order to provide a clamping force to the frame (310), it is also preferred that some portion of a clamping electrode (2010) overlap a portion of the frame (310). In this configuration, the frame (310) is in thermal communication with the temperature controlled work piece support (630), consequently, the frame (310) may be exposed to the plasma.

The embodiment shown in FIG. 26 can also benefit from features described in previous embodiments—with the exception of the cover ring (660). The embodiment illustrated and described by FIG. 26 can be beneficially applied without the use of a cover ring.

For processes where an RF bias voltage is required, in order to minimize perturbations in the plasma sheath at the substrate (100) surface that may lead to etch non-uniformities, it is preferred that the region of the ESC (670) overlapped by the substrate (100) be uniform with no penetrations (e.g., Helium gas inlet holes (1710) or lift pin holes (1720)) through the ESC (670). It is preferred that the Helium gas inlets (1710) are not overlapped by the substrate (e.g., Helium gas inlets (1701) located outside the perimeter of the substrate (100)). The Helium gas inlets (1710) must be located interior to the outer most seal band (1700). It is preferred that any seal band (1700) is not overlapped by the substrate (100). It is also preferred that the clamping electrode (2010) is continuous in the region where the clamping electrode is overlapped by the substrate (100). It is preferred that the clamping electrode (2010) completely overlaps the substrate (100). The clamping electrode (2010) can extend beyond the perimeter of the substrate (100). It is further preferred that the lift pins (2025) and lift pin holes (1720) are located outside the substrate (100) perimeter. The lift pins can touch the frame (310) and/or the tape (300) where the tape (300) overlaps the frame (310). In an alternate embodiment the lift mechanism can be located outside the work piece support (630). The lift mechanism can contact the frame (310) from the bottom, top, or side of the frame (310), or some combination of the three.

Figure 27:
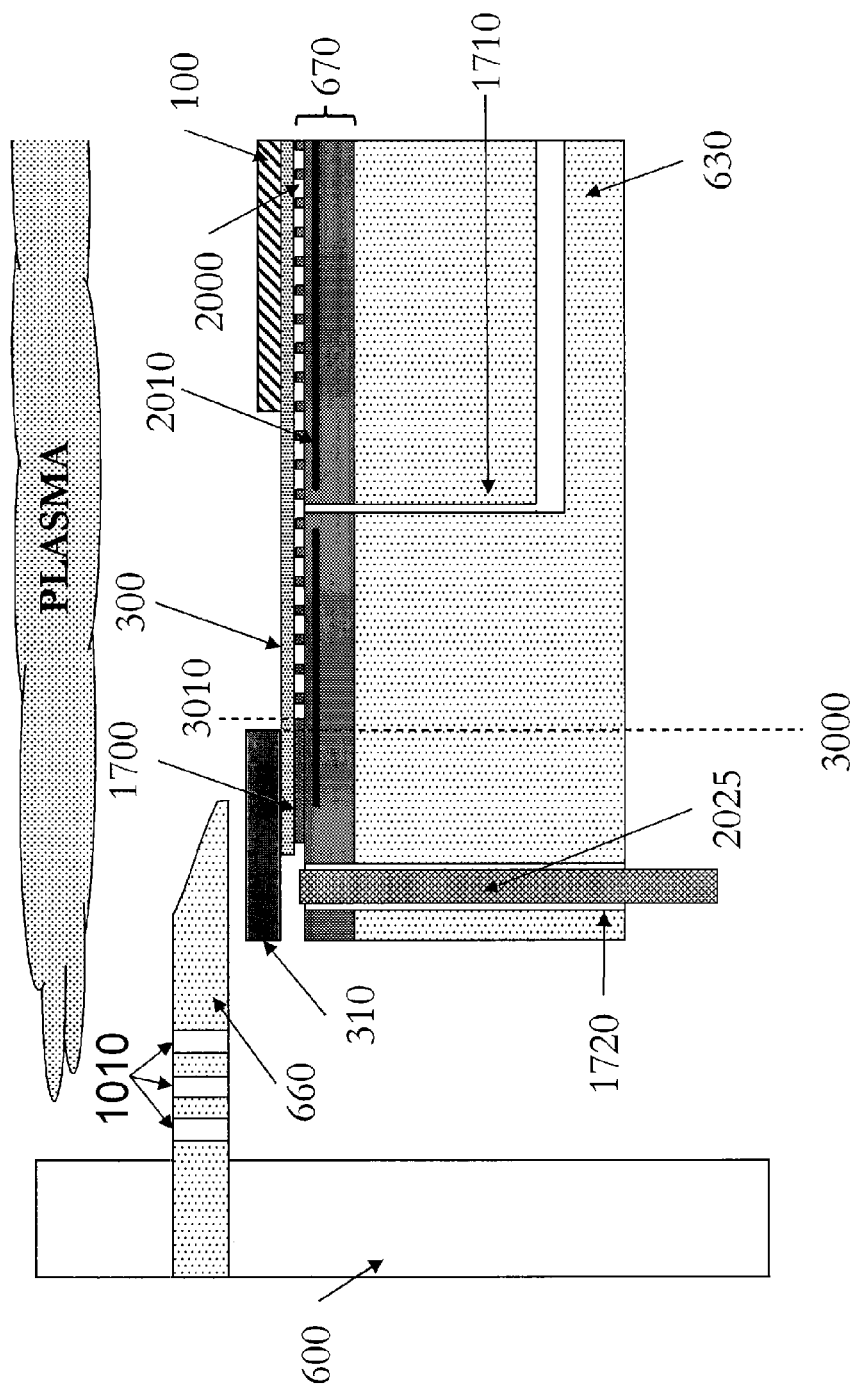
FIG. 27 is a cross section of an electrostatic chuck according to one embodiment of the present invention.

FIG. 27 shows yet another embodiment of the invention. This embodiment can contain the features described in FIG. 26 with the addition of a cover ring (660). In this configuration, the cover ring can overlap and protect unclamped portions of the work piece (320) from the plasma. The cover ring (660) is located between the plasma source (620) and the work piece (320). The inner diameter of the cover ring (660) can be larger than the inner diameter of the frame (310). The cover ring (660) can have ports (1010) to allow increased pumping efficiency. It is preferred that the ports (1010) are located outside the perimeter of the work piece support (630).

It is also important to note that FIGS. 26 and 27 illustrate aspects of the invention for a work piece (320) that contains a single substrate (100). The invention can also be beneficially applied to a work piece (320) that contains multiple substrates (e.g., the work piece shown in FIG. 22).

Figure 38:
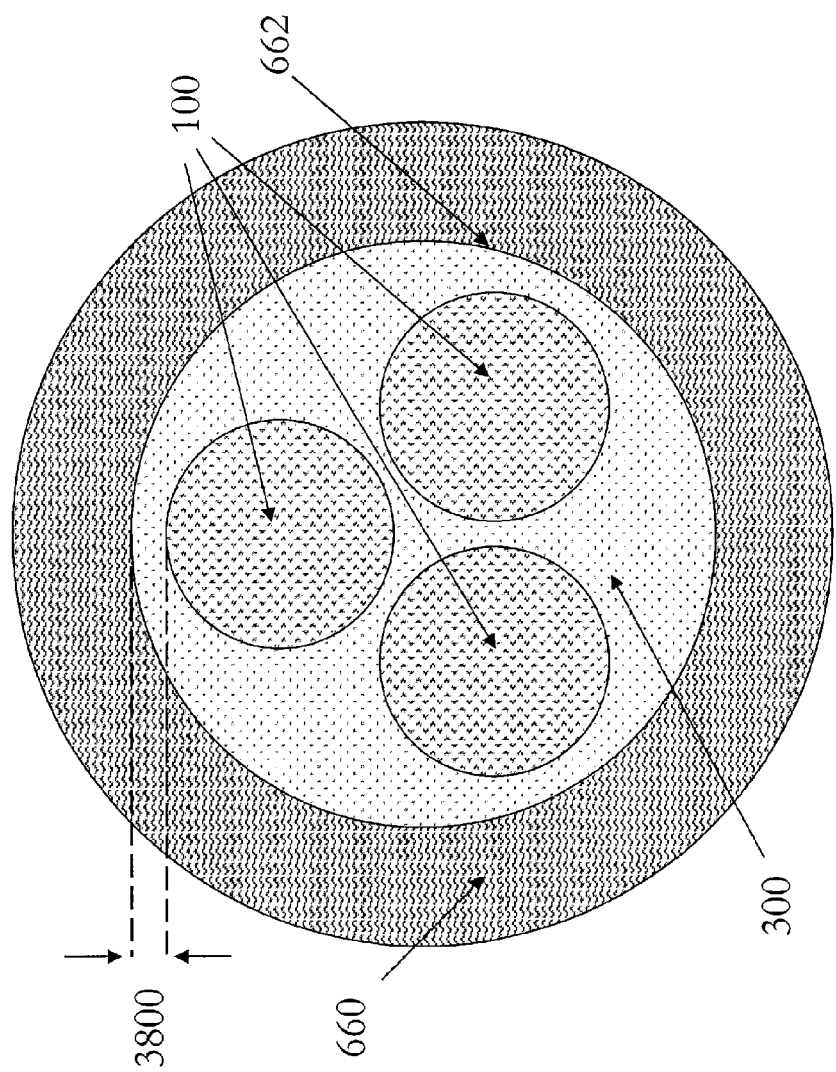
FIG. 38 is a top down view of a cover ring according to the present invention.

In another embodiment of the invention, shown in FIG. 38, a cover ring (660) is configured for a work piece (320) that contains two or more substrates (100). The substrates (100) can be different sizes and/or shapes. A substrate (100) can be a piece of a larger substrate (100). The substrates (100) can contain different materials. It is preferred that the substrates are processed with similar chemistries (e.g., Silicon and Germanium both etch in Fluorine containing chemistries). The cover ring (660) contains at least one opening (662) that exposes more than one substrate (100) to a plasma. It is preferred that the cover ring (660) does not overlap a substrate (100). In a preferred embodiment, the distance (3800) from the cover ring opening (662) to a substrate (100) perimeter is at least 0.1 mm. It is further preferred that the distance (3800) from the cover ring opening (662) to any substrate (100) perimeter is at least 0.1 mm. The distance (3800) can between a cover ring opening (662) and a substrate (100) perimeter can be greater than 1 mm. The cover ring (660) can be in a different plane than at least one substrate (100). The cover ring (660) can be in a different plane than all the substrates (100). It is preferred that the cover ring (660) is not in contact with the work piece (320). While the cover ring (660) described in this embodiment is configured for multiple substrates, it can contain features described in previous embodiments of cover ring (660).

Figure 39:
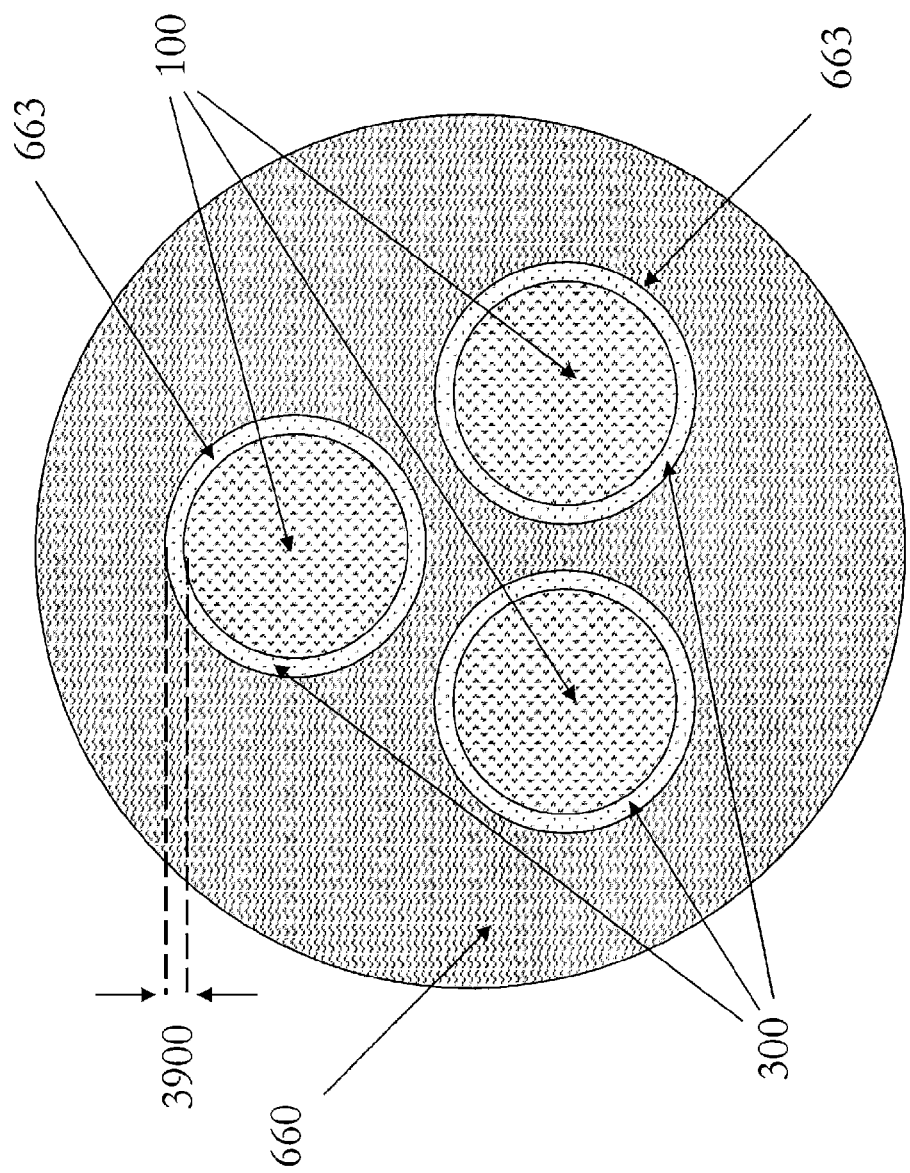
FIG. 39 is a top down view of a cover ring according to the present invention.

In yet another embodiment of the invention, shown in FIG. 39, a cover ring (660) is configured for a work piece (320) that contains two or more substrates (100). The substrates (100) can be different sizes and/or shapes. A substrate (100) can be a piece of a larger substrate (100). The substrates (100) can contain different materials. It is preferred that the substrates are processed with similar chemistries (e.g., Silicon and Germanium both etch in Fluorine containing chemistries). The cover ring contains at least two openings (663) that allow plasma to contact at least one substrate (100). In a preferred embodiment, each opening (663) exposes one substrate (100) to a plasma. The openings (663) can be different sizes and shapes. It is preferred that the cover ring (660) does not overlap a substrate (100). In a preferred embodiment, the distance (3900) from a cover ring opening (663) to a substrate (100) perimeter contained within the opening is at least 0.1 mm. It is further preferred that the distance (3900) from a cover ring opening (663) to any substrate (100) perimeter contained within the cover ring opening is at least 0.1 mm. The distance (3900) can between a cover ring opening (663) and a substrate (100) perimeter can be greater than 1 mm. The cover ring (660) can be in a different plane than at least one substrate (100). The cover ring (660) can be in a different plane than all the substrates (100). It is preferred that the cover ring (660) is not in contact with the work piece (320). While the cover ring (660) described in this embodiment is configured for multiple substrates, it can contain features described in other embodiments of the cover ring described herein.

While FIGS. 26 and 27 show a work piece with the frame (310) and the substrate (100) located in the same plane (e.g., the same side of the flexible membrane (300)), the work piece (320) can be configured such that the substrate (100) and the frame (310) are located on opposite sides of the membrane (300) (e.g., the bottom of the substrate is adhered to the top surface of the tape, while the top surface of the frame is adhered to the bottom surface of the tape). The concepts of the described invention can be beneficially applied to this work piece configuration.

As shown in FIG. 19, an ESC (2330) consists of one or more electrodes (2340) to which a high voltage is applied. The potential difference can be applied between at least one clamping electrode (2340) and an electrically conductive surface (e.g., chamber wall (600)) in contact with the plasma, or simply between two or more clamping electrodes. Typical applied clamping potentials range between 1 V and 10 kV, but the applied clamping potential is preferably between 1 kV and 5 kV. For a clamped material (2320) exposed to plasma induced self-bias voltages under 2 kV, it is preferred that the applied clamping potential difference be greater than the plasma induced self-bias on the clamped material (2320).

For all the embodiments of the invention described above, it is preferred that the back side of the substrate (100) (e.g., the surface of the substrate opposite the surface that contains devices (110)) face the flexible membrane (300) (e.g., the back of the substrate (100) can be in contact with the flexible membrane (300)). In an alternate embodiment of the invention, the substrate (100) can be mounted on the flexible membrane (300) such that the surface of the substrate (100) that contains devices (110) is facing the flexible membrane (300) (e.g., the device side of the substrate (100) can be in contact with the flexible membrane (300)).

As shown in FIG. 19, the clamping electrodes (2340) are separated from the work piece support (630) by an electrically insulating layer (2300) and separated from the material to be clamped (2320) by an upper electrically insulating layer (2310). The thickness and relative dielectric constant of the upper electrically insulating layer (2310) above the ESC's clamping electrode is preferably chosen to minimize the impact an insulating material to be clamped (2320) will have on the clamping performance (e.g., clamping force). In the current invention, the thickness of the dielectric (2310) and dielectric constant of said layer (2310) are chosen to both be higher than that of the material being clamped (2320). It is not necessary for example that the ESC upper dielectric (2310) thickness and upper dielectric (2310) relative dielectric constant both be higher than that of the material to be clamped (2320), either parameter can be manipulated so that the product of the relative dielectric constant and the thickness of the ESC's upper dielectric layer (2310) is greater than product of the material to be clamped (2320) thickness and dielectric constant. The ratio of the product of upper dielectric insulator (2310) relative dielectric constant with the upper dielectric insulator (2310) thickness to that same product for the material to be clamped (2320) is preferably greater than 1:1, but ideally greater than 5:1.

Figure 20:
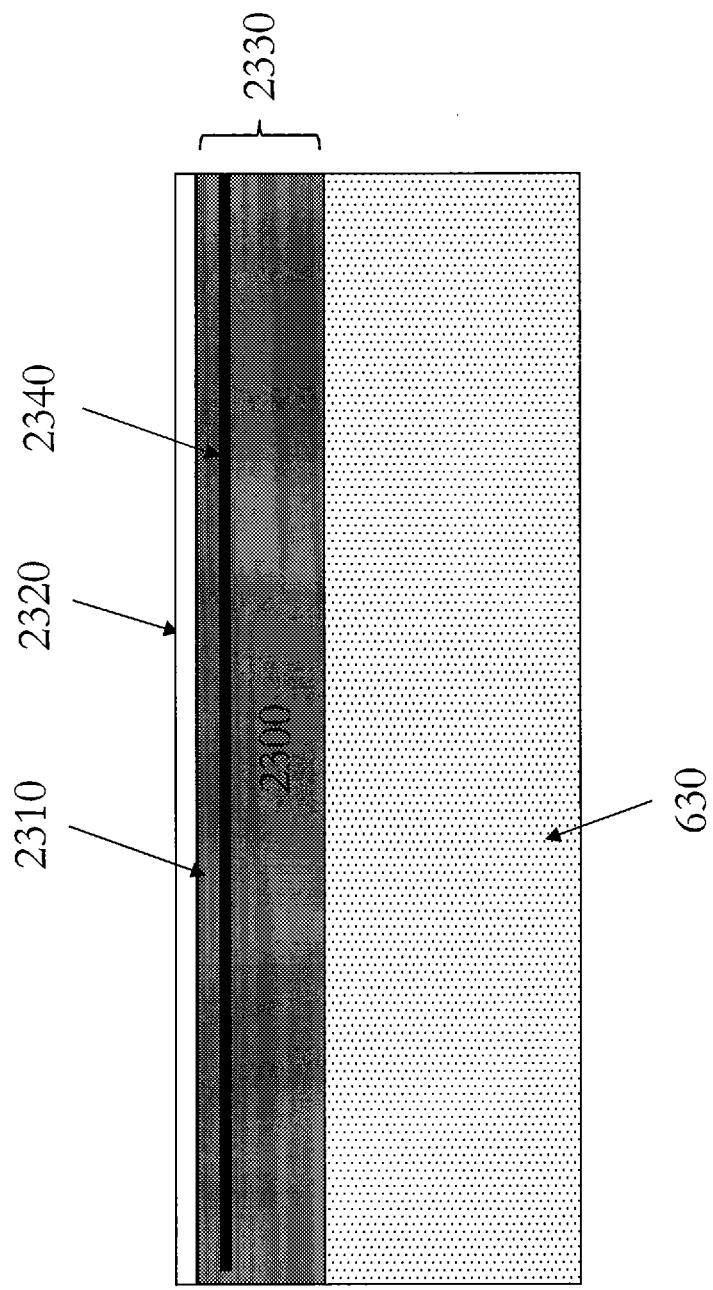
FIG. 20 is a cross-sectional view of an electrostatic chuck according to one embodiment of the present invention.
Figure 21:
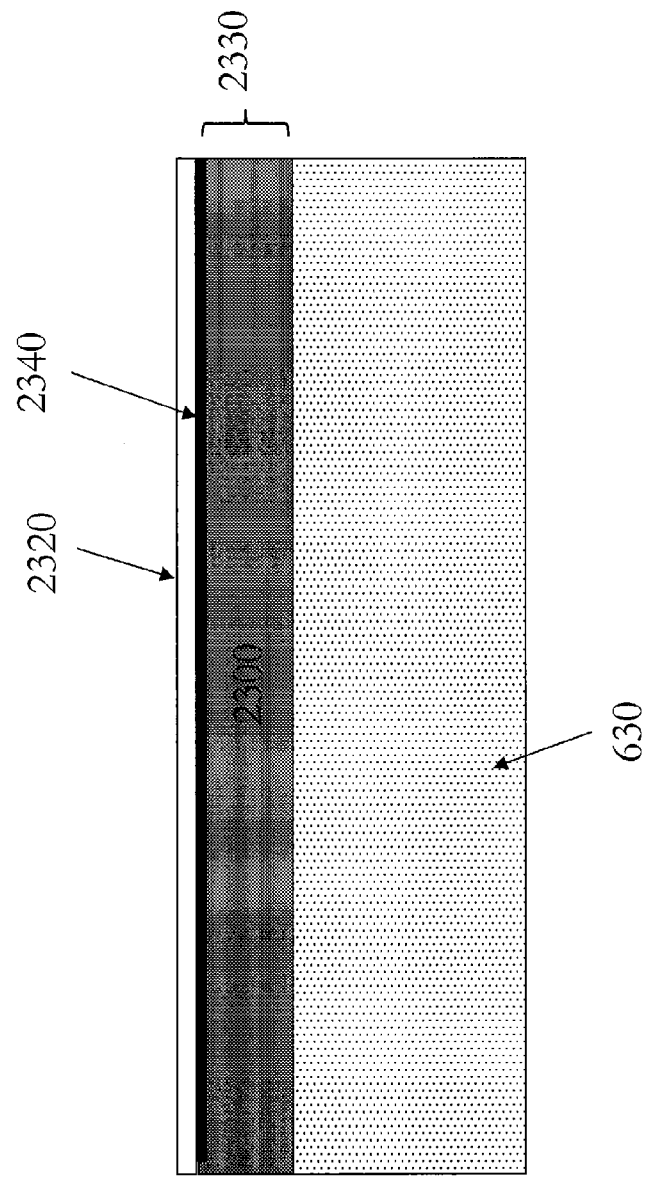
FIG. 21 is a cross-sectional view of an electrostatic chuck according to one embodiment of the present invention.

FIG. 20 shows another embodiment where the clamping electrode (2340) has no electrical insulator interposed between the clamping electrode (2340) and the material to be clamped (2320). In the case where the ESCs clamping electrode (2340) is exposed (not covered by an electrical insulator) and the clamping electrode (2340) is at least in partial contact with the material to be clamped (2320), the bottom surface of the material to be clamped (2320) that is in contact with the ESC electrode (2340) must be electrically insulating.

Typical ESCs known in the art consist of mainly dipole or monopole electrode configurations, but other multi-pole configurations are possible. The electrode configuration can be chosen according to the application. In the case of clamping insulators, multipolar clamping electrode configurations are typical; however, the dipole or multi-pole electrode configurations can lead to charge separation on the bottom surface of the work piece. This charge separation on the surface can lead to strong residual forces which can make the declamp routine longer and more complicated.

In the present invention, the ESC is optimized for clamping and declamping of electrically insulating materials, where the work piece surface in contact with the ESC's top surface consists of an electrical insulator. A monopole type ESC is used in order to facilitate the declamp routine. In the case of a monopole ESC, no lateral charge separation occurs on the bottom surface; instead, the bottom surface is mostly uniformly charged. Since the bottom surface of the work piece has a mostly uniform charge distribution, the residual force will also be mostly uniform. This mostly uniform residual clamping force can be easily canceled. Typically, a routine is employed to cancel the residual clamping force and declamp the work piece. In one routine, the applied clamping voltage can be manipulated by setting said voltage to the plasma induced self-bias. In some cases the clamping voltage can be set to 0 V or an optimized set point of opposite polarity to the clamping voltage polarity that was used to clamp the work piece. The declamp routines are typically executed after the work piece has been processed.

FIG. 8 shows a filler ring (700) that extends from the outer diameter of the ESC (310) to the lifting mechanism (680). This filler ring (700) is used to prevent the back surface of any exposed tape (300) from being contacted by the plasma. Although a separate filler ring (700) is shown, an extension of the ESC (670) would also prevent plasma exposure to the backside of the tape (300). The filler ring (700) can be made of a dielectric material, such as a ceramic (e.g., Aluminum Oxide) or a plastic material, (e.g., polytetrafluoroethylene (PTFE, Teflon)) selected for both its low thermal conductivity and its low electrical conductivity. Although it is preferred to not directly expose the unclamped tape to plasma, some indirect exposure can be tolerated.

Figure 23:
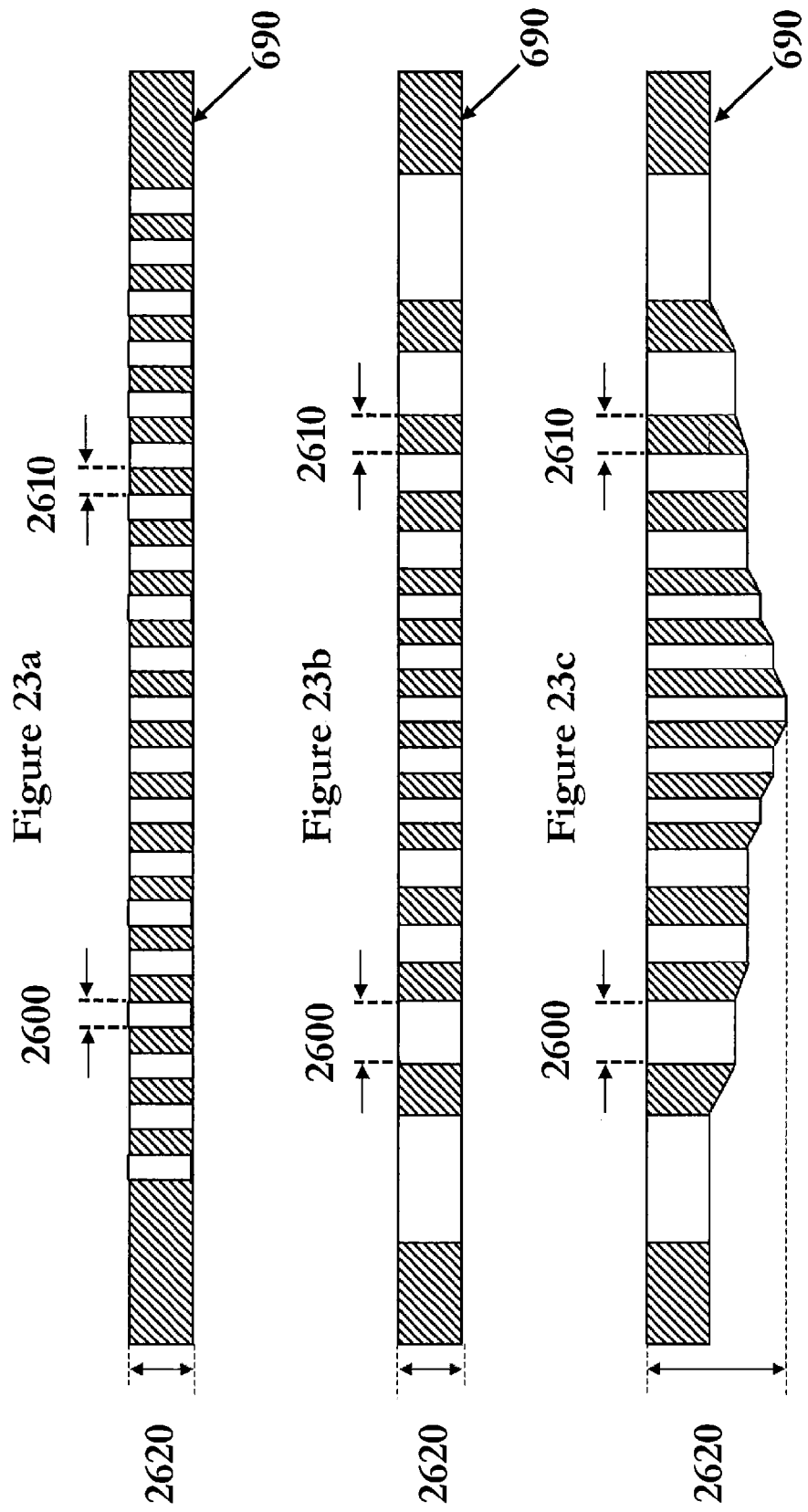
FIGS. 23a-23c are cross sectional views of variations of mechanical partitions according to the present invention.
Figure 24:
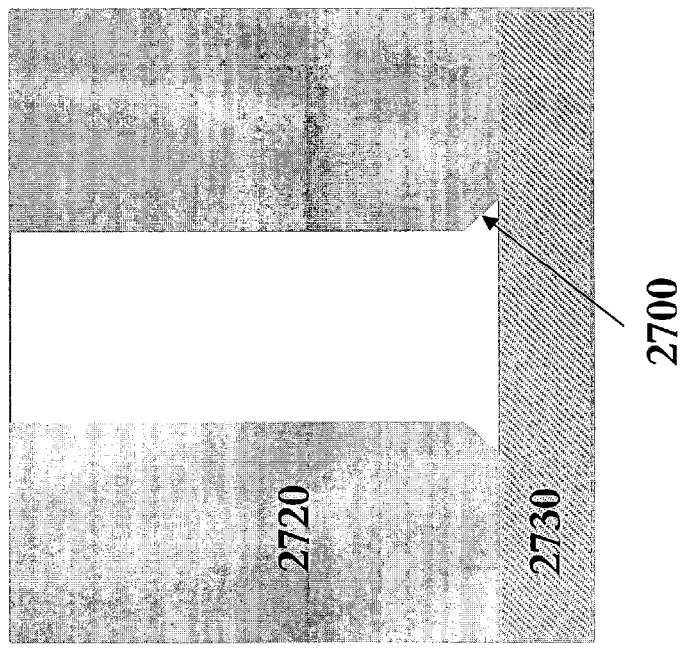
FIG. 24 is a cross sectional view of etched features according to one embodiment of the present invention.

Typically during plasma processing, it is desirable to decouple the ion energy and ion flux to achieve certain etch characteristics. By employing a powered work piece support and a high density source, such as an ICP, mostly independent control of ion energy and flux can be achieved. The work piece support can be powered (e.g., biased) by a DC or AC power source. The AC bias frequency can range from a few kHz to hundreds of MHz. Low frequency typically refers to those bias frequencies at or below the ion plasma frequency and high bias frequency refers to frequencies above the ion plasma frequency. The ion plasma frequency is understood to depend on the atomic number of the ion, thus the ion plasma frequency will be affected by the plasma chemistry. Such chemistries can be Cl, HBr, I or F containing. In the case of $SF_6$ containing plasmas, the ion plasma frequency is about 4 MHz. As shown in FIG. 23, when etching a substrate down to an interface, defined by the contact of two materials (e.g., 2720 and 2730 in FIG. 23) of different relative dielectric constants (e.g., silicon on insulator, SOI structures), problems with the etch associated with charging at the interface, are well known. Such problems can be electrical or physical and are commonly known as notching (e.g., see 2700 in FIG. 23), trenching, feature profile degradation. Interface examples where these problems typically occur are Silicon-on-Insulator (SOI), semiconductor substrate mounted on insulating carriers, semiconductor wafers (e.g., GaAs, Si) mounted on tape, and substrates containing at least one electrically insulating layer. These problems are undesirable for device yield and performance. For example, when etching silicon using a time division multiplexed (e.g., TDM, DRIE or Bosch) process stopping on an insulator (e.g., $SiO_2$) it is known in the art that undercut (or notching) will occur at the silicon/insulator interface. As is well known in the art, such charging problems can be reduced by operating at low RF bias frequencies (below the ion plasma frequency) and additionally pulsing or modulating the RF bias power, as explained in U.S. Pat. No. 6,187,685. Note that the '685 patent teaches away from the use of RF bias frequencies greater than the ion plasma frequency (approximately 4 MHz) for etching silicon with an insulating etch stop.

The present invention allows etching of these structures (e.g., SOI) using an RF bias frequency greater than the ion plasma frequency (e.g., greater than approximately 4 MHz) when the high frequency RF bias is used in conjunction with the mechanical partition (690) between the high density plasma source (620) and the substrate (100). This configuration allows processing (e.g., etching) of the substrate (100) to proceed while still eliminating or reducing damage occurring at the interface (e.g., minimized notching (2700) at a silicon/exposed insulator interface). Preferably the RF bias frequency is 13.56 MHz (ISM band).

In one embodiment of the invention, the mechanical partition (690) is used in conjunction with a high frequency RF bias that is pulsed at some point during the process. The RF bias may be pulsed during the entire process. The pulsed RF bias can have at least two power levels in the pulse train—a high value and a low value. The pulsed RF bias may have more than two RF bias power levels. The low value may be zero (no RF bias power). The pulsed RF bias levels can be changed continuously, discretely, or both. The RF bias frequency can also be greater than approximately 6 MHz up to approximately 160 MHz.

Equipment manufacturers have had to create unique configurations of their etch systems to support applications, such as but not limited to low damage plasma etching and SOI applications, which cannot be typically used for other processes without added expense of multiple power sources and/or matching networks, and sometimes electrostatic chucks. Power sources at a frequency of 13.56 MHz are common in the industry due their availability and low cost. The invention makes possible the use of such power supplies to be used for the applications cited above eliminating the need for added hardware and/or elaborate hardware configurations.

Since RF coupling at such low frequency is not efficient through a thick dielectric material, the RF coupling to the substrate (100) can be via the one or more ESC clamping electrodes (2010), for example via a coupling capacitor rather than via the RF powered work piece support (630). To maintain uniform RF coupling to the substrate (100), the ESC electrode or electrodes should also be uniformly disposed behind the substrate (100). This is difficult to achieve if multiple electrodes are used, since the necessary gaps between the electrodes result in a local variation in the RF coupling which adversely affects the quality of the etch, particularly the undercutting at the substrate/tape interface. A preferred embodiment of the ESC design therefore incorporates a so called monopolar design, in which a single electrode is used to provide the clamping force.

The substrate can be processed using techniques well known in the semiconductor industry. Silicon substrates are generally processed using a Fluorine-based chemistry, such as $SF_6$. $SF_6/O_2$ chemistry is commonly used to etch Silicon because of its high rate and anisotropic profile. A disadvantage of this chemistry is its relatively low selectivity to masking material for example to photoresist which is 15-20:1. Alternatively, a Timed Division Multiplex (TDM) process can be used which alternates between deposition and etching to produce highly anisotropic deep profiles. For example, an alternating process to etch Silicon uses a $C_4F_8$ step to deposit polymer on all exposed surfaces of the Silicon substrate (i.e., mask surface, etch sidewalls and etch floor) and then an $SF_6$ step is used to selectively remove the polymer from the etch floor and then isotropically etch a small amount of silicon. The steps repeat until terminated. Such a TDM process can produce anisotropic features deep into Silicon with selectivities to the masking layer of greater than 200:1. This then makes a TDM process the desired approach for plasma separation of Silicon substrates. Note that the invention is not limited to the use of fluorine containing chemistries or a time division multiplex (TDM) process. For example, silicon substrates may also be etched with Cl, HBr or I containing chemistries as is known in the art.

For III-V substrates such as GaAs, a Chlorine based chemistry is extensively used in the semiconductor industry. In the fabrication of RF-wireless devices, thinned GaAs substrates are mounted with the device side down onto a carrier, where they are then thinned and patterned with photoresist. The GaAs is etched away to expose electrical contacts to the front side circuitry. This well-known process can also be used to separate the devices by the front side processing described in the above mentioned invention. Other semiconductor substrates and appropriate plasma processes can also be used for the separation of die in the above mentioned invention.

Many processes require an ion flux at the substrate (100) surface in order achieve desired process results (e.g., GaAs etch, GaN etch, $SiO_2$ etch, SiC etch, quartz etch, etc.) For the case where the substrate (100) is part of a work piece (320), the ion flux and/or ion energy required to process the substrate (100) can often be high enough to damage portions of the work piece (e.g., the flexible membrane (300)) or enable undesirable side reactions—making it important to protect portions of the work piece from the plasma. In contrast, in order to improve the process results (e.g., uniformity, electrostatic clamping performance, etc.), it can be desirable to provide some portion of the work piece that lies outside the perimeter of the substrate with contact to the plasma—though at a lower ion flux and/or ion energy than experienced by the substrate (100). What is needed is means to adjust the exposure of different portions of the work piece (320) to different plasma ion fluxes and/or ion energies.

Figure 28:
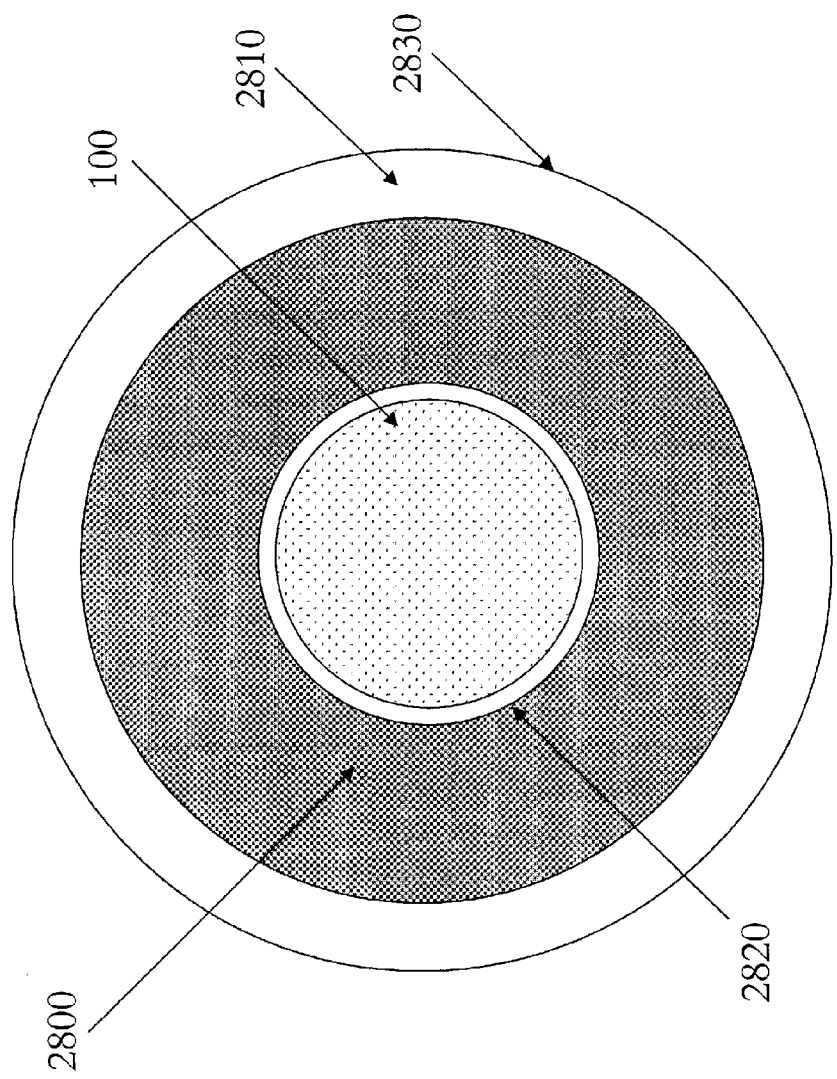
FIG. 28 is a top down view of a cover ring according to the present invention.
Figure 29:
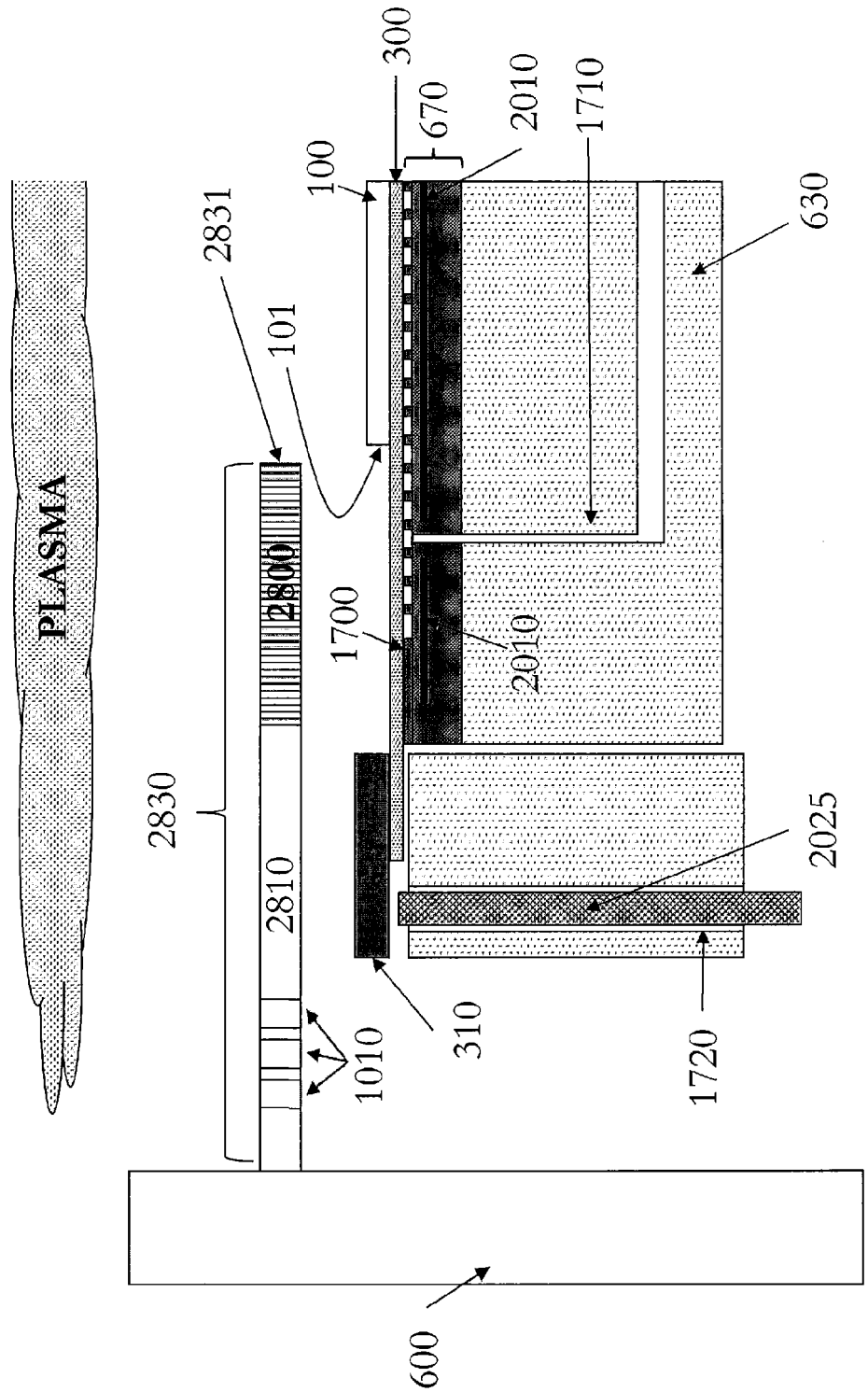
FIG. 29 is a cross section of a cover ring and ESC according to the present invention.

As shown in FIG. 28, another embodiment of the invention is a modified cover ring (2830) that contains at least one perforated region (2800) that allows a path from the plasma to the work piece where the work piece is overlapped by the perforated region (2800). The perforated region (2800) can overlap the flexible membrane (300). The perforated region (2800) can overlap the frame (310). The perforated region (2800) can extend beyond the work piece (320). The perforated region (2800) can attenuate the ion flux from the plasma to a portion of the overlapped area of the work piece (e.g., the area of the work piece overlapped by the perforated region (2800) and outside the perimeter of the substrate) by at least 10%. In a preferred embodiment the perforated region (2800) can attenuate ion flux from the plasma to a portion of the work piece overlapped by the perforated region (2800) by at least 30%. It is preferred that the perforated region (2800) does not overlap the substrate (100). In one embodiment, as shown in FIG. 29, the modified cover ring (2830) and substrate (100) are located in different planes (e.g., non-coplanar). Therefore the inner periphery of the cover ring (2831) is not adjacent to the outer periphery (101) of the substrate.

The modified cover ring (2830) typically contains a cover ring opening (2820) where the substrate (100) is not overlapped by the modified cover ring (2830). The cover ring opening (2820) can range from greater than approximately 0.1 mm to less than approximately 20 mm larger than the substrate diameter, with a preferred value between 1 mm and 4 mm. Preferably the cover ring opening (2820) is 2 mm larger than the substrate (100) diameter. It is preferred that the plasma ion density at the substrate (100) surface is greater than the plasma ion density at the work piece (320) surface where it is overlapped by the modified cover ring (2830).

In some cases it can be desirable to have plasma present in the region between some portion of the perforated region (2800) of the modified cover ring (2830) and the work piece that is overlapped by the perforated region (2800) of the modified cover ring (2830). (e.g., it can be desirable to allow plasma underneath the modified cover ring (2830) when using a monopolar ESC to clamp the work piece in some portion of the area overlapped by the modified cover ring (2830). In one embodiment, in order to allow plasma to penetrate the volume between the modified cover ring (2830) and the work piece (320), the distance between the bottom surface of the perforated region of the cover ring and the top surface of the work piece (320) can be between 1 mm and 5 cm.

The modified cover ring (2830) can contain at least one region (2810) that is non-perforated. The non-perforated region (2810) of the modified cover ring (2830) can prevent the plasma from contacting the work piece where the non-perforated region (2810) overlaps the work piece (320). It is preferred that the plasma ion density at the work piece (320) surface is greater where it is overlapped by a perforated region (2800) is greater than the plasma ion density at the work piece (320) surface where it is overlapped by a non-perforated region (2810). It is also preferred that the plasma density at the work piece (320) surface at the substrate (100) is greater than the plasma density at the work piece surface overlapped by the perforated region(s) (2800) of the modified cover ring (2830) which in turn is greater than the plasma density at the work piece (320) surface overlapped by the non-perforated region(s) (2810) of the modified cover ring (2830). The plasma density under the non-perforated region of the modified cover ring (2830) can be zero.

FIG. 29 shows a cross sectional view of a modified cover ring (2830) with a perforated region (2800). The modified cover ring (2830) can contain pumping ports (1010) to improve the system conductance. It is preferred that the pumping ports (1010) are located outside the perimeter of the work piece (320). The pumping ports can be located in the perforated region (2800) of the modified cover ring (2830), the non-perforated region (2810), or both. It is preferred that the pumping ports (1010) do not overlap the work piece (320).

In a preferred embodiment, the perforated region (2800) of the modified cover ring (2830) overlaps a portion of the work piece (320) that is overlapped by an ESC clamping electrode (2010). The perforated region (2800) of the modified cover ring (2830) can overlap all areas of the work piece (320) that are not overlapped by the substrate but are overlapped by an ESC clamping electrode (2010). All of the perforated region (2800) can be overlapped by an ESC clamping electrode (2010). It is also preferred that the perforated region (2800) of the modified cover ring (2830) does not overlap portions of the work piece (320) that are not in thermal contact with the work piece support (630) (e.g., the perforated region (2800) of the modified cover ring (2830) does not overlap portions of the work piece (320) that are not clamped by the electrostatic chuck (670), perforated region (2800) of the modified cover ring (2830) does not overlap portions of the work piece (320) outside the outermost ESC seal band (1700)).

The perforations in the perforated region (2800) can be any size and shape. The perforation sizes and shapes can be variable or uniform within or between perforated region(s) (2800). The spacing of the perforations can be uniformly or variably distributed within or between perforated region(s) (2800).

While the modified cover ring (2830) shown in FIG. 29 is illustrated with a constant thickness—the cover ring thickness can vary within the ring (e.g., thickness variation as a function of radius or thickness variation across the ring). The thickness of a perforated region (2800) can be different from the thickness of a non-perforated region (2810). The thickness of a perforated region (2800) can be thinner than the thickness of a non-perforated region (2810).

Figure 30:
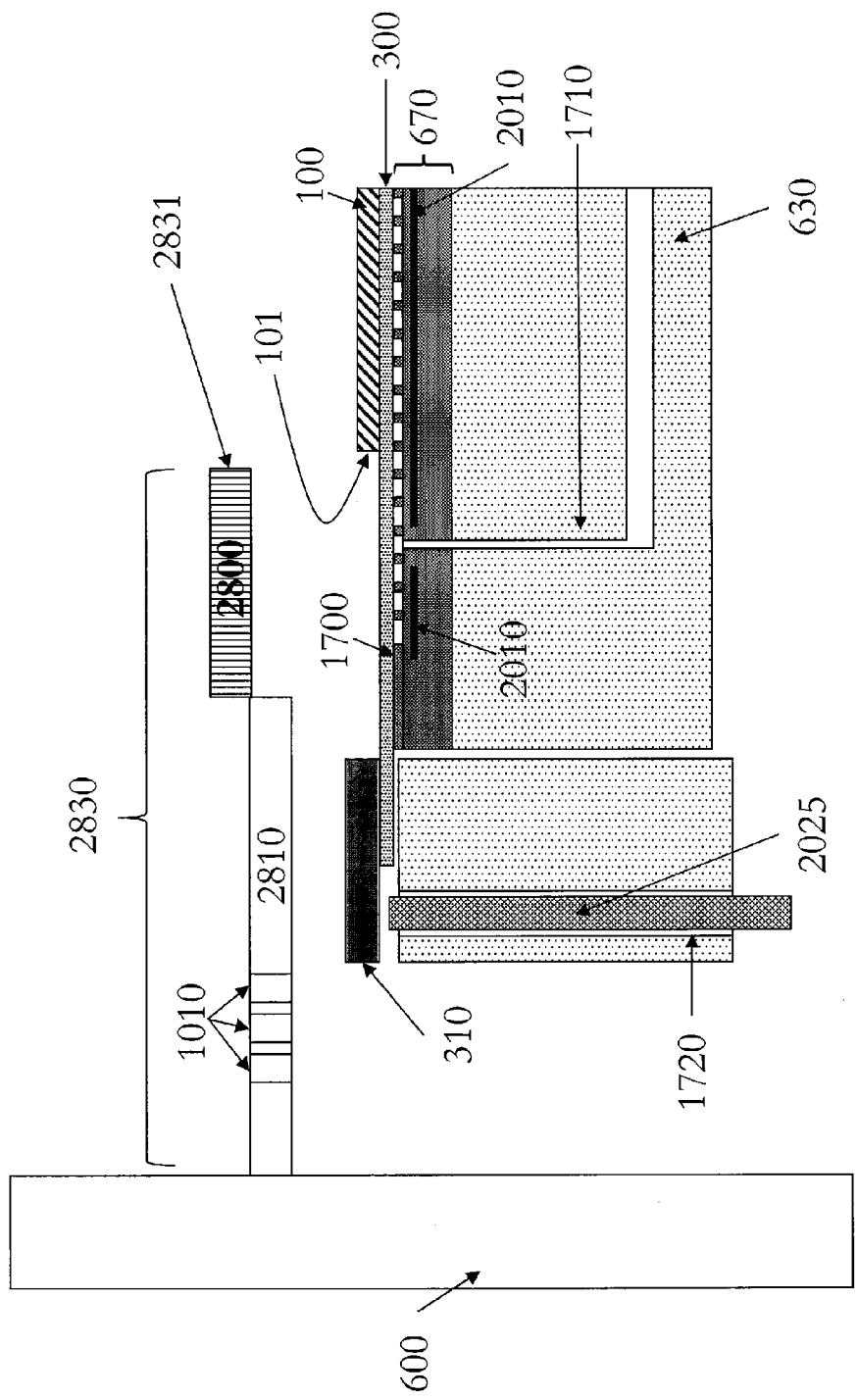
FIG. 30 is a cross section of a cover ring and ESC according to the present invention.

FIG. 30 shows another embodiment of the invention. This embodiment includes the elements described and illustrated in FIG. 29. Additionally, in this embodiment, a perforated region (2800) of the modified cover ring (2830) is not coplanar with a non-perforated region (2810) of the modified cover ring (2830). In a preferred embodiment, the distance between a perforated region (2800) and the work piece (320) is great then a distance between the non-perforated region (2810) and the work piece (320). The cover ring (2830) can be comprised of two or more pieces.

Figure 40:
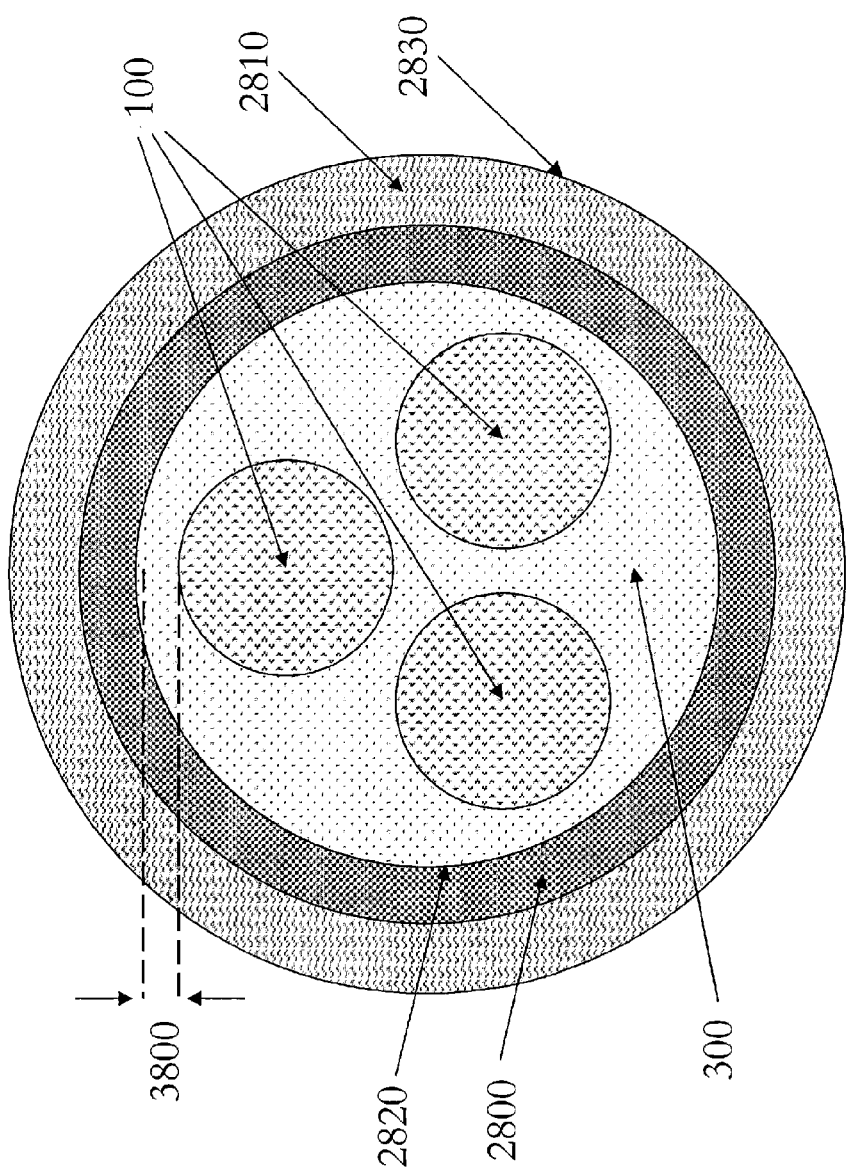
FIG. 40 is a top down view of a cover ring according to the present invention.

In another embodiment of the invention, shown in FIG. 40, a modified cover ring (2830) is configured for a work piece (320) that contains two or more substrates (100). The modified cover ring (2830) contains at least one perforated region (2800). The modified cover ring (2830) can contain a non-perforated region (2810). The substrates (100) can be different sizes and/or shapes. A substrate (100) can be a piece of a larger substrate (100). The substrates (100) can contain different materials. It is preferred that the substrates are processed with similar chemistries (e.g., Silicon and Germanium both etch in Fluorine containing chemistries). The modified cover ring (2830) contains at least one opening (2820) that exposes more than one substrate (100) to a plasma. It is preferred that the modified cover ring (2830) does not overlap a substrate (100). In a preferred embodiment, the distance (3800) from the modified cover ring opening (2820) to a substrate (100) perimeter is at least 0.1 mm. It is further preferred that the distance (3800) from the modified cover ring opening (2820) to any substrate (100) perimeter is at least 0.1 mm. The distance (3800) can between a modified cover ring opening (2820) and a substrate (100) perimeter can be greater than 1 mm. The modified cover ring (2830) can be in a different plane than at least one substrate (100). The modified cover ring (2830) can be in a different plane than all the substrates (100). It is preferred that the modified cover ring (2830) is not in contact with the work piece (320). While the modified cover ring (2830) described in this embodiment is configured for multiple substrates, it can contain features described in other embodiments of the cover ring described herein.

Figure 41:
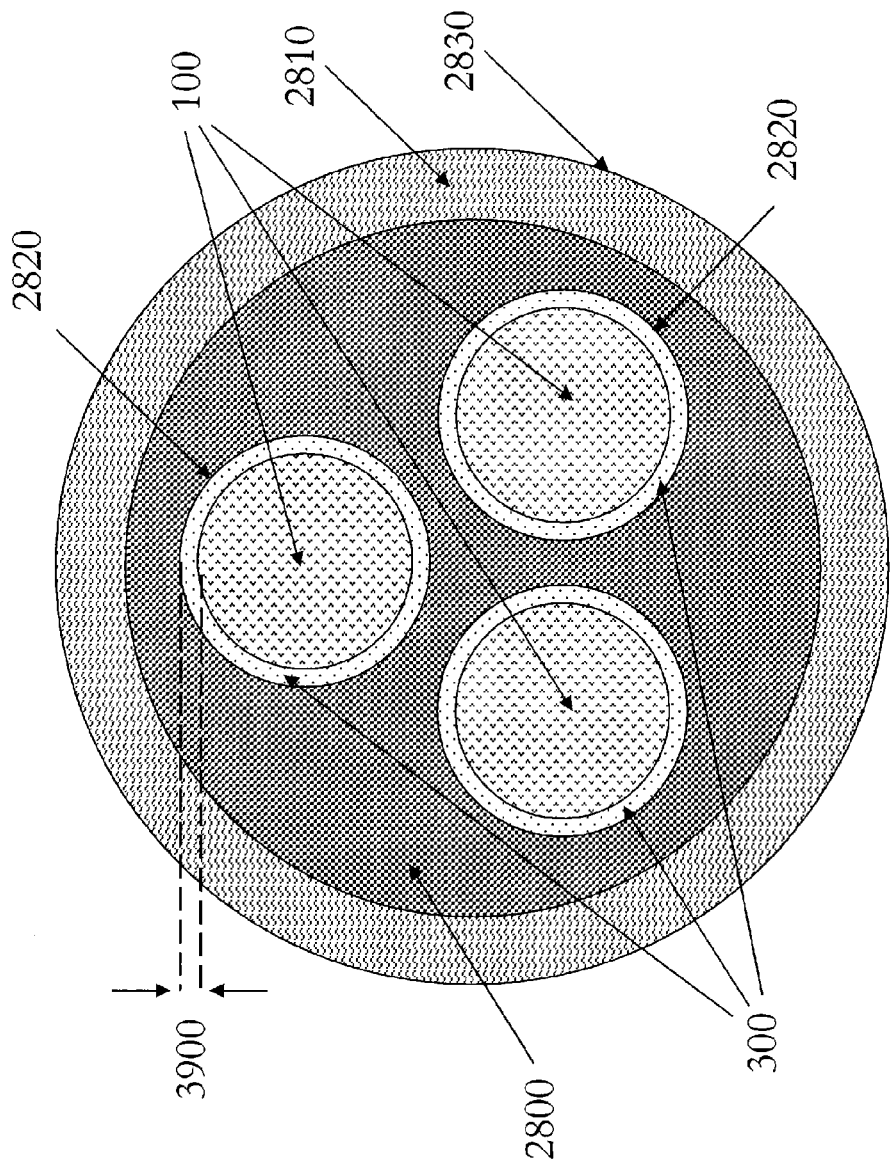
FIG. 41 is a top down view of a cover ring according to the present invention.

In yet another embodiment of the invention, shown in FIG. 41, a modified cover ring (2830) is configured for a work piece (320) that contains two or more substrates (100). The modified cover ring (2830) contains at least one perforated region (2800). The modified cover ring can contain a non-perforated region (2810). The substrates (100) can be different sizes and/or shapes. A substrate (100) can be a piece of a larger substrate (100). The substrates (100) can contain different materials. It is preferred that the substrates are processed with similar chemistries (e.g., Silicon and Germanium both etch in Fluorine containing chemistries). The modified cover ring (2830) contains at least two openings (2820) that allow plasma to contact at least one substrate (100). In a preferred embodiment, each modified cover ring opening (2820) exposes one substrate (100) to a plasma. The modified cover ring openings (2820) can be different sizes and shapes. It is preferred that a modified cover ring (2830) does not overlap a substrate (100). In a preferred embodiment, the distance (3900) from a modified cover ring opening (2820) to a substrate (100) perimeter contained within that opening is at least 0.1 mm. It is further preferred that the distance (3900) from a cover ring opening (2820) to any substrate (100) perimeter contained within that opening is at least 0.1 mm. The distance (3900) between a modified cover ring opening (2820) and a substrate (100) perimeter can be greater than 1 mm. The modified cover ring (2830) can be in a different plane than at least one substrate (100). The modified cover ring (2830) can be in a different plane than all the substrates (100). It is preferred that the modified cover ring (2830) is not in contact with the work piece (320). While the modified cover ring (2830) described in this embodiment is configured for multiple substrates, it can contain features described in other embodiments of the cover ring herein.

To further reduce the problems associated with charging at the substrate/tape interface, the process can be changed at the point at which the interface is exposed to a second process which has less tendency to undercut and is typically a lower etch rate process. The point in time at which the change takes place depends upon the substrate thickness, which is likely to vary. To compensate for this variability, the time at which the substrate/tape interface is reached is detected using an endpoint technique. Optical techniques which monitor the plasma emission are commonly used to detect endpoint and U.S. Pat. Nos. 6,982,175 and 7,101,805 describe such an endpoint technique which is appropriate to a TDM process.

Figure 31:
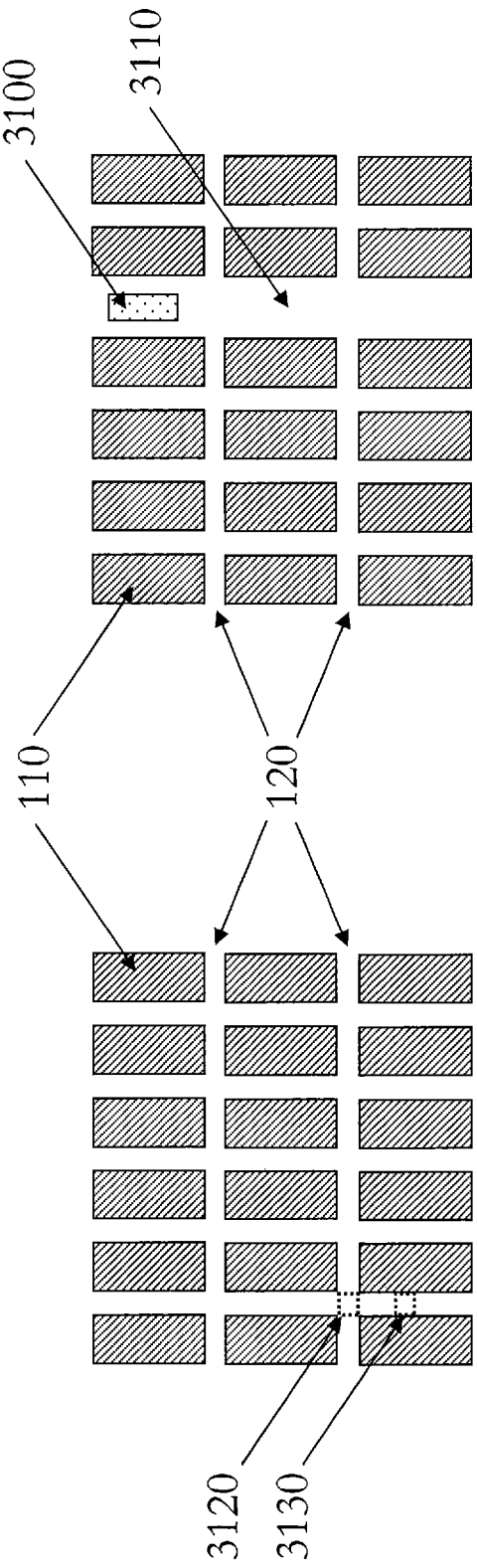
FIG. 31a is a top view of a group of individual devices according to the prior art.
FIG. 31b is a top view of a group of individual devices and a process control monitor according to the prior art.

FIG. 31 illustrates issues that can arise during a die singulation process using plasma processing. FIG. 31a shows a typical pattern of die (110) on a wafer (not shown) separated by street regions (120). The plasma dicing process typically follows a chemically assisted etch mechanism, where the etch rate of the exposed materials is in part a function of the concentration of available reactants. For the case of Silicon in a Fluorine-containing plasma (e.g., $SF_6$ plasma), the etch rate is typically a function of free Fluorine (e.g., $SF_6$ partial pressure, $SF_6$ mass flow rate, etc.). In a process following a chemically-assisted etch mechanism, two regions of identical area (3120, 3130) can etch at different rates due to their local environment (e.g., aspect ratio). Aspect ratio can be defined as a feature's depth divided by its smallest lateral dimension (length or width). Higher aspect ratio features typically etch slower—particularly for chemically driven processes. For example, while etch regions 3120 and region 3130 are the same area, the street intersection region (3120) will have a lower effective aspect ratio and typically etch faster than street region (3130). This faster etch rate can result in undesirable feature profiles and/or can damage the underlying tape (e.g., damage tape stretchability).

Figure 32:
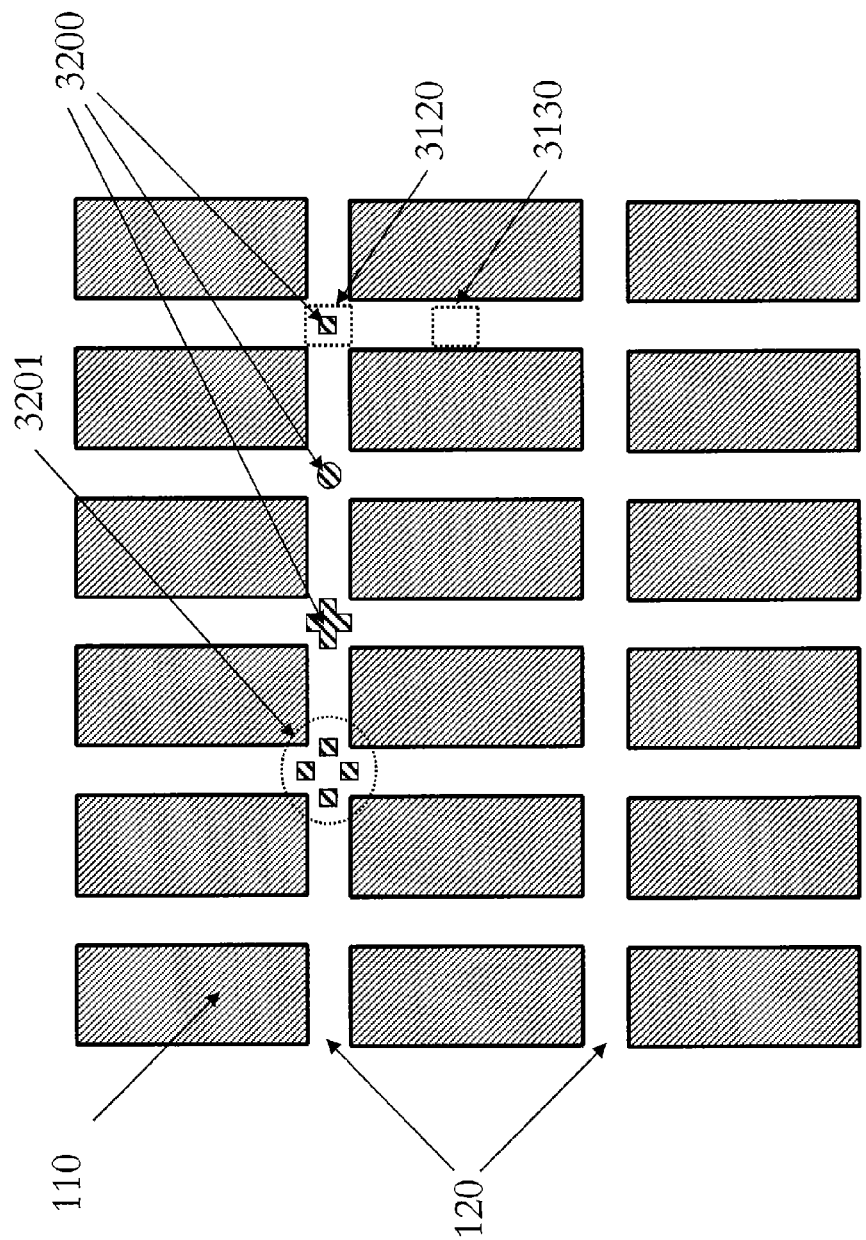
FIG. 32 is a top view of a group of individual devices according to the present invention.

FIG. 32 shows yet another embodiment of the invention. By adding masked etch assist features (3200) that protect portions of the street intersection region (3120) from etching, the effective aspect ratio of the street intersection regions (3120) can be increased—decreasing the local etch rate in the street intersection region (3210) to a value similar to the surrounding street regions (3130). The etch assist features (3200) can be patterned using methods known in the art, using any mask material that has a suitable etch resistance (e.g., polymers—including polyimides and photoresists; dielectrics—including $SiO_2$, SiN, $Al_2O_3$, AlN; carbon containing materials—including carbon and diamond like carbon (DLC); and metals—including Al, Cr, Ni, etc.). The mask material of an etch assist feature (3200) can be the same material used to mask the die (110) during the plasma dicing process. When more than one etch assist feature (3200) is present, the etch assist features (3200) can be patterned using more than one masking material. A single etch assist feature (3200) can be patterned using more than one mask material within the etch assist feature (3200). It is preferred that the etch selectivity of the etch assist feature (3200) mask material to the street material to be removed is at least 10:1. It is further preferred that the etch resistance is of the mask material is greater than 50:1. It is preferred that etch assist features (3200) are separated from the die (110) after the plasma dicing process. It is desirable for the etch assist features (3200) to remain intact during plasma dicing and/or downstream operations (e.g., etch assist features do not break or contact a die (110)). It is preferred that the etch assist features (3200) remain adhered to the tape (300) during the plasma dicing process. It is preferred that a singluated etch assist feature (3200) does not contact a die (110).

Etch assist features (3200) can be patterned into a wide array of shapes including polygons, squares, rectangles, and/or quadrilaterals. The etch assist features (3200) can contain curves or rounded features. The etch assist features (3200) can be circular or oval. The etch assist features (3200) can be composed of more than one smaller feature (see etch assist feature group (3201) for example).

In order to cleanly separate the die (110) during the singulation process, it is preferred that an etch assist feature (3200) is not connected to a die (110). In a preferred embodiment, none of the etch assist features (3200) are connected to a die (110).

The etch assist features (3200) can be connected to one another. The etch assist features (3200) can be uniform or variable size and shape across the wafer. For the case where the die (110) or streets (120) vary across a wafer, it is preferred that the etch assist feature (3200) size and/or shape also varies across the wafer. While FIG. 32 illustrates the invention in use with rectangular die (110), the invention can be beneficially applied to die of different shapes including die with rounded corners.

FIG. 31b shows a prior art pattern of die (110) that contains a process control monitor (PCM) structure (3100). PCM structures (3100) can be used to check the quality of the devices during the device fabrication process. PCM structures (3100) are typically not yieldable die and consume substrate real estate that might otherwise be available for useful die. Since PCM structures (3100) are typically not incorporated into final product die, PCM structures (3100) are typically located in the dicing street regions (120) of the wafer. The number and size of the PCM structures (3100) is typically a function of the chip design and fabrication processes. In the prior art, in order to keep the PCM structures (3100) separate from the useful die (110), it is often necessary to increase the width of the PCM street (3110) around the PCM structures (3100). These wider PCM street regions (3110) can be undesirable for two reasons: firstly, street regions of different widths can etch at different rates (e.g., wider streets etch faster) potentially causing undesirable variability in die sidewall; and secondly, wider street regions (110) represent wasted area of the substrate that potentially can be used to fabricate additional devices (110).

Figure 33:
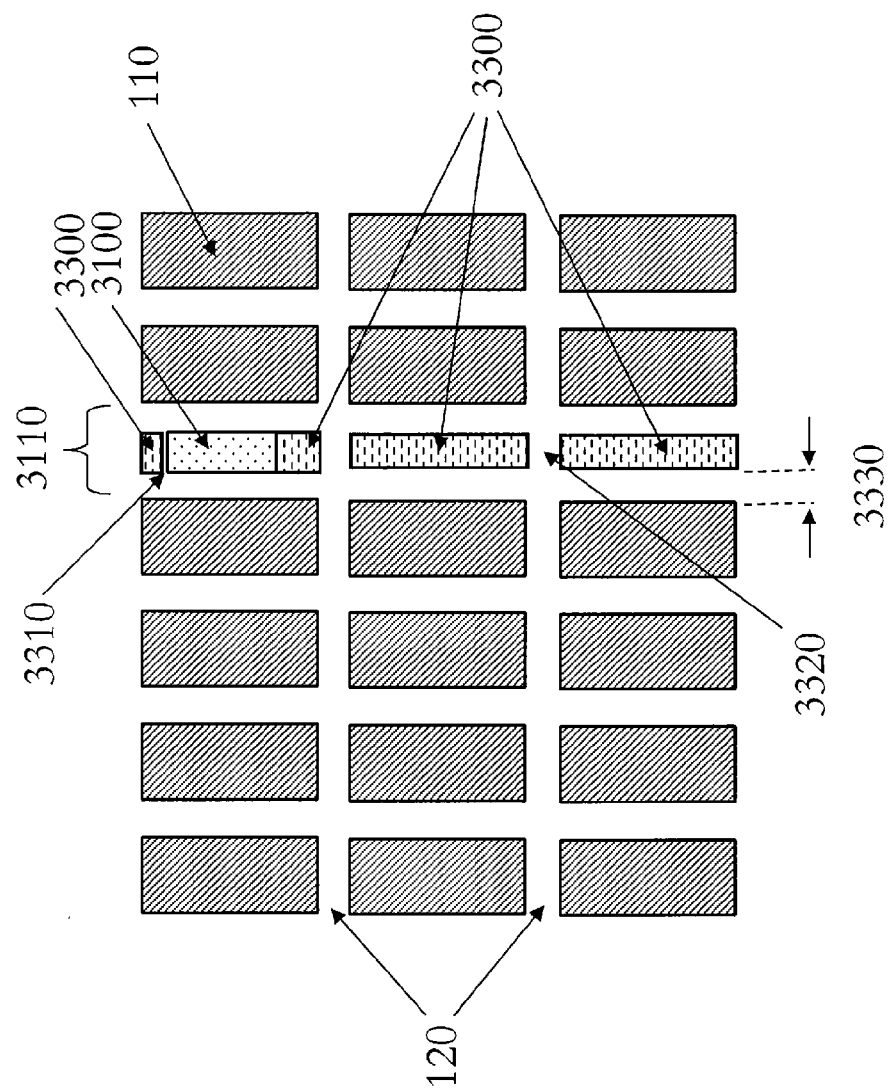
FIG. 33 is a top view of a group of individual devices and a process control monitor according to the present invention.

FIG. 33 shows yet another embodiment of the invention to present a more uniform pattern load to the plasma. In this embodiment, PCM assist features (3300) are added to a PCM street region (3110) to reduce the area of exposed substrate in a PCM street region (3110). By reducing the exposed substrate area, PCM assist features (3300) can reduce the etch rate of the exposed substrate locally near a PCM assist feature (3300) to an etch rate similar to the etch rate in a street (120) between two die (110). In a preferred embodiment, the width (3330) of exposed (e.g., unmasked) material between a die (110) and a PCM assist feature (3300) is similar to the width of a street region (120). A PCM assist feature (3300) can be connected to/or touch the PCM structure (3100). A PCM assist feature (3300) can be separated from a PCM structure (3100) by a gap (3310). The gap (3310) between a PCM assist feature (3300) and a PCM structure (3100) can be less than or equal to a street (120) width.

If a PCM assist feature (3300) was patterned to be substantially continuous across a substrate, the continuous PCM assist feature could potentially inhibit the uniform stretching of the tape (300) after plasma dicing—adversely affecting downstream operations. In one embodiment, an area of a PCM street (3110) that is to be protected from etching is protected by more than one PCM assist feature (3300). It is preferred that a PCM assist features (3300) be separated from adjacent die (110) after plasma dicing. The PCM assist features (3300) can be separated from one another after the plasma dicing process. A PCM assist feature (3300) can be separated from another PCM assist feature (3300) by a tape stretch gap (3320). It is preferred that at least one PCM assist feature (3300) is separated at a tape stretch gap (3320) during the plasma dicing process (e.g., the substrate material between at least one pair of adjacent PCM assist features (3300) is removed to expose an underlying layer. This underlying layer can be the work piece tape (300) or a thin film or film stack on the back of the substrate—the thin film can be a wafer back metal layer as is known in the art. This tape stretch gap allows for more uniform stretching of the dicing tape (300) during downstream pick and place operations. It is preferred that the width of the tape stretch gap (3320) is similar to the street (120) width (e.g., tape stretch gap in the range of approximately 5 to 30 microns in width). The PCM assist features (3300) can have one lateral dimension approximately the same as a die (110) dimension (e.g., die length or width).

The PCM assist features (3300) can be patterned using methods known in the art, using any mask material that has a suitable etch resistance (e.g., polymers—including polyimides and photoresists, dielectrics—including $SiO_2$, SiN, $Al_2O_3$, AlN, carbon-containing materials—including carbon and diamond like carbon (DLC), and metals—including Al, Cr, Ni, etc.). The mask material of the PCM assist feature(s) (3300) can be the same material used to mask the die (110) during the plasma-etch process. It is preferred that the etch selectivity of the PCM assist feature (3300) mask material to the street material to be removed is at least 10:1. It is further preferred that the etch resistance (e.g., etch selectivity) of the mask material to the street material is greater than 50:1. When more than PCM assist feature (3300) is present, the PCM assist features (3300) can be patterned using different one masking materials. A single PCM assist feature (3300) can be patterned using more than one mask material within the PCM assist feature (3300).

Figure 34:
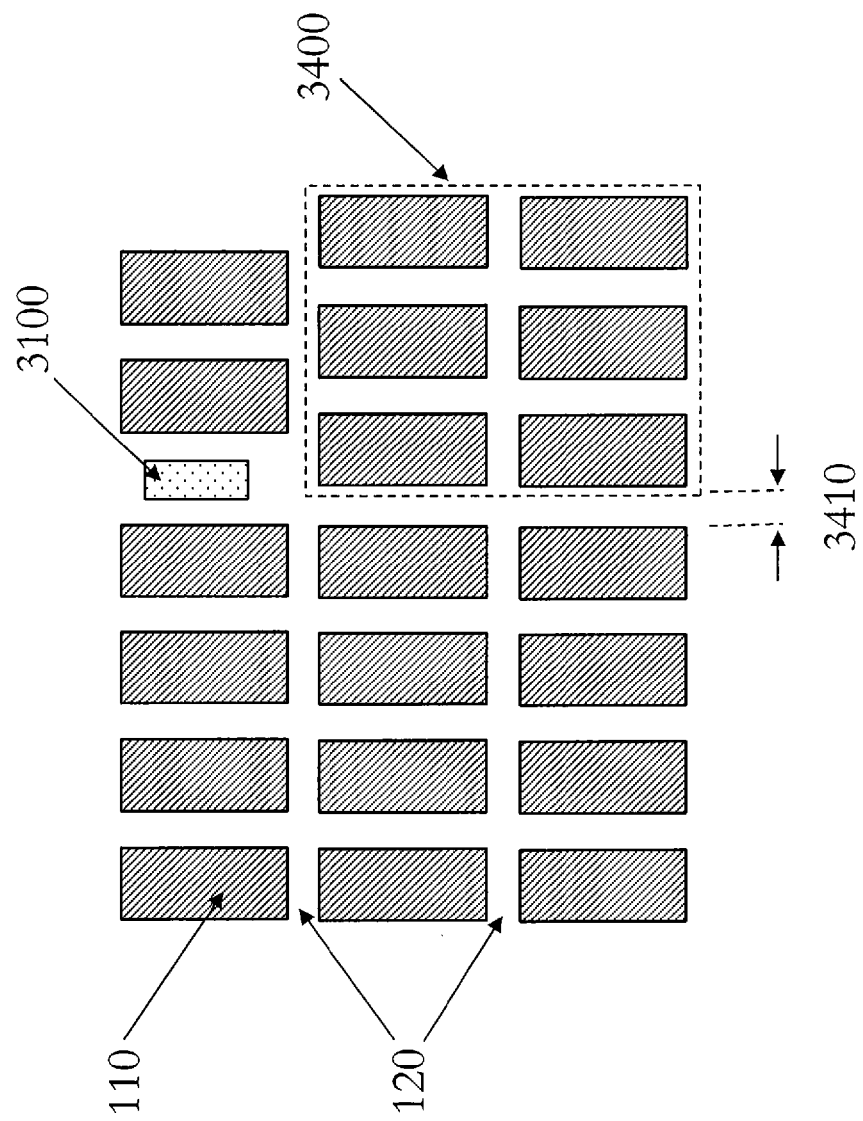
FIG. 34 is a top view of a group of individual devices and a process control monitor according to the present invention.

FIG. 34 shows another embodiment of the invention. Unlike conventional dicing saws, plasma dicing does not require linear street regions (120) between die (110) across the entire substrate. In order to present a more uniform etch load to the plasma, it is preferred to shift groups of die (3400) near the PCM structure (3100) such that the width of the dicing street (3410) near the PCM structure (3100) is similar to the width of a standard dicing street (120) region (e.g., PCM street width (3410) of approximately 5 to 30 microns in width).

Figure 35:
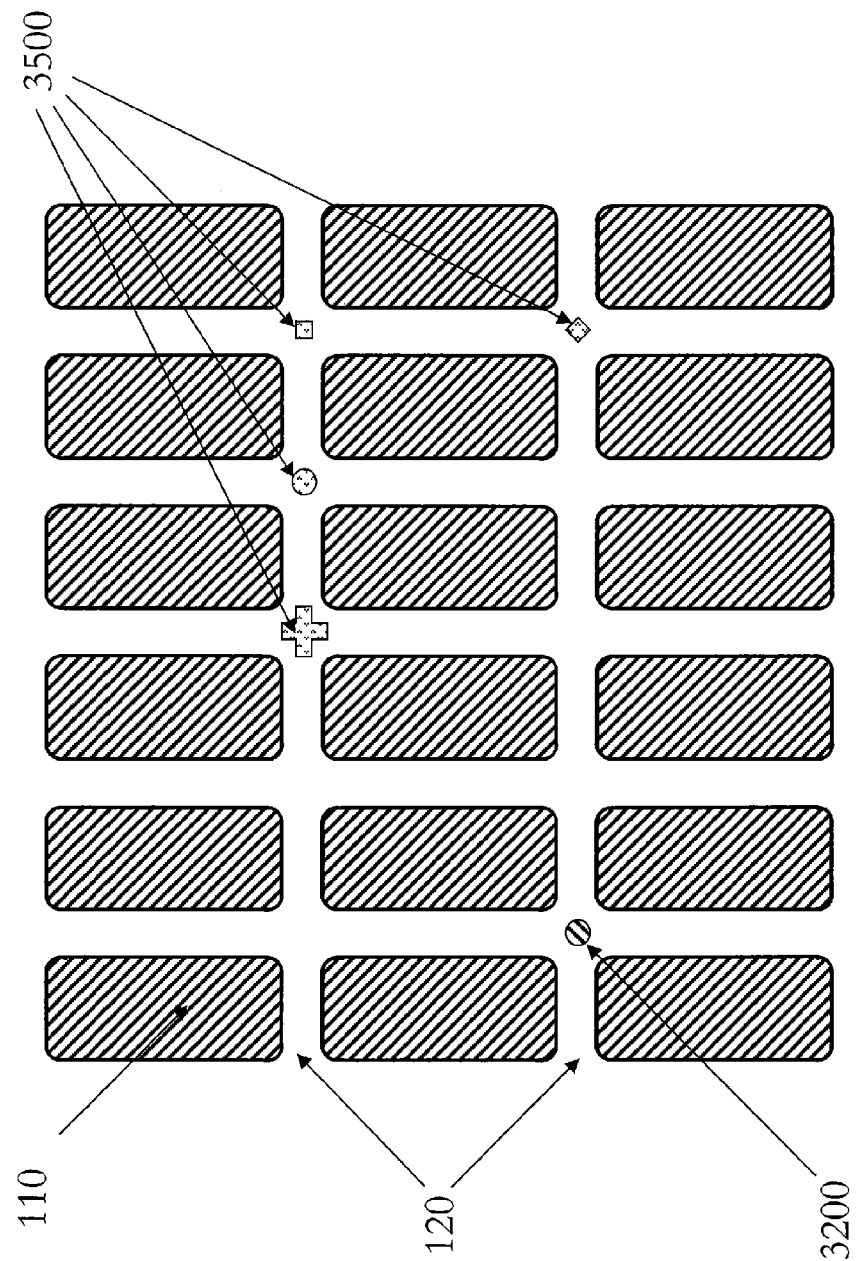
FIG. 35 is a top view of a group of individual devices and process control monitors according to the present invention.

FIG. 35 shows yet another embodiment of the invention. FIG. 35 shows die (110) with rounded corners. These rounded corners create a larger area at the intersection of dicing streets (120) as compared to rectangular die known in the art. In order to make use of this extra exposed area between die (110), modified PCM structures (3500) can be placed within the intersection of dicing streets (120). Modified PCM structures (3500) can have the same functionality as PCM structures (3100) known in the art. These modified PCM structures (3500) can be various sizes and shapes (e.g., rectilinear, rounded or other shapes). The modified PCM structure (3500) can retain test functionality after plasma dicing. It is preferred that the modified PCM structures (3500) are singulated from the die during the plasma dicing process. (e.g., the substrate material between at least one die and a modified PCM structure (3500) is removed to expose an underlying layer. This underlying layer can be the work piece tape (300) or a thin film or film stack on the back of the substrate—the thin film can be a wafer back metal layer as is known in the art). It is preferred that the modified PCM structure (3500) not touch any of the die (110). While FIG. 35 illustrates die with rounded corners, the invention can be beneficially applied to die with any shape perimeter (e.g., rectangular or square die).

Figure 36:
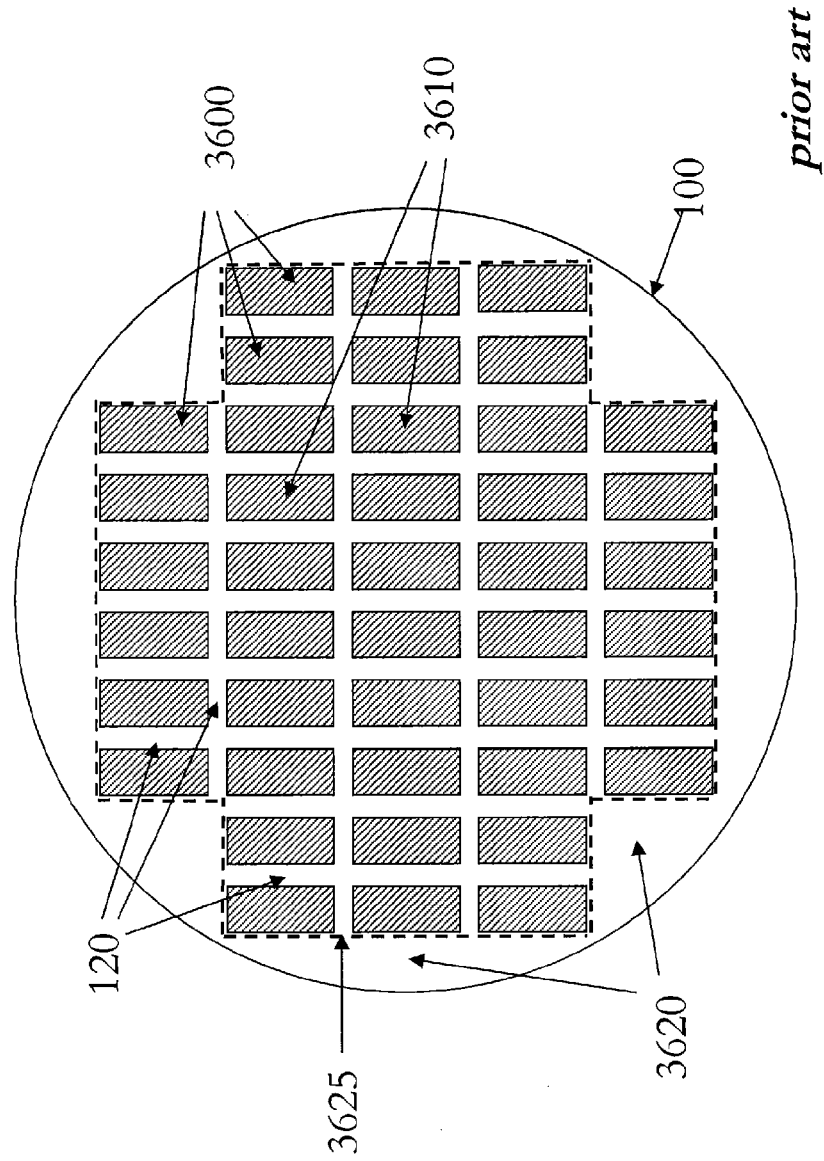
FIG. 36 is a top down view of a semiconductor substrate illustrating individual devices separated by streets according to the prior art.

FIG. 36 illustrates another issue that can arise during a die singulation process using plasma processing. FIG. 36 shows a typical pattern of die (110) on a wafer (100) separated by street regions (120). The plasma dicing process typically follows a chemically assisted etch mechanism, where the local etch rate of the exposed materials can be in part a function of amount nearby exposed material (e.g., etch loading effect). Features near large exposed areas of substrate (100) typically have lower etch rates. In some die pattern layouts there can be an edge region (3620) of exposed wafer between an edge of an outermost die (3600) and the perimeter of the substrate (100) (e.g., the substrate area between the dotted line 3625 and the perimeter of the substrate (100)). During a plasma dicing process an edge region can etch at a significantly different rate than a street region (120). This difference in etch rate between the edge region (3620) and a street region (120) can result in undesirable feature profiles, damage the underlying tape, or longer plasma dicing process time.

Figure 37:
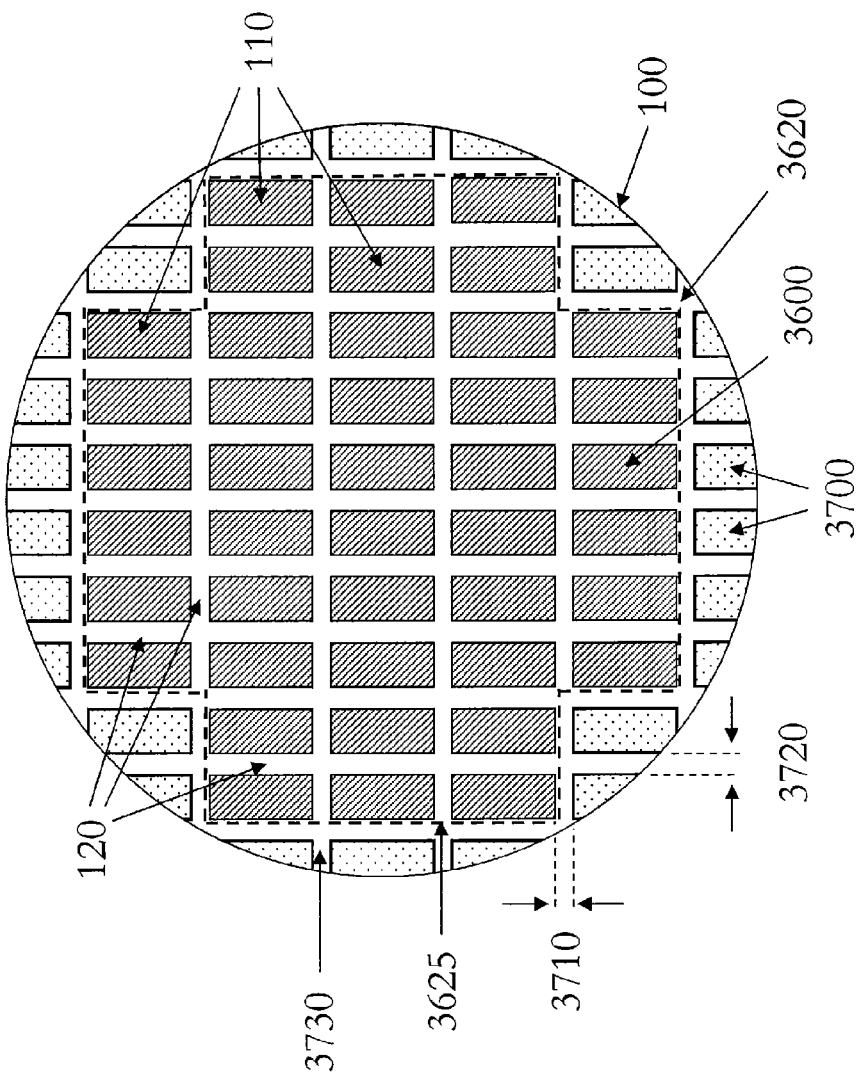
FIG. 37 is a top down view of a semiconductor substrate illustrating individual devices separated by streets according to the present invention.

FIG. 37 shows yet another embodiment of the invention. By adding masked load assist features (3700) that protect portions of the edge region (3620) of the substrate (100) from etching, the effective load (e.g., exposed substrate area) can be reduced—allowing the local etch rate in an exposed area (3730) of an edge region (3620) to attain a value similar to an etch rate in an adjacent street regions (120). The load assist features (3700) can be patterned using methods known in the art, using any mask material that has a suitable etch resistance (e.g., polymers—including polyimides and photoresists; dielectrics—including $SiO_2$, SiN, $Al_2O_3$, AlN; carbon containing materials—including carbon and diamond like carbon (DLC); and metals—including Al, Cr, Ni, etc.). The mask material of a load assist feature (3700) can be the same material used to mask the die (110) during the plasma dicing process. When more than one load assist feature (3700) is present, the load assist features (3700) can be patterned using more than one masking material. A single load assist feature (3700) can be patterned using more than one mask material within the load assist feature (3700). It is preferred that the etch selectivity of the load assist feature (3700) mask material to the exposed material (e.g., substrate) to be removed is at least 10:1. It is further preferred that the etch selectivity of the exposed material to the load assist feature mask material is greater than 50:1.

It is desirable to have a pattern gap (3710) between a die and an adjacent load assist feature. The pattern gap (3710) can be the same width as a street (120). One material in the pattern gap (3710) has been removed during plasma dicing, it is preferred that a load assist feature (3700) be separated from an adjacent die (110) (e.g., the substrate material between at least one die and a load assist feature (3700) is removed to expose an underlying layer. This underlying layer can be the work piece tape (300) or a thin film or film stack on the back of the substrate—the thin film can be a wafer back metal layer as is known in the art). A load assist feature (3700) can be separated from an adjacent load assist feature (3700) after the plasma dicing process. Adjacent load features can be separated from one another by a load assist feature gap (3720). This load assist feature gap (3720) allows for more uniform stretching of the dicing tape (300) during downstream pick and place operations. It is preferred that the width of the load assist feature gap (3720) is similar to the street (120) width (e.g., tape stretch gap in the range of approximately 5 to 30 microns in width). The width of the load assist feature gap (3720) can be similar to the pattern gap (3710). A load assist feature (3700) can have one lateral dimension approximately the same as a die (110) dimension (e.g., die length or width). In order to help with any downstream tape stretch operation, it is desirable to have at least one gap (e.g., load assist feature gap (3720), pattern gap (2710), etc.) or street (120) intersect the perimeter of the wafer.

Some wafers, as is known in the art, have an edge bead removed region at the perimeter of the wafer such that the top surface of the substrate near the perimeter is exposed substrate material. In another embodiment, for wafers that have been edge bead removed, it is desirable to have at least one gap (e.g., load assist feature gap (3720), pattern gap (2710), etc.) or street (120) connected to the edge bead removed region (e.g., so that there is at least one area of continuous exposed substrate from the perimeter of the wafer to at least one gap).

It is desirable for the load assist features (3700) to remain intact during plasma dicing and/or downstream operations (e.g., load assist features do not break or contact a die (110)). It is preferred that the load assist features (3700) remain adhered to the tape (300) during the plasma dicing process. It is preferred that a singluated load assist feature (3700) does not contact a die (110).

Load assist features (3700) can be patterned into a wide array of shapes including polygons, squares, rectangles, and/or quadrilaterals. The load assist features (3700) can contain curves or rounded features. The load assist features (3700) can be circular or oval. The load assist features (3700) can be composed of more than one smaller feature.

In order to cleanly separate the die (110) during the singulation process, it is preferred that a load assist feature (3700) is not connected to a die (110). In a preferred embodiment, none of the load assist features (3700) are connected to a die (110).

A load assist feature (3700) can be connected to another load assist feature (3700). The load assist features (3700) can be uniform or variable size and shape across the wafer. For the case where the die (110) or streets (120) vary across a wafer, it is preferred that the load assist feature (3700) size and/or shape also varies across the wafer. While FIG. 37 illustrates the invention in use with rectangular die (110), the invention can be beneficially applied to die of different shapes including die (110) with rounded corners.

Note that while the previous examples describe etch assist features (3200), PCM assist features (3300), modified PCM structures (3500), and load assist features (3700) individually, that any combination of these elements can be beneficially applied.

After singulation of the semiconductor substrate, there can be unwanted residues that exist on the devices. Aluminum is commonly used as an electrical contact for semiconductor devices and when exposed to Fluorine based plasmas a layer of $AlF_3$ is formed on its surface. $AlF_3$ is nonvolatile under normal plasma processing conditions and is not pumped away from the substrate and out of the system and remains on the surface after processing. $AlF_3$ on Aluminum is a common cause of failure for devices because the bonding strength of wires to the electrical contacts is greatly reduced. Thus, the removal of the $AlF_3$ from the surface of the electrical contacts after plasma processing is important. Wet methods can be used; however, this becomes difficult because of the fragile nature of the separated die, and the possible damage to the tape causing die release. Therefore, the process can be changed to a third process while the substrate is still within the vacuum chamber, to a process designed to remove any $AlF_3$ formed. U.S. Pat. No. 7,150,796 describes a method for in-situ removal of $AlF_3$ using an Hydrogen based plasma. Likewise, an in-situ treatment can be used to remove other halogen-containing residues when other halogen-containing gases are used to etch the substrate.

While the above examples discuss the use of plasma for separating die (dicing), aspects of the invention may be useful for related applications such as substrate thinning by plasma etching. In this application the substrate (100) can be have some features on the surface to be etched or alternatively the surface to be etched may be featureless (e.g., thinning the bulk substrate).

The present disclosure includes that contained in the appended claims, as well as that of the foregoing description. Although this invention has been described in its preferred form with a certain degree of particularity, it is understood that the present disclosure of the preferred form has been made only by way of example and that numerous changes in the details of construction and the combination and arrangement of parts may be resorted to without departing from the spirit and scope of the invention.

Now that the invention has been described,

What is claimed is:

1. A method for plasma processing a substrate, the method comprising:
   providing a process chamber having a wall;
   providing a plasma source adjacent to the wall of the process chamber;
   providing a work piece support within the process chamber;
   loading a work piece onto said work piece support, said work piece having a support film, a frame and the substrate;
   providing a cover ring above said work piece, said cover ring having at least one through hole that does not overlap the substrate, said through hole overlapping the work piece;
   generating a plasma using the plasma source; and
   processing said work piece using the generated plasma.

2. The method according to claim 1 wherein said through hole of said cover ring allowing plasma to contact the work piece.

3. The method according to claim 1 wherein said through hole of said cover ring overlapping the film.

4. The method according to claim 1 wherein said through hole of said cover ring covering at least a portion of the work piece where the work piece is in thermal contact with said work piece support.

5. The method according to claim 4 wherein said through hole of said cover ring not covering any portion of the work piece that is not in thermal contact with the work piece support.

6. The method according to claim 1 wherein said through hole of said cover ring overlapping the frame and overlapping the film.

7. A method for plasma processing a substrate, the method comprising:
   providing process chamber having a wall;
   providing a plasma source adjacent to the wall of the process chamber; providing a work piece support within the process chamber; loading a work piece onto said work piece support, said work piece having a support film, a frame and the substrate;
   providing a cover ring above said work piece, said cover ring having at least one perforated region, and at least one non-perforated region, said perforated region of said cover ring is overlapping at least a portion of the work piece where the work piece is in thermal contact with said work piece support;
generating a plasma using the plasma source; and
processing said work piece using the generated plasma, wherein the cover ring does not contact the work piece while processing the work piece with the plasma.

\* \* \* \* \*